(12) United States Patent
Oshiyama et al.

(10) Patent No.: US 7,629,060 B2
(45) Date of Patent: *Dec. 8, 2009

(54) ORGANIC ELECTROLUMINESCENT ELEMENT, AND DISPLAY AND ILLUMINATOR

(75) Inventors: Tomohiro Oshiyama, Hachioji (JP); Hiroshi Kita, Hachioji (JP); Taketoshi Yamada, Saitama (JP); Mitsuhiro Fukuda, Chofu (JP); Yoshiyuki Suzuri, Musashino (JP); Motoi Kinoshita, Yokohama (JP); Noriko Ueda, Hino (JP)

(73) Assignee: Konica Minolta Holdings, Inc. (JP)

( * ) Notice: Subject to any disclaimer, the term of this patent is extended or adjusted under 35 U.S.C. 154(b) by 278 days.

This patent is subject to a terminal disclaimer.

(21) Appl. No.: 10/718,025

(22) Filed: Nov. 20, 2003

(65) Prior Publication Data

US 2004/0115476 A1 Jun. 17, 2004

(30) Foreign Application Priority Data

| Nov. 26, 2002 | (JP) | ............................. 2002-342193 |
| Mar. 7, 2003 | (JP) | ............................. 2003-061201 |
| Mar. 26, 2003 | (JP) | ............................. 2003-084071 |
| Mar. 26, 2003 | (JP) | ............................. 2003-084073 |
| Mar. 26, 2003 | (JP) | ............................. 2003-084075 |
| Jun. 5, 2003 | (JP) | ............................. 2003-160609 |

(51) Int. Cl.
*H01J 1/62* (2006.01)
*H01L 35/24* (2006.01)

(52) U.S. Cl. ..................... 428/690; 428/917; 313/504; 313/506; 257/40; 257/102; 257/103

(58) Field of Classification Search ................ 428/690, 428/917; 257/40, 102, 103; 313/504, 506
See application file for complete search history.

(56) References Cited

U.S. PATENT DOCUMENTS 6,660,410 B2 * 12/2003 Hosokawa ................ 428/690

(Continued)

FOREIGN PATENT DOCUMENTS

EP 1 061 112 A1 12/2000

(Continued)

OTHER PUBLICATIONS

English Abstract for JP 10-340786.

(Continued)

*Primary Examiner*—D. Lawrence Tarazano
*Assistant Examiner*—Camie S Thompson
(74) *Attorney, Agent, or Firm*—Cantor Colburn LLP

(57) ABSTRACT

Disclosed is an organic electroluminescent element comprising an anode, a cathode and a component layer including a light emission layer, the component layer being provided between the anode and the cathode, wherein the component layer contains a compound represented by formula 1, $$X_1\text{-}(A_1)_n \quad \text{Formula 1}$$

wherein $A_1$ represents a group represented by formula 2;

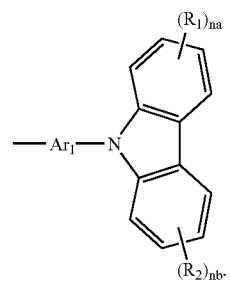

Formula 2

44 Claims, 5 Drawing Sheets

U.S. PATENT DOCUMENTS

| | | | |
|---|---|---|---|
| 6,893,743 B2* | 5/2005 | Sato et al. | 428/690 |
| 6,960,364 B2* | 11/2005 | Suzuri et al. | 427/66 |
| 2003/0198831 A1* | 10/2003 | Oshiyama et al. | 428/690 |
| 2003/0205696 A1* | 11/2003 | Thoms et al. | 252/301.16 |
| 2004/0086745 A1* | 5/2004 | Iwakuma et al. | 428/690 |
| 2004/0110031 A1* | 6/2004 | Fukuda et al. | 428/690 |
| 2004/0178721 A1* | 9/2004 | Oshiyama et al. | 313/504 |

FOREIGN PATENT DOCUMENTS

| | | |
|---|---|---|
| EP | 1 371 709 A1 | 12/2003 |
| JP | 10-340786 | 12/1998 |
| JP | 2003-128651 | 5/2003 |

OTHER PUBLICATIONS

English Abstract for JP 2003-128651.

Jacob J. Piet et al. "Rapid rotation of energy in the excited state of a circular hexa-carbazole array" Chemical Physics Letters 289 (1998) 13-18.

European Search Report for Application No. 03026685.2-2111 Dated Sep. 15, 2004.

\* cited by examiner

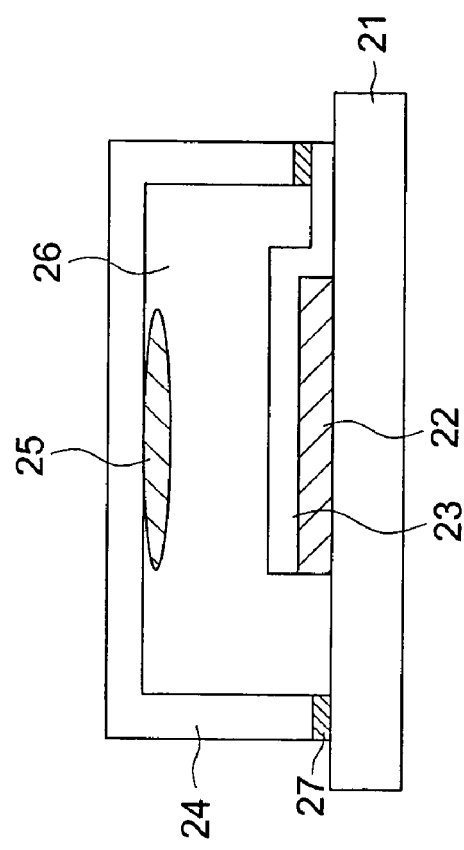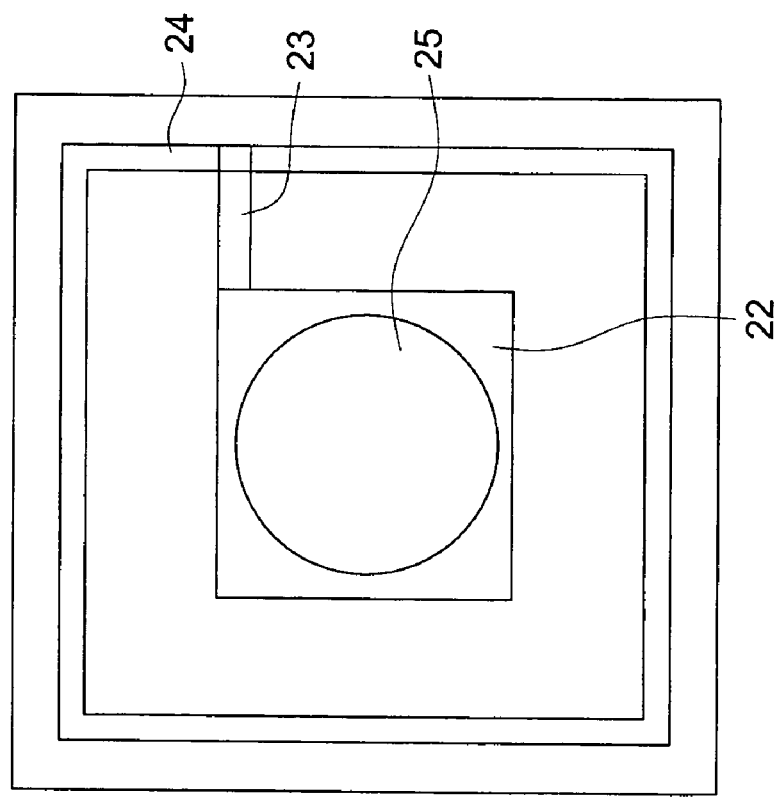
FIG. 6(a)
FIG. 6(b)

ORGANIC ELECTROLUMINESCENT ELEMENT, AND DISPLAY AND ILLUMINATOR

FIELD OF THE INVENTION

This invention relates to an organic electro-luminescent element (hereinafter also referred to as organic EL element), a display and an illuminator.

BACKGROUND OF THE INVENTION

As an emission type electronic displaying device, there is an electroluminescence device (ELD). As elements constituting the ELD, there is an inorganic electro-luminescence element or an organic electroluminescent element (hereinafter referred to also as organic EL element). The inorganic electroluminescent element has been used for a plane-shaped light source, but a high voltage alternating current has been required to drive the element.

An organic electro-luminescent element has a structure in which a light emission layer containing a light emission compound is arranged between a cathode and an anode, and an electron and a hole were injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and a high visuality since the element is of self light emission type. Further, the element is a thin, complete solid element, and therefore, the element is noted from the viewpoint of space saving and portability.

An organic EL element for practical use is required which efficiently emits light with high luminance at a lower power. For example., there are disclosed an element with long lifetime emitting light with high luminance in which stilbene derivatives, distyrylarylene derivatives or tristyrylarylene derivatives are doped with a slight amount of a fluorescent compound (Japanese Patent No. 3,093,796), an element which comprises an organic light emission layer containing an 8-hydroxyquinoline aluminum complex as a host compound doped with a slight amount of a fluorescent compound (Japanese Patent O.P.I. Publication No. 63-264692), and an element which comprises an organic light emission layer containing an 8-hydroxyquinoline aluminum complex as a host compound doped with a quinacridone type dye (Japanese Patent O.P.I. Publication No. 3-255190).

When light emitted through excited singlet state is used in the element disclosed in the above Patent documents, the upper limit of the external quantum efficiency (ηext) is considered to be at most 5%, as the generation ratio of singlet excited species to triplet excited species is 1:3, that is, the generation probability of excited species capable of emitting light is 25%, and further, external light emission efficiency is 20%.

Since an organic EL element, employing phosphorescence through the excited triplet, was reported by Prinston University (for example, see M. A. Baldo et al., Nature, 395, p. 151-154 (1998)), study on materials emitting phosphorescence at room temperature has been actively made (for example, see M. A. Baldo et al., Nature, 403, 17, p. 750-753 (2000) or U.S. Pat. No. 6,097,147).

As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to an illuminator.

For example, many kinds of heavy metal complexes such as iridium complexes has been synthesized and studied (for example, see (for example, see S. Lamansky et al., J. Am. Chem. Soc., 123, 4304 (2001)).

An example employing tris(2-phenylpyridine)iridium as a dopant has been studied (for example, M. A. Baldo et al., Nature, 395, p. 151-154 (1998)).

Further, an example employing as a dopant $L_2Ir$ (acac) (in which L represents a bidentate ligand, and "acac represents acetyl acetone) such as $(ppy)_2Ir$ (acac) (for example, see M. E. Tompson et. al., The 10th International Workshop on Inorganic and Organic Electroluminescence (EL' 00, Hamamatsu)), or employing as a dopant tris(2-p-tolylpyridine)iridium $\{Ir(ptpy)_3\}$, tris(benzo-[h]-quinoline)iridium $\{Ir(bzq)_3\}$, or $Ir(bzq)_2ClP$ $(Bu)_3$ has been studied (for example, see Moon-Jae Youn. Og, Tetsuo Tsutsui et. al., The 10th International Workshop on Inorganic and Organic Electroluminescence (EL' 00, Hamamatsu)).

A hole transporting material is used as a host of a phosphorescent compound in order to increase emission efficiency (for example, see Ikai et. al., The 10th International Workshop on Inorganic and Organic Electroluminescence (EL' 00, Hamamatsu)).

Various kinds of electron transporting materials are used as a host of a phosphorescent compound, and further doped with a new iridium complex (for example, M. E. Tompson et. al., The 10th International Workshop on Inorganic and Organic Electroluminescence (EL' 00, Hamamatsu)). High emission efficiency is obtained by incorporation of a hole blocking layer (for example, see Moon-Jae Youn. Og, Tetsuo Tsutsui et. al., The 10th International Workshop on Inorganic and Organic Electroluminescence (EL' 00, Hamamatsu)).

An external qauntum efficiency of around 20%, which is theoretically a threshold value, is attained in green light emission, but there is a problem that emission efficiency greatly lowers at high luminance emission, and further, a sufficient emission efficiency is not attained in another color light, where there is room to be improved. An organic electroluminescent element with high emission efficiency is disclosed in for example, Japanese Patent O.P.I. Publication No. 2002-100476. An organic EL element for practical use is required which efficiently emits light with high luminance at a lower power.

Further, an organic electroluminescent element is strongly required which has durability or emission life enough to be applied to a display or an illuminator. Particularly in a display employing many organic electroluminescent elements, an element continuously emitting light and an element intermittently emitting light differ in deterioration degree. For example, when a first still image is displayed for long time, and then a second still image is displayed, the elements deteriorate at portions corresponding to the first still image, resulting in lowering of luminance of the first image, and the first still image is observed as a dark image with luminance lowered as compared with the second still image. That is, such a display has problem called burn-in. In the display displaying 256 gradations, a luminance lowering of 0.4% corresponds to one gradation lowering. This is a serious problem to be solved to meet requirement for a display providing an image with high precision.

In order to overcome the above problem, various proposals have been made. For example, a method is disclosed in for example, Japanese Patent O.P.I. Publication Nos. 2002-313559, 08-236271, and 2002-367771 in which an organic electroluminescent element is subjected to sealing treatment, a method is disclosed in for example, Japanese Patent O.P.I. Publication No. 07-065958 in which a dopant having an appropriate energy level is incorporated in an organic electroluminescent element to enhance durability, and a method is disclosed in for example, Japanese Patent O.P.I. Publication Nos. 2002-198170 in which a desiccant is incorporated in a space enclosed with a substrate, an organic electroluminescent element and a sealing agent. Further, an attempt has been made which employs an electron transporting material or a material used in a light emission layer each having higher durability in an organic electroluminescent element. This attempt is disclosed in many literatures, for example, in Japanese Patent O.P.I. Publication Nos. 2002-363227, 2002-352961, 2002-356462, 2002-36350, 2002-8860 and 2002-203683).

Generally, when continuous light emission from an organic electroluminescent element is carried out, a decaying speed of its luminance is not constant, but is high particularly at initial emission stage. Accordingly, in a display or an illuminator employing such an organic electroluminescent element, display image quality or illumination ability rapidly lowers at initial stage of operation and after that, it slowly lowers at a relatively small speed. With respect to the "burn-in" described above, this phenomenon implies the fact that images shown earlier on the display is more likely to deteriorate. In a display in which a still image have continued to be displayed at the beginning of operation or in a display for displaying mainly a still image, the "burn-in" phenomenon occurs immediately after the beginning of operation and after that, a viewer watches an image with lowered quality. It is needless to say that this greatly lowers quality as a display.

In order to minimize such a rapid luminance lowering after the beginning of operation and to obtain a reduced and relatively stable luminance lowering speed, an attempt has been made in Japanese Patent O.P.I. Publication Nos. 2002-198172 and 2002-203672 in which an organic electroluminescent element has been subjected to aging treatment until a reduced and relatively stable luminance lowering speed is obtained, as disclosed in Japanese Patent O.P.I. Publication Nos. However, this incorporates a period immediately after the manufacture of the organic electroluminescent element in the form of aging treatment, in other words, a newly manufactured organic electroluminescent element is made fatigue to some extent in advance. However, this method shortens some of life, which the organic electroluminescent element inherently has, in the manufacture, and life of the organic electroluminescent element is considered to be shortened in proportion to degree of the aging treatment. If an organic electroluminescent element can be manufactured which does not greatly lower luminance, the aging treatment being eliminated or if any, being minimized, it can provide an organic electroluminescent element with life which the element inherently has, and an organic electroluminescent element solving or restraining burn-in described above.

In order to improve luminance and emission lifetime of the organic EL element, proposal has been made in which a hole blocking layer, inhibiting migration of holes from the light emission layer, is provided between the light emission layer and the cathode. This hole blocking layer can efficiently accumulate holes in the light emission layer and improve a recombination probability of electrons and holes therein, resulting in light emission with high efficiency. It is reported (see, for example, Japanese Patent O.P.I. Publication Nos. 8-109373 and 10-233284) that a phenanthroline derivative and a triazole derivative are effectively used alone as a hole blocking compound of the hole blocking layer. Further, disclosed is an organic El element with long lifetime in which a specific aluminum complex is used in the hole blocking layer (see Japanese Patent O.P.I. Publication No. 2001-284056).

It has been reported (for example, in Sixty second OyobutsuriGakkai Gakujutsukoen Kai Yokoshu 12-a-M7, Pioneer Gijutsu Johoshi, Vol. 11, No. 1) that a green light emission organic EL element employing a phosphorescent compound, when a hole blocking layer is incorporated in it, exhibits an inner quantum efficiency of approximately 100% and a lifetime of twenty thousand hours. However, there is room to be improved as for emission luminance.

There is an example in which a phosphorescent compound emitting a blue to blue-green color light is used as a dopant compound and a carbazole derivative such as CBP is used as a host compound, but the external qauntum efficiency of this example is around 6%, which provides unsatisfactory results, (see Sixty second OyobutsuriGakkai Gakujutsukoen Kai Yokoshu 12-a-MB), and there is room to be improved. Although emission from a fluorescent compound is employed, an organic EL element emitting blue light with excellent color purity and long life is prepared which employs a carbazole derivative compound in which a linkage group is incorporated in the biaryl position of the center of the molecule (see, for example, Japanese Patent O.P.I. Publication No. 2000-21572). An organic EL element emitting light with further longer life is obtained in which the above compound is employed, a specific metal complex having five ligands is incorporated in the hole blocking layer and a phosphorescent compound is used as a dopant (see, for example, Japanese Patent O.P.I. Publication No. 2002-8860).

However, the carbazole derivative as described in the above patent document in which the linkage group is incorporated as described above does not provide emission efficiency and heat resistance sufficient to be put into practical use. An organic EL element for practical use is desired which efficiently emits light with high luminance at a lower power.

SUMMARY OF THE INVENTION

The present invention has been made in view of the above. An object of the invention is to provide an organic electroluminescent element with high luminance, high quantum yield, high durability, which minimizes luminance lowering at initial light emission, and to provide a display and an illuminator each comprising the organic electroluminescent element.

BRIEF DESCRIPTION OF THE DRAWINGS

FIG. 6(a) shows a plan view of a flat lamp.

FIG. 6(b) shows a side view of a flat lamp.

DETAILED DESCRIPTION OF THE INVENTION

Figure 1:
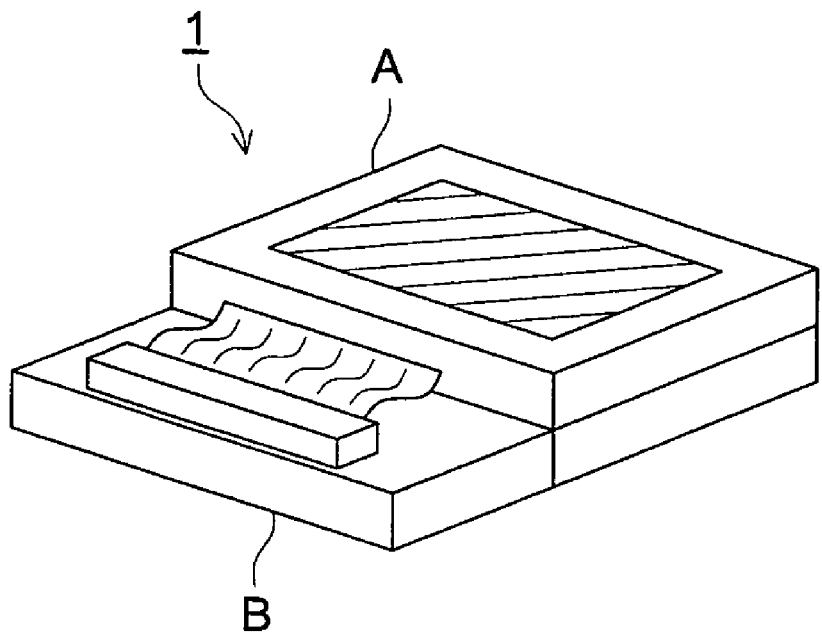
FIG. 1 is a schematic drawing of one example of a display comprising an organic EL element.

The above object of the invention can be attained by the following constitution:

1. An organic electroluminescent element comprising an anode, a cathode and a component layer including a light emission layer, the component layer being provided between the anode and the cathode, wherein the component layer contains a compound represented by formula 1,

    Formula 1 wherein n represents an integer of from 2 to 4; $A_1$ represents a group represented by formula 2, and plural $A_1$ may be the same or different, Formula 2

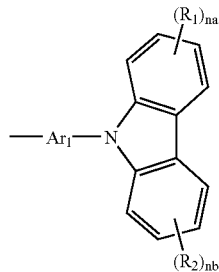

wherein $Ar_1$ represents a divalent aromatic hydrocarbon or aromatic heterocyclic group; $R_1$ and $R_2$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; na and nb independently represent an integer of from 1 to 4; and $X_1$ represents a group represented by formula (a), (b), (c), (d), (e), (f), (g), (h), (i), (j), or (k), formula (a)

formula (b)

formula (c)

formula (d)

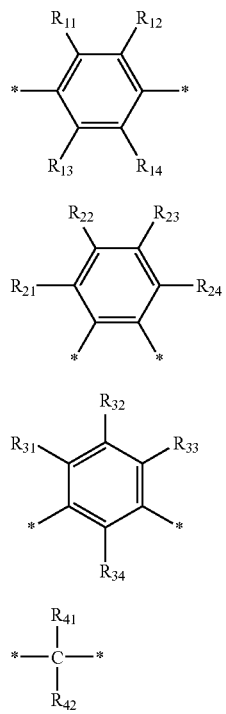

formula (e)

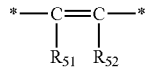

formula (f)

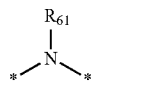

formula (g)

formula (h)

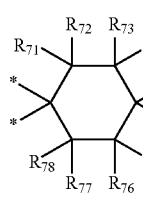

formula (i)

formula (j)

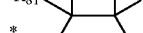

formula (k)

wherein $R_{11}$ through $R_{14}$, $R_{21}$ through $R_{24}$, and $R_{31}$ through $R_{34}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom, provided that $R_{11}$ through $R_{14}$ are not simultaneously hydrogen atoms, $R_{21}$ through $R_{24}$ are not simultaneously hydrogen atoms, $R_{31}$ through $R_{34}$ are not simultaneously hydrogen atoms, and $R_{11}$ and $R_{12}$, and $R_{13}$ and $R_{14}$ may combine with each other, respectively, to form a ring, but does not simultaneously combine with each other; $R_{41}$ and $R_{42}$ independently represent an alkyl group, provided that the total carbon atom number of the alkyl group is from 3 to 9; $R_{51}$ and $R_{52}$ independently represent a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; $R_{61}$ represents an alkyl group; Xa represents a divalent 6- or 7-membered monocyclic heterocyclic ring which is unsubstituted or alkyl-substituted; $R_{71}$ through $R_{78}$ independently represent a hydrogen atom, an alkyl group, or an alkoxy group; $R_{81}$ through $R_{88}$ independently represent a hydrogen atom, an alkyl group, or an alkoxy group; $R_{91}$ through $R_{98}$ independently represent a hydrogen atom, an alkyl group, or an alkoxy group; and "*" represents a linkage site.

2. The organic electroluminescent element of item 1 above, wherein a hole blocking layer is provided between the light emission layer and the cathode.

3. The organic electroluminescent element of item 2 above, wherein the hole blocking layer is comprised of at least one selected from the group consisting of a styryl compound, a triazole derivative, a phenanthroline derivative, an oxadiazole derivative and a boron derivative.

4. The organic electroluminescent element of item 2 above, wherein the hole blocking layer is comprised of at least one selected from the group consisting of compounds represented by formula 5, 6, 7 or 8, Formula 5
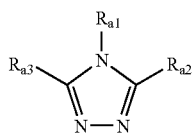

Formula 6
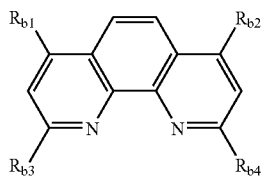

Formula 7
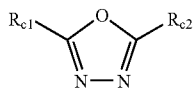

Formula 8
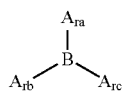

wherein $R_{a1}$ through $R_{a3}$, $R_{b1}$ through $R_{b4}$, and $R_{c1}$ and $R_{c2}$ independently represent an alkyl group, an aryl group or a heterocyclic group; and $A_{ra}$ through $A_{rc}$ independently represent an aryl group or a heterocyclic group.

5. The organic electroluminescent element of item 1 above, wherein the light emission layer contains the compound represented by formula 1 above.

6. The organic electroluminescent element of item 1 above, wherein the organic electroluminescent element contains a phosphorescent compound.

7. The organic electroluminescent element of item 6 above, wherein the phosphorescent compound is an osmium complex, an iridium complex or a platinum complex.

8. An organic electroluminescent element comprising an anode, a cathode and a component layer including a light emission layer, the component layer being provided between the anode and the cathode, wherein the component layer contains a compound represented by formula 3, $$X_2\text{-}(A_2)_m \quad \text{Formula 3}$$

wherein m represents an integer of from 2 to 4; $A_2$ represents a group represented by formula 4, and plural $A_2$ may be the same or different, Formula 4
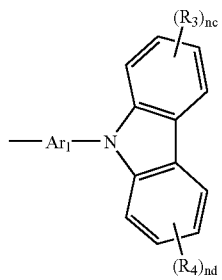

wherein $Ar_2$ represents a divalent aromatic hydrocarbon or aromatic heterocyclic group; $R_3$ and $R_4$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; nc and nd independently represent an integer of from 1 to 4; and $X_2$ represents a group represented by formula (l), (m), (n), or (o), Formula (l)
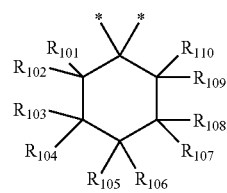

Formula (m)
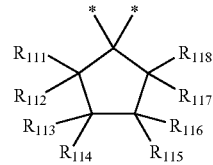

Formula (n)
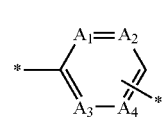

Formula (o)
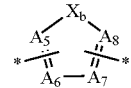

wherein $R_{101}$ through $R_{110}$ independently represent a hydrogen atom, an alkyl group, or an alkoxy group, provided that $R_{101}$ through $R_{110}$ does not simultaneously hydrogen atoms; and any two of $R_{101}$ through $R_{110}$ do not combine with each other to form a ring; $R_{111}$ through $R_{118}$ independently represent a hydrogen atom, an alkyl group, or an alkoxy group; $A_1$, $A_2$, $A_3$, and $A_4$ independently represent —C($R_{k1}$)= or —N=, in which $R_{k1}$ represents a hydrogen atom or an alkyl group, provided that at least one of $A_1$, $A_2$, $A_3$, and $A_4$ is —N=; $A_5$, $A_6$, $A_7$, and $A_8$ independently represent —C($R_{k2}$)= or —N=; $X_b$ represents —N($R_{k3}$)= or —Si ($R_{k4}$) ($R_{k5}$)—, which $R_{k2}$, $R_{k3}$, $R_{k4}$, and $R_{k5}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and "*" represents a linkage site.

9. The organic electroluminescent element of item 8 above, wherein a hole blocking layer is provided between the light emission layer and the cathode.

10. The organic electroluminescent element of item 9 above, wherein the hole blocking layer is comprised of at least one selected from the group consisting of a styryl compound, a triazole derivative, a phenanthroline derivative, an oxadiazole derivative and a boron derivative.

11. The organic electroluminescent element of item 9 above, wherein the hole blocking layer is comprised of at least one selected from the group consisting of compounds represented by formula 5, 6, 7 or 8 above.

12. The organic electroluminescent element of item 8 above, wherein the light emission layer contains the compound represented by formula 3 above.

13. The organic electroluminescent element of item 8 above, wherein the organic electroluminescent element contains a phosphorescent compound.

14. The organic electroluminescent element of item 13 above, wherein the phosphorescent compound is an osmium complex, an iridium complex or a platinum complex.

15. An organic electroluminescent element comprising an anode, a cathode and a component layer including a light emission layer, the component layer being provided between the anode and the cathode, wherein the component layer contains a compound represented by formula H1, H2, H3 or H4,

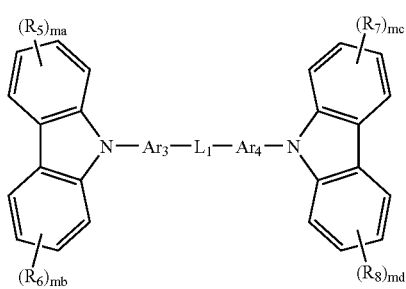

Formula H1 wherein $L_1$ represents a straight-chained alkylene group having an aromatic ring; $Ar_3$ and $Ar_4$ independently represent a divalent aromatic hydrocarbon group or a divalent aromatic heterocyclic group; $R_5$, $R_6$, $R7$, and $R_8$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and ma, mb, mc, and md independently represent an integer of from 1 to 4,

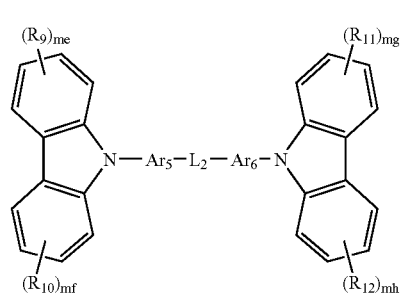

Formula H2 wherein $L_2$ represents an alkylene group having at least one fluorine atom; $Ar_5$ and $Ar_6$ independently represent a divalent aromatic hydrocarbon group or a divalent aromatic heterocyclic group; $R_9$, $R_{10}$, $R_{11}$, and $R_{12}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and me, mf, mg, and mh independently represent an integer of from 1 to 4.

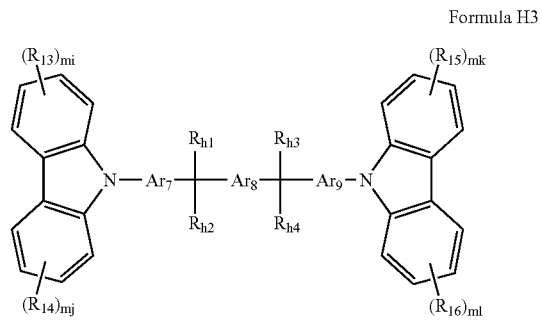

Formula H3 wherein $Ar_7$, $Ar_8$ and $Ar_9$ independently represent a divalent aromatic hydrocarbon group or a divalent aromatic heterocyclic group; $R_{h1}$, $R_{h2}$, $R_{h3}$, and $R_{h4}$ independently represent an alkyl group, a cycloalkyl group, an aralkyl group, an alkoxy group or a halogen atom; $R_{13}$, $R_{14}$, $R_{15}$, and $R_{16}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and mi, mj, mk, and ml independently represent an integer of from 1 to 4,

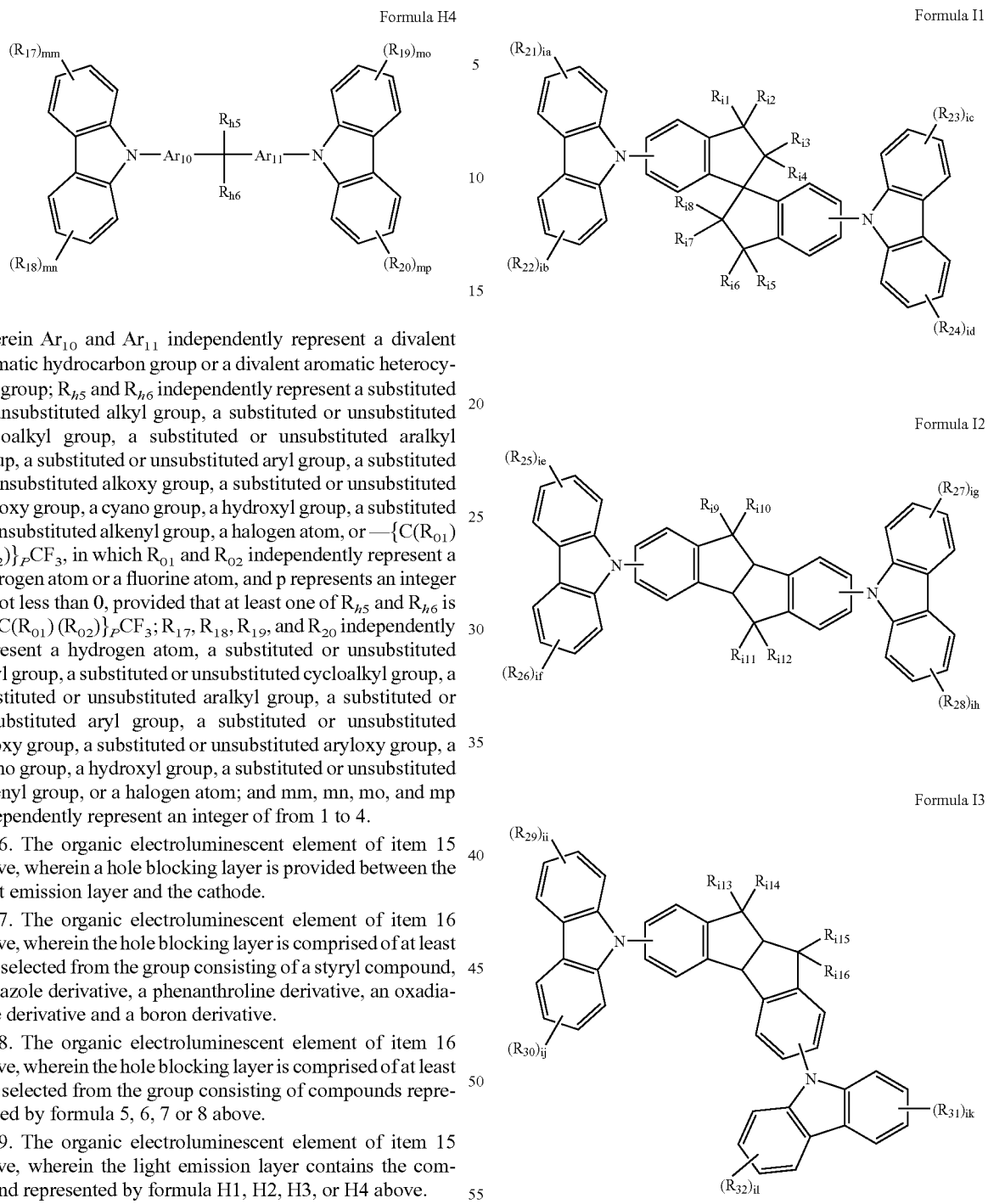

wherein $Ar_{10}$ and $Ar_{11}$ independently represent a divalent aromatic hydrocarbon group or a divalent aromatic heterocyclic group; $R_{h5}$ and $R_{h6}$ independently represent a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, a halogen atom, or —{$C(R_{01})(R_{02})$}$_p CF_3$, in which $R_{01}$ and $R_{02}$ independently represent a hydrogen atom or a fluorine atom, and p represents an integer of not less than 0, provided that at least one of $R_{h5}$ and $R_{h6}$ is —{$C(R_{01})(R_{02})$}$_p CF_3$; $R_{17}$, $R_{18}$, $R_{19}$, and $R_{20}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and mm, mn, mo, and mp independently represent an integer of from 1 to 4.

16. The organic electroluminescent element of item 15 above, wherein a hole blocking layer is provided between the light emission layer and the cathode.

17. The organic electroluminescent element of item 16 above, wherein the hole blocking layer is comprised of at least one selected from the group consisting of a styryl compound, a triazole derivative, a phenanthroline derivative, an oxadiazole derivative and a boron derivative.

18. The organic electroluminescent element of item 16 above, wherein the hole blocking layer is comprised of at least one selected from the group consisting of compounds represented by formula 5, 6, 7 or 8 above.

19. The organic electroluminescent element of item 15 above, wherein the light emission layer contains the compound represented by formula H1, H2, H3, or H4 above.

20. The organic electroluminescent element of item 15 above, wherein the organic electroluminescent element contains a phosphorescent compound.

21. The organic electroluminescent element of item 20 above, wherein the phosphorescent compound is an osmium complex, an iridium complex or a platinum complex.

22. An organic electroluminescent comprising an anode, a cathode and a component layer including a light emission layer, the component layer being provided between the anode and the cathode, wherein the component layer contains a compound represented by formula I1, I2 or I3, wherein $R_{i1}$, $R_{i2}$, $R_{i3}$, $R_{i4}$, $R_{i5}$, $R_{i6}$, $R_{i7}$, $R_{i8}$, $R_{i9}$, $R_{i10}$, $R_{i11}$, $R_{i12}$, $R_{i13}$, $R_{i14}$, $R_{i15}$, and $R_{i16}$ independently represent a hydrogen atom, an alkyl group, a cycloalkyl group, an aralkyl group, an alkoxy group or a halogen atom; $R_{21}$, $R_{22}$, $R_{23}$, $R_{24}$, $R_{25}$, $R_{26}$, $R_{27}$, $R_{28}$, $R_{29}$, $R_{30}$, $R_{31}$, and $R_{32}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and ia, ib, ic, id, ie, if, ig, ih, ii, ij, ik, and io independently represent an integer of from 1 to 4.

23. The organic electroluminescent element of item 22 above, wherein a hole blocking layer is provided between the light emission layer and the cathode.

24. The organic electroluminescent element of item 23 above, wherein the hole blocking layer is comprised of at least one selected from the group consisting of a styryl compound, a triazole derivative, a phenanthroline derivative, an oxadiazole derivative and a boron derivative.

25. The organic electroluminescent element of item 23 above, wherein the hole blocking layer is comprised of at least one selected from the group consisting of compounds represented by formula 5, 6, 7 or 8 above.

26. The organic electroluminescent element of item 22 above, wherein the light emission layer contains the compound represented by formula I1, I2 or I3 above.

27. The organic electroluminescent element of item 22 above, wherein the organic electroluminescent element contains a phosphorescent compound.

28. The organic electroluminescent element of item 27 above, wherein the phosphorescent compound is an osmium complex, an iridium complex or a platinum complex.

29. An organic electroluminescent comprising an anode, a cathode and a component layer including a light emission layer, the component layer being provided between the anode and the cathode, wherein the component layer contains a compound represented by formula J1 or J2,

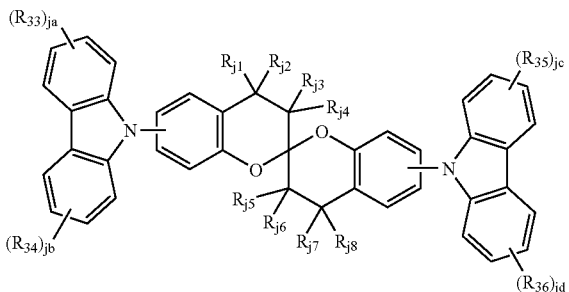

Formual J1

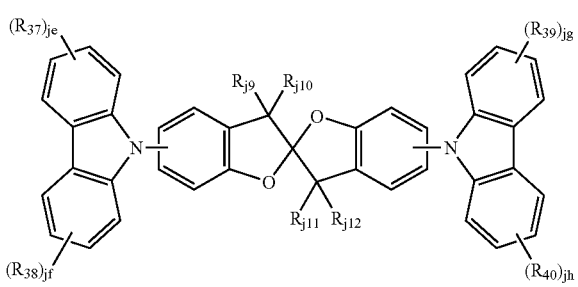

Formula J2 wherein $R_{j1}$, $R_{j2}$, $R_{j3}$, $R_{j4}$, $R_{j5}$, $R_{j6}$, $R_{j7}$, $R_{j8}$, $R_{j9}$, $R_{j10}$, $R_{j11}$, and $R_{j12}$ independently represent a hydrogen atom, an alkyl group, a cycloalkyl group, an aralkyl group, an alkoxy group or a halogen atom; $R_{33}$, $R_{34}$, $R_{35}$, $R_{36}$, $R_{37}$, $R_{38}$, $R_{39}$, and $R_{40}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and ja, jb, jc, jd, ie, jf, jg, and jh independently represent an integer of from 1 to 4.

30. The organic electroluminescent element of item 29 above, wherein a hole blocking layer is provided between the light emission layer and the cathode.

31. The organic electroluminescent element of item 30 above, wherein the hole blocking layer is comprised of at least one selected from the group consisting of a styryl compound, a triazole derivative, a phenanthroline derivative, an oxadiazole derivative and a boron derivative.

32. The organic electroluminescent element of item 30 above, wherein the hole blocking layer is comprised of at least one selected from the group consisting of compounds represented by formula 5, 6, 7 or 8 above.

33. The organic electroluminescent element of item 29 above, wherein the light emission layer contains the compound represented by formula J1 or J2 above.

34. The organic electroluminescent element of item 29 above, wherein the organic electroluminescent element contains a phosphorescent compound.

35. The organic electroluminescent element of item 34 above, wherein the phosphorescent compound is an osmium complex, an iridium complex or a platinum complex.

36. An organic electroluminescent element comprising an anode, a cathode and a component layer including a light emission layer, the component layer being provided between the anode and the cathode, wherein the component layer contains a compound represented by formula K,

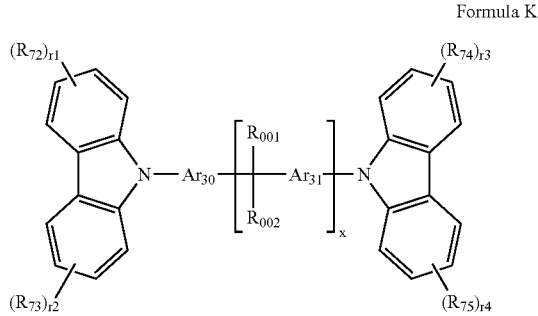

Formula K wherein $R_{001}$ and $R_{002}$ independently represent a substituent, provided that $R_{001}$ and $R_{002}$ do not combine with each other to form a ring, wherein the sum of a van der Waals volume of $R_{001}$ and that of $R_{002}$ is in the range of from 60 to 280 Å$^3$; $Ar_{30}$ and $Ar_{31}$ independently represent a divalent aromatic hydrocarbon group or aromatic heterocyclic group; $R_{72}$, $R_{73}$, $R_{74}$, and $R_{75}$ independently represent a hydrogen atom or a substituent; $r_1$, $r_2$, $r_3$, and $r_4$ independently represent an integer of from 1 to 4; and x represents an integer of not less than 1.

37. The organic electroluminescent element of item 36 above, wherein a hole blocking layer is provided between the light emission layer and the cathode.

38. The organic electroluminescent element of item 37 above, wherein the hole blocking layer is comprised of at least one selected from the group consisting of a styryl compound, a triazole derivative, a phenanthroline derivative, an oxadiazole derivative and a boron derivative.

39. The organic electroluminescent element of item 37 above, wherein the hole blocking layer is comprised of at least one selected from the group consisting of compounds represented by formula 5, 6, 7 or 8 above.

40. The organic electroluminescent element of item 36 above, wherein the light emission layer contains the compound represented by formula K above.

41. The organic electroluminescent element of item 36 above, wherein the organic electroluminescent element contains a phosphorescent compound.

42. The organic electroluminescent element of item 41 above, wherein the phosphorescent compound is an osmium complex, an iridium complex or a platinum complex.

43. An organic electroluminescent element comprising an anode, a cathode and a component layer including a light emission layer, the component layer being provided between the anode and the cathode, wherein the component layer contains an electron transporting material having a phosphorescence 0-0 band of not more than 450 nm, and the light emission layer contains a phosphorescent compound and a compound represented by formula A,

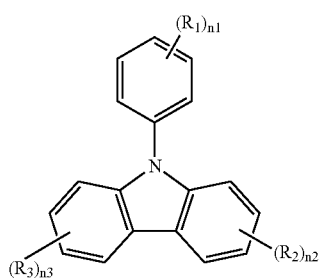

Formula A wherein $R_1$, $R_2$ and $R_3$ independently represent a substituted or unsubstituted alkyl group or a substituted or unsubstituted cycloalkyl group; $n_1$ represents an integer of from 0 to 5; and $n_2$ and $n_3$ independently represent an integer of from 0 to 4, provided that $R_1$ and $R_2$, $R_1$ and $R_3$, or $R_2$ and $R_3$, each may combine with each other to form a ring.

44. The organic electroluminescent element of item 43 above, wherein the organic electroluminescent element emits a white light.

45. An organic electroluminescent element comprising an anode, a cathode and a component layer including a light emission layer, the component layer being provided between the anode and the cathode, wherein the component layer contains a hole transporting material having a phosphorescence 0-0 band of not more than 480 nm, and the light emission layer contains a phosphorescent compound and a compound represented by formula A above.

46. The organic electroluminescent element of item 45 above, wherein the organic electroluminescent element emits a white light.

47. An organic electroluminescent element comprising an anode, a cathode and a component layer including a light emission layer, the component layer being provided between the anode and the cathode, wherein the light emission layer contains a phosphorescent compound having a phosphorescence 0-0 band of not more than 480 nm and a compound represented by formula A above.

48. The organic electroluminescent element of item 47 above, wherein the organic electroluminescent element emits a white light.

49. A display comprising the organic electroluminescent element of any one of items 1 through 48 above.

50. An illuminator comprising the organic electroluminescent element of any one of items 1 through 48 above.

51. A display comprising the illuminator of item 50 above, and a liquid crystal cell as a displaying element.

1-1. An organic electroluminescent element comprising a compound represented by formula 1 above.

1-2. An organic electroluminescent element comprising a compound represented by formula 3 above.

1-3. An organic electroluminescent element comprising a compound represented by formula H1 above.

1-4. An organic electroluminescent element comprising a compound represented by formula H2 above.

1-5. An organic electroluminescent element comprising a compound represented by formula H3 above.

1-6. An organic electroluminescent element comprising a compound represented by formula H4 above.

1-7. An organic electroluminescent element comprising a compound represented by formula I1, I2 or I3 above.

1-8. An organic electroluminescent element comprising a compound represented by formula J1, or J2 above.

1-9. An organic electroluminescent element comprising a compound represented by formula K above.

1-10. The organic electroluminescent element of any one of items 1-1 through 1-9 above, wherein a hole blocking layer is provided between a light emission layer and a cathode.

1-11. The organic electroluminescent element of item 1-10 above, wherein the hole blocking layer is comprised of at least one selected from the group consisting of a styryl compound, a triazole derivative, a phenanthroline derivative, an oxadiazole derivative and a boron derivative.

1-12. The organic electroluminescent element of item 1-10 above, wherein the hole blocking layer is comprised of at least one selected from the group consisting of compounds represented by formula 5, 6, 7 and 8 above.

1-13. The organic electroluminescent element of any one of item 1-1 above, and items 1-10 through 1-12 above, wherein a light emission layer contains the compound represented by formula 1 above.

1-14. The organic electroluminescent element of any one of item 1-2 above, and items 1-10 through 1-12 above, wherein a light emission layer contains the compound represented by formula 3 above.

1-15. The organic electroluminescent element of any one of items 1-3 through 1-6 above, and items 1-10 through 1-12 above, wherein a light emission layer contains the compound represented by formula H1, H2, H3, or H4 above.

1-16. The organic electroluminescent element of any one of items 1-7 through 1-12 above, wherein a light emission layer contains the compound represented by formula I1, I2, I3, J1 or J2 above.

1-17. The organic electroluminescent element of any one of items 1-1 through 1-16 above, wherein the organic electroluminescent element contains a phosphorescent compound.

1-18. The organic electroluminescent element of item 1-17 above, wherein the phosphorescent compound is an osmium complex, an iridium complex or a platinum complex.

1-19. A display comprising the organic electroluminescent element of any one of items 1-1 through 1-18 above.

2-1. An organic electroluminescent element comprising an organic layer including a light emission layer, wherein the organic layer contains an electron transporting material having a phosphorescence 0-0 band of not more than 450 nm, and the light emission layer contains a phosphorescent compound and a compound represented by formula A above.

2-2. An organic electroluminescent element comprising an organic layer including a light emission layer, wherein the organic layer contains an electron transporting material having a phosphorescence 0-0 band of not more than 450 nm, and the light emission layer contains a phosphorescent compound and a compound represented by formula A above, and wherein the organic electroluminescent element emits a white light.

2-3. A display comprising the organic electroluminescent element of item 2-1 or 2-2 above.

2-4. An illuminator comprising the organic electroluminescent element of item 2-1 or 2-2 above.

2-5. A display comprising the illuminator of item 2-4 above and a liquid crystal element as a displaying means.

3-1. An organic electroluminescent element comprising an organic layer including a light emission layer, wherein the organic layer contains a hole transporting material having a phosphorescence 0-0 band of not more than 480 nm, and the light emission layer contains a phosphorescent compound and a compound represented by formula A above.

3-2. An organic electroluminescent element comprising an organic layer including a light emission layer, wherein the organic layer contains a hole transporting material having a phosphorescence 0-0 band of not more than 480 nm, and the light emission layer contains a phosphorescent compound and a compound represented by formula A above, and wherein the organic electroluminescent element emits a white light.

3-3. A display comprising the organic electroluminescent element of item 3-1 or 3-2 above.

3-4. An illuminator comprising the organic electroluminescent element of item 3-1 or 3-2 above.

3-5. A display comprising the illuminator of item 3-4 above and a liquid crystal element as a displaying means.

4-1. An organic electroluminescent element comprising a layer containing a compound represented by formula A above and a phosphorescent compound, wherein the phosphorescent compound has a phosphorescence 0-0 band of not more than 480 nm.

4-2. A display comprising the organic electroluminescent element of item 4-1.

4-3. An organic electroluminescent element comprising a layer containing a compound represented by formula A above and a phosphorescent compound, wherein the phosphorescent compound has a phosphorescence 0-0 band of not more than 480 nm, and wherein the organic electroluminescent element emits a white light.

4-4. A display comprising the organic electroluminescent element of item 4-3.

4-5. An illuminator comprising the organic electroluminescent element of item 4-3 above.

4-6. A display comprising the illuminator of item 4-5 above and a liquid crystal element as a displaying means.

The present invention will be explained in detail below.

A first embodiment of the organic electroluminescent element of the invention comprises a component layer comprising an light emission layer, the component layer containing at least one selected from a compound (hereinafter also referred to as the compound in the invention) represented by formula 1, 3, H1, H2, H3, H4, I1, I2, I3, J1, J2, or K above. It is preferred that the compound described above is contained in the light emission layer.

Japanese Patent O.P.I. Publication Nos. 2000-21572 and 2002-8860 disclose a method which incorporates a linkage group in the center of the biaryl position of a carbazole derivative molecule. Most of the linkage groups disclosed in these patent documents, particularly when they are cyclic, do not have a substituent. However, it has been found that incorporation of a substituent in the linkage group, particularly in the cyclic linkage group exhibits markedly improved characteristics as material for an organic EL element in some instances.

Most linkage groups disclosed in these patent documents have a structure of small steric hindrance, and therefore, the carbazole derivatives disclosed therein is likely to maintain planarity of the molecule. It has been found that incorporation of a linkage group inhibiting such molecular planarity, i.e., incorporation of a linkage group twisting the aryl groups in the biaryl portion, further improves characteristics of the derivative.

Examples of the linkage group are groups represented by formula (a), (b), (c), (d), (e), (f), (g), (h), (i), (j), (k), (l), (m) or (o). The linkage group linking the two aryl groups in the compounds represented by formulae H1 through H4, I1 through I3, and J1 and J2 above exhibits the same effects as above. It has been proved that an organic EL element, employing such carbazole derivatives, provides improved emission efficiency and emission life. This is considered to be due to the reason that the incorporation in carbazole derivatives of a linkage group with a substituent, i.e., a sterically bulky linkage group, improves characteristics of the carbazole derivatives, resulting in increase of stabilization effect.

Next, the compound in the invention will be explained in detail.

To begin with, a compound represented by formula 1 or 3 will be explained.

In formula 1 or 3, $A_1$ and $A_2$ independently represent a group represented by formula 2 or 4 above, and may be the same or different.

In formula 1 or 3, $X_1$ and $X_2$ independently represent a group represented by formula (a), (b), (c), (d), (e), (f), (g), (h), (i), (j), (k), (l), (n), or (o) above. "*" represents a linkage site, and n and m independently represent an integer of from 2 to 4.

In formula 2 or 4, $Ar_1$ and $Ar_2$ independently represent a divalent aromatic hydrocarbon or aromatic heterocyclic group. $Ar_1$ and $Ar_2$ independently represent preferably substituted or unsubstituted phenylene, substituted or unsubstituted biphenylene, substituted or unsubstituted naphthylene, substituted or unsubstituted anthrylene, substituted or unsubstituted phenanthrylene, substituted or unsubstituted pyrenylene, substituted or unsubstituted pyridylene, substituted or unsubstituted triazylene, substituted or unsubstituted pyrazylene, substituted or unsubstituted quinoxalylene, or substituted or unsubstituted thyenylene, and more preferably substituted or unsubstituted phenylene.

The substituents include a halogen atom, an alkyl group (for example, a methyl group, an ethyl group, an isopropyl group, a hydroxyethyl group, a methoxymethyl group, a trifluoromethyl group, or a t-butyl group), an alkenyl group (for example, a vinyl group), an aryl group (for example, a phenyl group or a naphtyl group), an alkoxycarbonyl group (for example, a methoxycarbonyl group or an ethoxycarbonyl group), an alkoxy group (for example, a methoxy group or an ethoxy group), an aryloxy group (for example, a phenoxy group or a benzyloxy group), and a dialkylamino group (for example, a diethylamino group or a diisopropylamino group), and the substituent is preferably a methyl group, a phenyl group, or a methoxy group.

In formula 2 or 4, $R_1$ through $R_4$ independently represent a hydrogen atom, or a substituent.

Examples of the substituent represented by $R_1$ through $R_4$ include a substituted or unsubstituted alkyl group (for example, a methyl group, an ethyl group, an isopropyl group, a hydroxyethyl group, a methoxymethyl group, a trifluoromethyl group, or a t-butyl group), a substituted or unsubstituted cycloalkyl group (for example, a cyclopentyl group or a cyclohexyl group), a substituted or unsubstituted aralkyl group (for example, a benzyl group or a 2-phenetyl group), a substituted or unsubstituted aryl group (for example, a phenyl group, a naphthyl group, p-tolyl group, p-chlorophenyl group or a mesityl group), a substituted or unsubstituted alkoxy group (for example, an ethoxy group, a isopropoxy group or a butoxy group), a substituted or unsubstituted aryloxy group (for example, a phenoxy group), a cyano group, a hydroxyl group, a substituted or unsubstituted alkenyl group (for example, a vinyl group), a substituted or unsubstituted styryl group, and a halogen atom (for example, a fluorine atom). These groups may further have a substituent. The substituent represented by $R_1$ through $R_4$ is preferably an alkyl group, an alkoxy group, or an aryl group.

In formula 2 or 4, na, nb, nc, and nd independently represent an integer of from 1 to 4.

Next, a linkage group represented by formulae (a) through (k) will be explained.

In formulae (a) through (k), $R_{11}$ through $R_{14}$, $R_{21}$ through $R_{24}$, and $R_{31}$ through $R_{34}$ independently represent a hydrogen atom or a substituent, provided that at least one of $R_{11}$ through $R_{14}$ is the substituent, at least one of $R_{21}$ through $R_{24}$ is the substituent, and at least one of $R_{31}$ through $R_{34}$ is the substituent. $R_{11}$ and $R_{12}$, and $R_{13}$ and $R_{14}$ may combine with each other, respectively, to form a ring, but do not simultaneously form a ring.

$R_{41}$ and $R_{42}$ independently represent a substituent, provided that $R_{41}$ and $R_{42}$ do not combine with each other to form a ring. The total carbon atom number in the substituents represented by $R_{41}$ and $R_{42}$ is from 3 to 9. $R_{51}$ and $R_{52}$ independently represent a substituent. R61 represents an alkyl group. Xa represents a divalent 6- or 7-membered monocyclic heterocyclic ring. $R_{71}$ through $R_{78}$, $R_{81}$ through R88, and $R_{91}$ through $R_{98}$ independently represent a hydrogen atom or a substituent.

The substituents represented by $R_{11}$ through $R_{14}$, $R_{21}$ through $R_{24}$, and $R_{31}$ through $R_{34}$ are the same as those denoted in $R_1$ through $R_4$ above. The substituent is preferably an alkyl group, an aryl group, or an alkoxy group, more preferably an alkyl group having a carbon atom number of not more than 2, and most preferably a methyl group.

As is described above, when the linkage group is a phenylene group, a substituted phenylene, in which a substituent is incorporated in the form as explained above, is preferable to the unsubstituted phenylene. This is considered to be due to the result that characteristics vary by change of electric potential due to the substituent effect.

Examples of the substituent of $R_{41}$ and $R_{42}$ include an alkyl group (for example, a methyl group, an ethyl group, an isopropyl group, a hydroxyethyl group, a methoxymethyl group, a trifluoromethyl group, or a t-butyl group).

Examples of the substituent represented by $R_{51}$ or $R_{52}$ are the same as those denoted in $R_1$ through $R_4$ above. The substituent is preferably an alkyl group, or an aryl group.

$R_{61}$ represents an alkyl group (for example, a methyl group, an ethyl group, an isopropyl group, a methoxymethyl group, or a t-butyl group).

Xa represents a divalent 6- or 7-membered monocyclic heterocyclic ring. Examples of the divalent 6- or 7-membered monocyclic heterocyclic ring include pyridinediyl, pyridazinediyl, pyrimidinediyl, and triazinediyl. The heterocyclic ring is unsubstituted or alkyl substituted, and preferably alkyl substituted.

Examples of the substituent of $R_{71}$ through R78, $R_{81}$ through R88, and $R_{91}$ through $R_{98}$ include an alkyl group (for example, a methyl group, an ethyl group, or an isopropyl group) and an alkoxy group (for example, a methoxy group or an ethoxy group).

In formulae (a) through (k), formulae (i) and (j) are preferred, and formulae (a) through (d) or formula (h) are more preferred.

Next, a linkage group represented by formulae (l) through (o) will be explained.

In formulae (l) through (o), $R_{101}$ through $R_{110}$ independently represent a hydrogen atom or a substituent, provided that at least one of $R_{101}$ through $R_{110}$ is the substituent, and any two of $R_{101}$ through $R_{110}$ do not combine with each other to form a ring. $R_{111}$ through $R_{118}$ independently represent a hydrogen atom or a substituent. $A_1$, $A_2$, $A_3$, and $A_4$ independently represent —C($R_{k1}$)= or —N=, provided that at least one of $A_1$, $A_2$, $A_3$, and $A_4$ is —N=. $R_{k1}$ represents a hydrogen atom or an alkyl group. $A_5$, $A_6$, $A_7$, and $A_8$ independently represent —C($R_{k2}$)= or —N=, and $X_b$ represents —N($R_{k3}$)= or —Si($R_{k4}$) ($R_{k5}$)—. $R_{k2}$, $R_{k3}$, $R_{k4}$, and $R_{k5}$ independently represent a hydrogen atom, or a substituent.

Examples of the substituent of $R_{101}$ through $R_{110}$, $R_{111}$ through $R_{118}$ include an alkyl group (for example, a methyl group, an ethyl group, or an isopropyl group) and an alkoxy group (for example, a methoxy group or an ethoxy group).

The substituents represented by $R_{k2}$, $R_{k3}$, $R_{k4}$, and $R_{k5}$ are the same as those denoted in $R_1$ through $R_4$ above. The substituent is preferably an alkyl group, or an aryl group.

Of formulae (l) through (o), formula (l) or (m) is preferred.

Next, formulae (H1) through (H4) will be explained.

In formula (H1), $L_1$ represents a straight-chained alkylene group having an aromatic ring. Examples of the straight-chained alkylene group include methylene, ethylene, dimethylmethylene and diethylmethylene, and of these, dimethylmethylene is preferred. The alkylene group may have a fluorine atom. Examples of the aromatic ring in the straight-chained alkylene group include a benzene ring, a naphthalene ring, a phenanthrene ring, a pyridine ring, a pyrimidine ring, a pyrazine ring and a quinoline ring, and of these, a benzene ring is preferred.

In formula (H2), $L_2$ represents an alkylene group having at least one fluorine atom, for example, di(trifluoromethyl)-methylene, or di(1,1,1-trifluoroethyl)methylene.

In formula (H3), $R_{h1}$, $R_{h2}$, $R_{h3}$, and $R_{h4}$ independently represent a substituent. Examples of the substituent include an alkyl group (for example, a methyl group, an ethyl group, an isopropyl group, a t-butyl group or a trifluoromethyl group), a cycloalkyl group (for example, a cyclopentyl group or a cyclohexyl group), an aralkyl group (for example, a benzyl group or a 2-phenetyl group), an alkoxy group (for example, an ethoxy group, a isopropoxy group or a butoxy group), and a halogen atom (for example, a fluorine atom), and of these, a methyl group or a trifluoromethyl group is preferred.

In formula (H4), $R_{h5}$ and $R_{h6}$ represent a substituent, provided that at least one of $R_{h5}$ and $R_{h6}$ is —{C($R_{01}$) ($R_{02}$)}$_p$ CF$_3$, in which $R_{01}$ and $R_{02}$ independently represent a hydrogen atom or a fluorine atom, and p represents an integer of not less than 0. The substituents represented by $R_{h5}$ and $R_{h6}$ are the same as those denoted in $R_1$ through $R_4$ above.

In formulae (H1) through (H4), $Ar_3$ through $Ar_{11}$ represent a divalent aromatic hydrocarbon group or a divalent aromatic heterocyclic group. Examples thereof are the same as those denoted in $Ar_1$ of formula (2) or $Ar_2$ of formula (4) above.

In formulae (H1) through (H4), $R_5$ through $R_{20}$ independently represent a hydrogen atom or a substituent, and ma, mb, mc, md, me, mf, mi, mj, mk, ml, mm, mn, mo, and mp independently represent an integer of from 0 to 4. Examples of the substituent of $R_5$ through $R_{20}$ are the same as those denoted in $R_1$ through $R_4$ of formula (2) or (4) above.

Next, a compound represented by formula (I1), (I2), (I3), (J1) or (J2) will be explained.

In formula (I1), (I2), (I3), (J1) or (J2), $R_{i1}$ through $R_{i16}$, and $R_{j1}$ through $R_{j12}$ independently represent a hydrogen atom or a substituent. Examples of the substituent include an alkyl group (for example, a methyl group, an ethyl group, an isopropyl group, a t-butyl group or a trifluoromethyl group), a cycloalkyl group (for example, a cyclopentyl group or a cyclohexyl group), an aralkyl group (for example, a benzyl group or a 2-phenetyl group), an alkoxy group (for example, an ethoxy group, a isopropoxy group or a butoxy group), and a halogen atom (for example, a fluorine atom).

In the above, a hydrogen atom or an alkyl group is preferred, and in the alkyl group, a methyl group is most preferred.

In formula (I1), (I2), (I3), (J1) or (J2), $R_{21}$ through $R_{40}$ independently represent a hydrogen atom or a substituent. Examples thereof are the same as those denoted in $R_1$ through $R_4$ in formula (2) or (4) above. ia, ib, ic, id, ie, if, ig, ih, ii, ij, ik, il, ja, jb, jc, jd, ie, jf, jg, and jh independently represent an integer of from 0 to 4.

The organic electroluminescent element of the invention comprises a compound represented by formula K above.

The present inventors have made an extensive study on a carbazole derivative in order to effectively make use of the characteristic of the derivative, and obtain an organic EL element emitting a blue light with high luminance and long life, and have found that alkylene in a linkage group connecting two carbazole nuclei is required to have a specific steric bulkiness, and when the carbon atom in the alkylene chain forms a quaternary carbon atom, the substituents joined to the carbon atom are required to occupy a specific steric space. Concretely, in formula K, the sum of a van der Waals volume of $R_{001}$ and that of $R_{002}$ is in the range of from 60 to 280 Å$^3$.

The sum falling outside the range above provides an organic EL element with poor performance.

This reason is not clear. It is considered that the van der Waals volume less than 60 Å$^3$ increases interaction among molecules, while the van der Waals volume more than 280 Å$^3$ restrains rotation of molecules to lower degree of freedom and enhance crystallinity of the molecules, resulting in lowering of amorphousness of the molecules. As described above, the compound in the invention is a compound in which a carbazole derivative is sterically optimized, and the organic EL element of the invention comprising such a compound emits light with high luminance and long life.

The van der Waals volume referred to in the invention is a parameter obtained employing a molecule simulation soft Cerius$^2$ produced by Accelrys Co., Ltd, and is defined as a volume which is obtained by optimizing a molecular structure according to MM calculation employing Dreiding Force Field and then by employing Connoly Surface.

Next, a compound represented by formula K will be explained.

In formula K, $R_{001}$ and $R_{002}$ independently represent a substituent, provided that $R_{001}$ and $R_{002}$ do not combine with each other to form a ring, wherein the sum of a van der Waals volume of $R_{001}$ and that of $R_{002}$ is in the range of from 60 to 280 Å$^3$. $Ar_{30}$ and $Ar_{31}$ independently represent a divalent aromatic hydrocarbon or aromatic heterocyclic group. $R_{72}$, $R_{73}$, $R_{74}$, and $R_{75}$ independently represent a hydrogen atom or a substituent; r1, r2, r3, and r4 independently represent an interger of from 0 to 4; and x represents an integer of not less than 1. X is preferably an integer of 1 or 2.

Exemplified compounds of the compound in the invention will be listed below, but the compounds are not limited thereto.

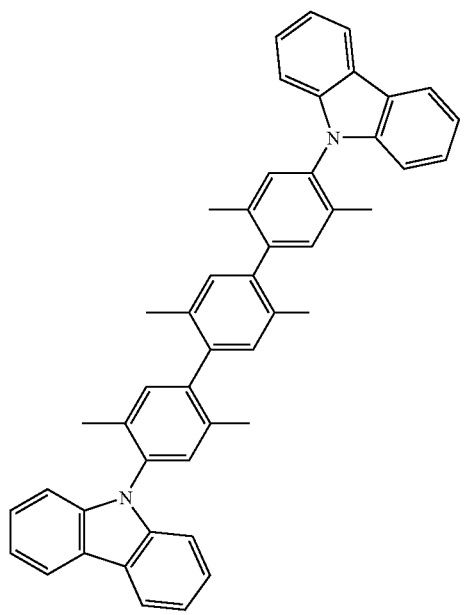

1-1

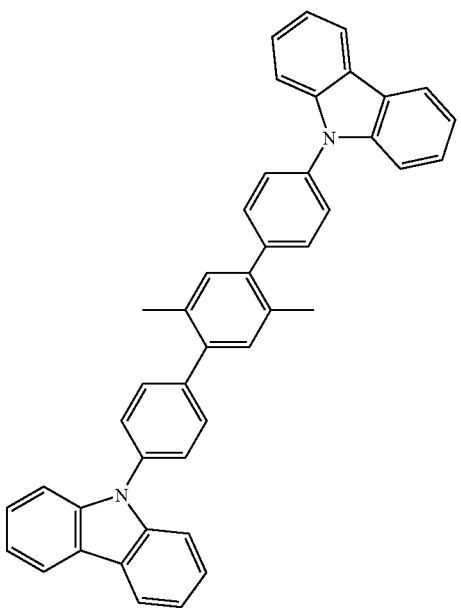

1-2

-continued
1-3
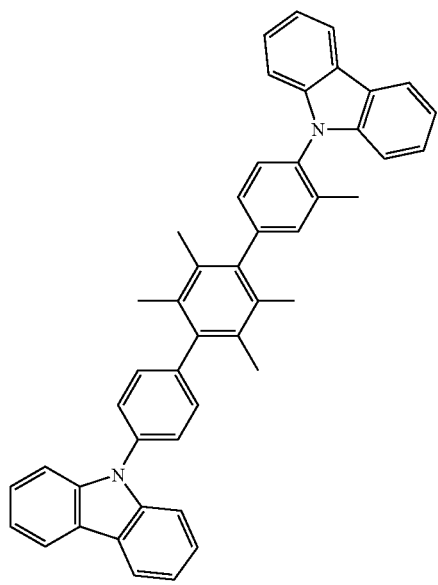
1-4
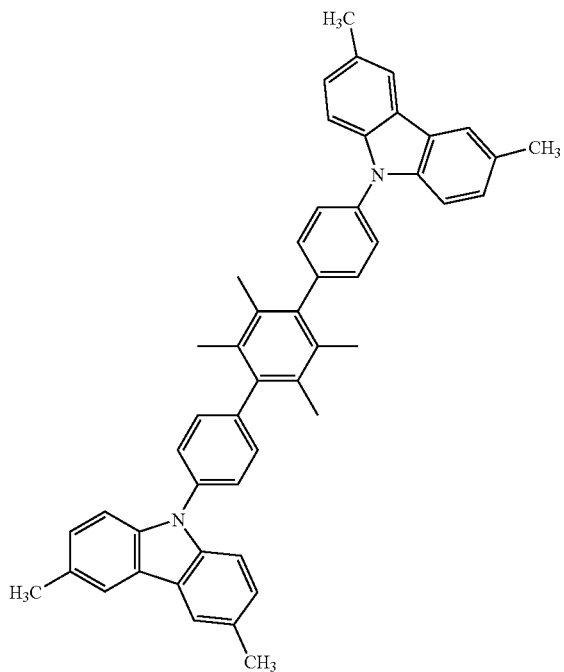
1-5
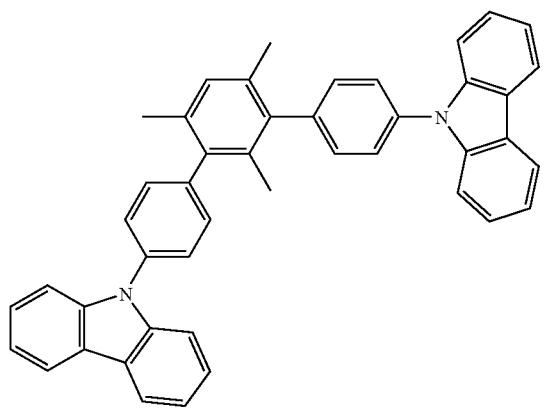
1-6
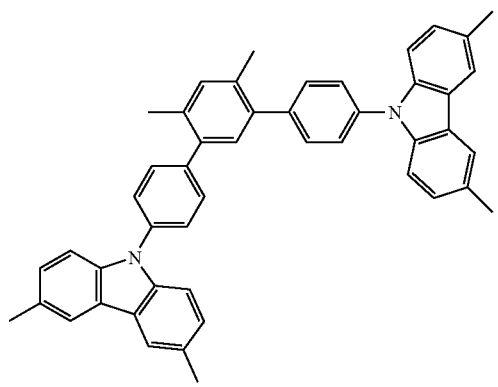
1-7
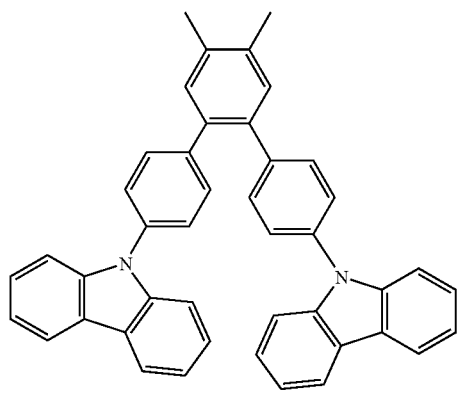
1-8
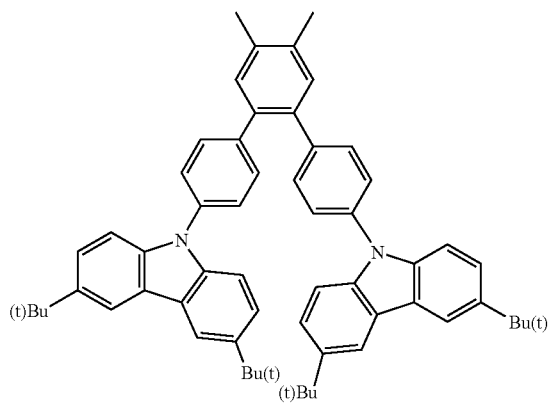

-continued
1-9
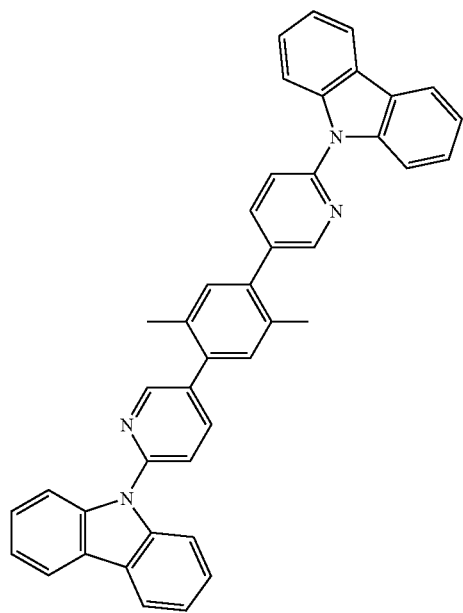
1-10
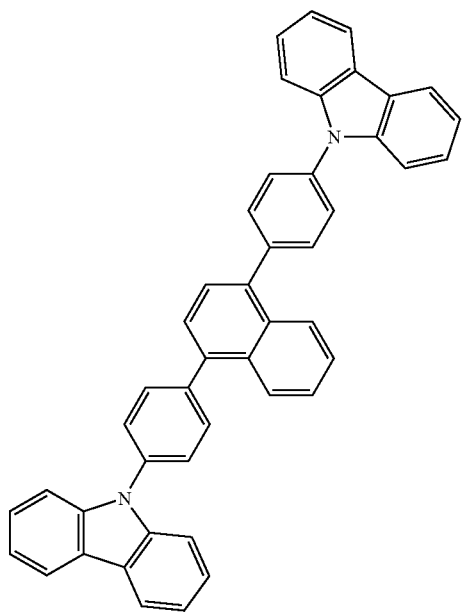
1-11
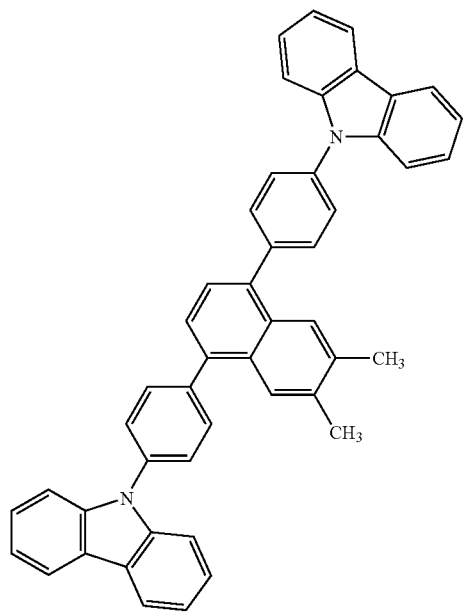
1-12
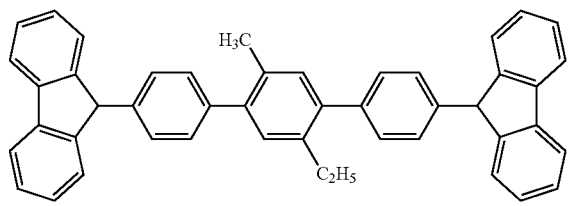

-continued
1-13
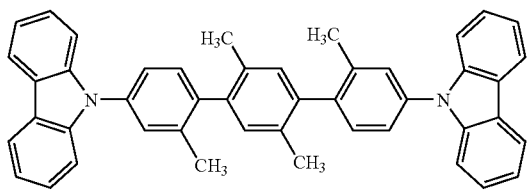
2-1
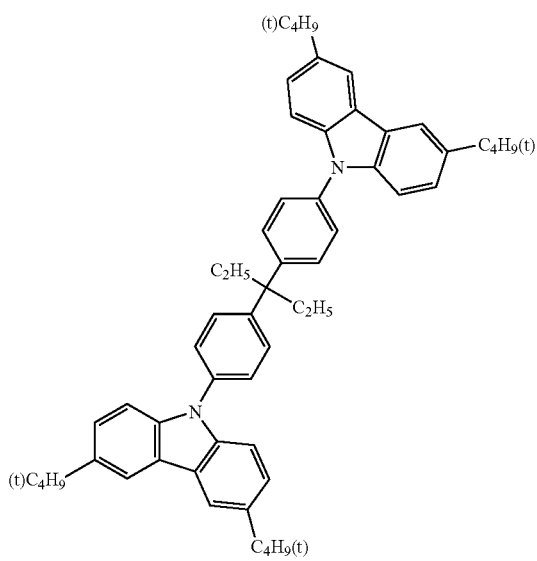
2-2
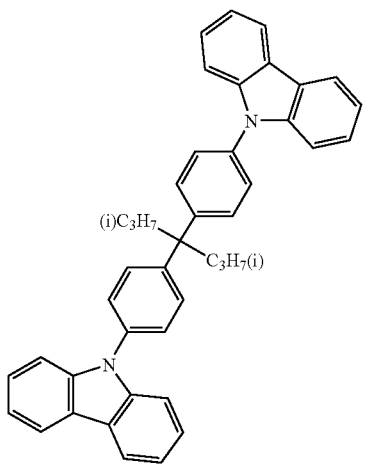
2-3
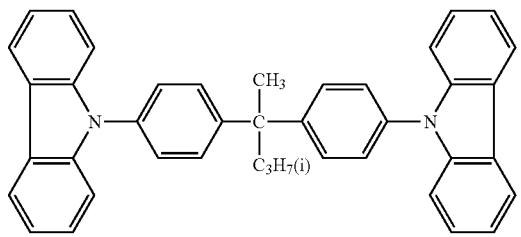
IA-1
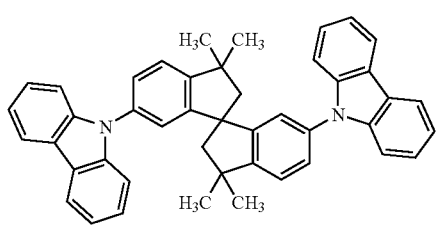
IA-2
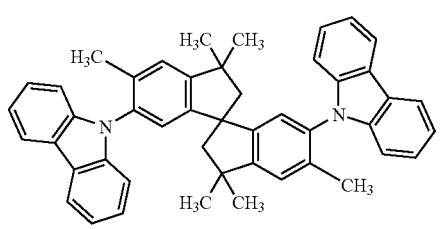

-continued
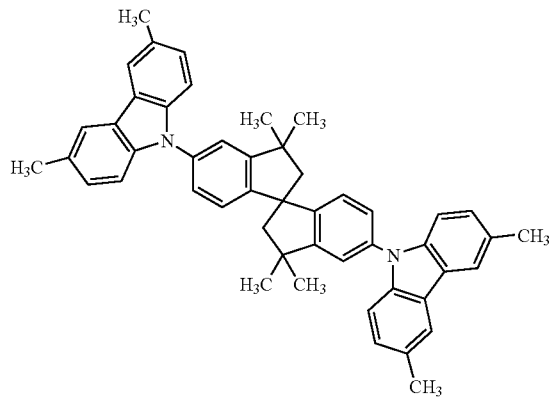
IA-3
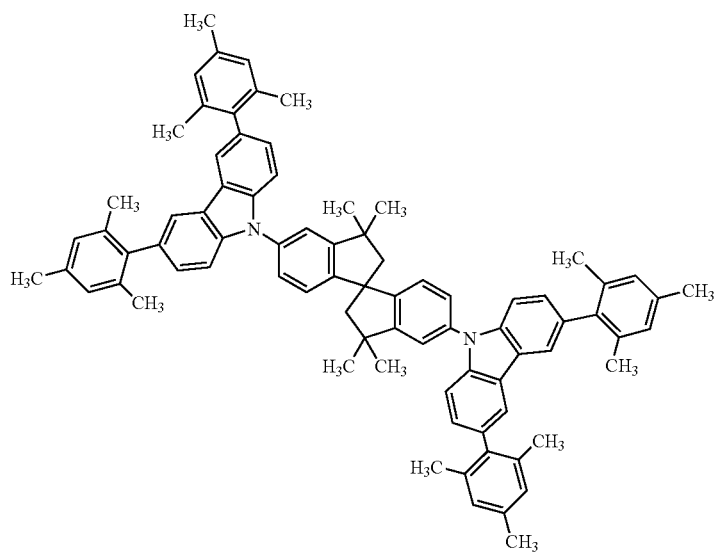
IA-4
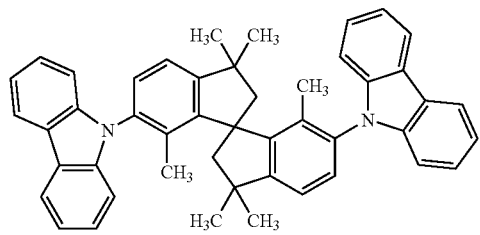
IA-5
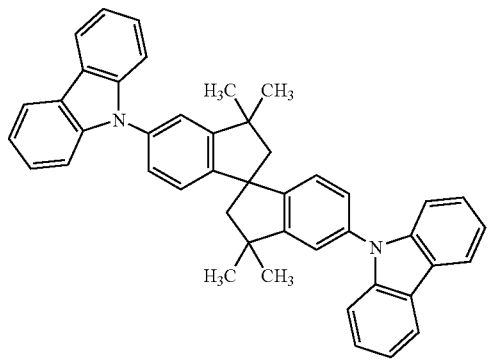
IA-6

-continued
IA-7
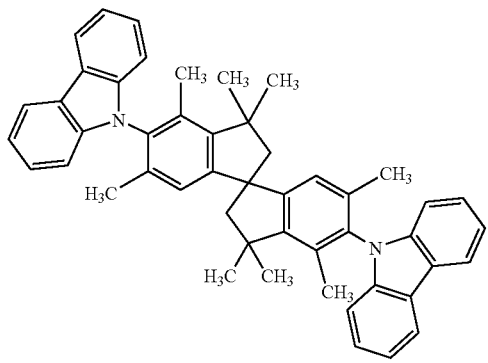
IA-8
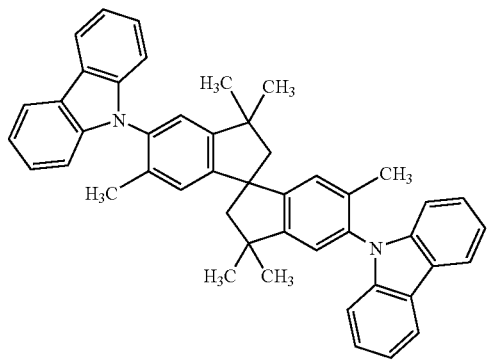
IA-9
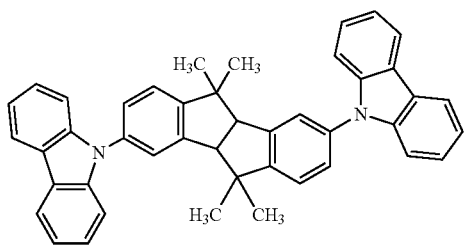
JA-1
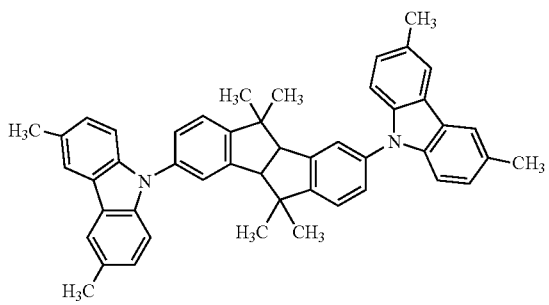
IA-11
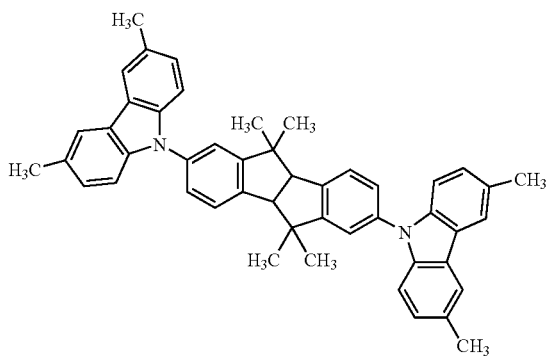
IA-12
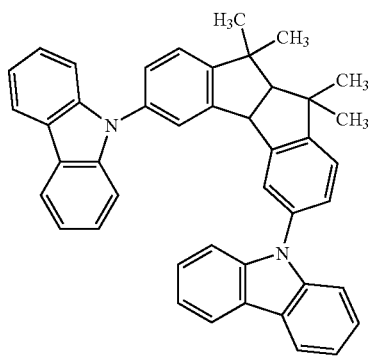
IA-13
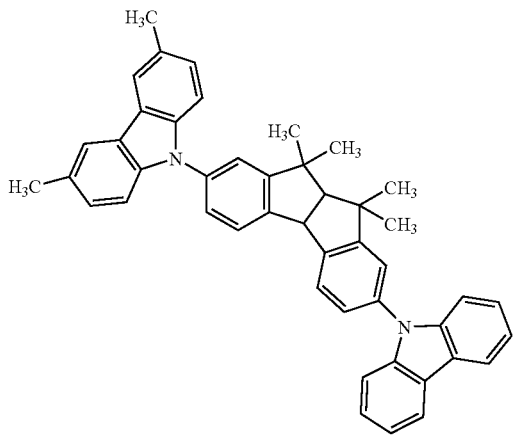
IA-14
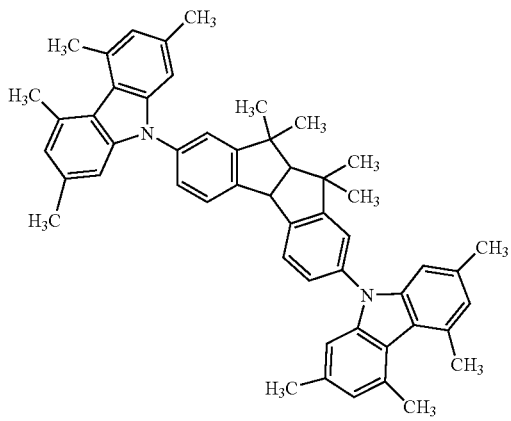

-continued
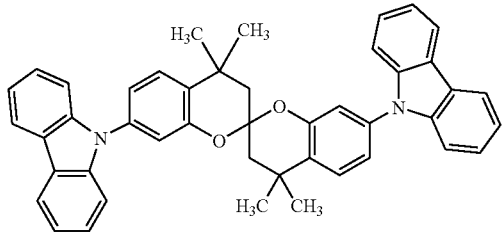
JA-1
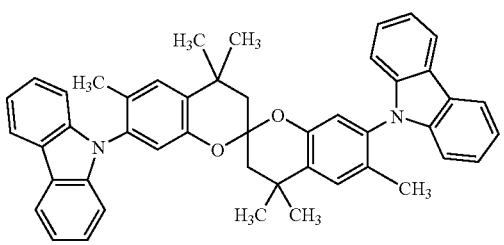
JA-2
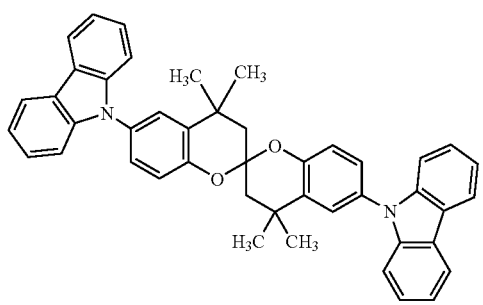
JA-3
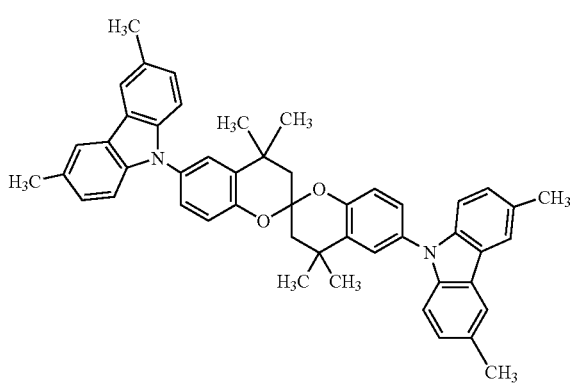
JA-4
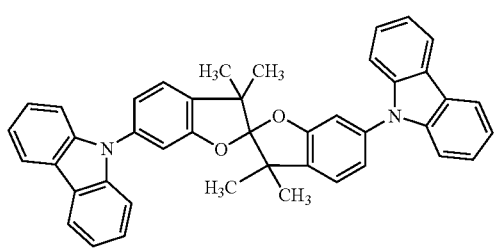
JA-5
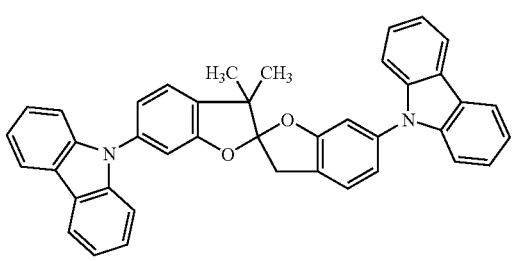
JA-6
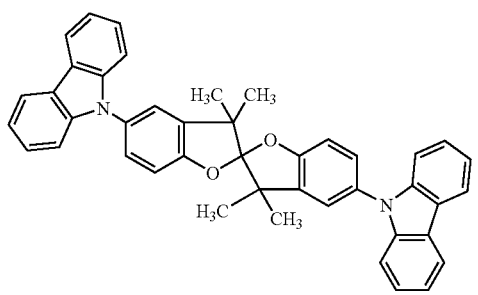
JA_7
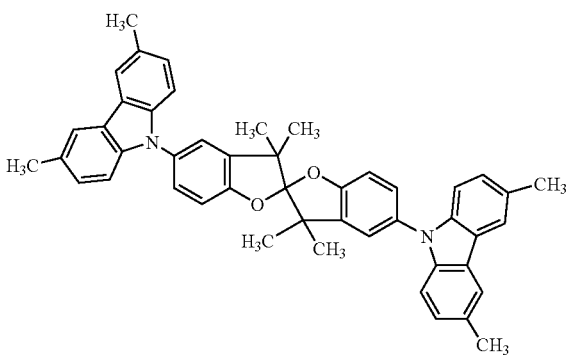
JA-8

-continued
HC1
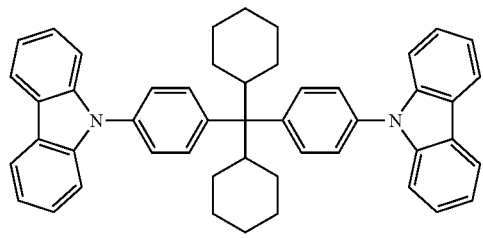
HC2
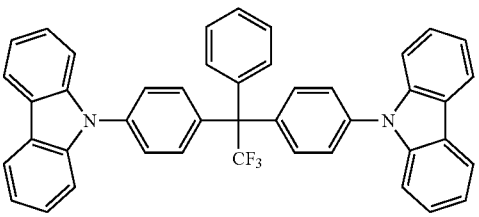
HC3
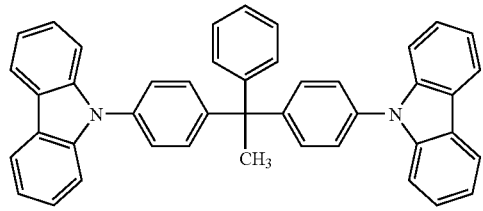
HC4
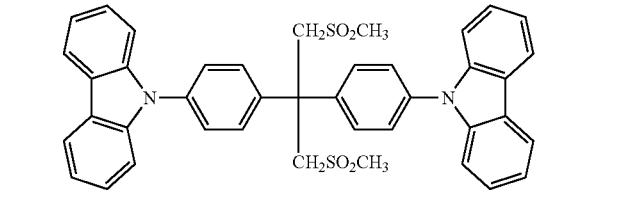
HC5
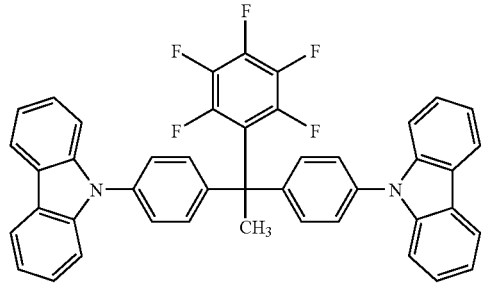
HC6
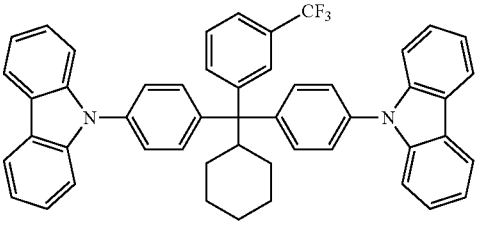
HC7
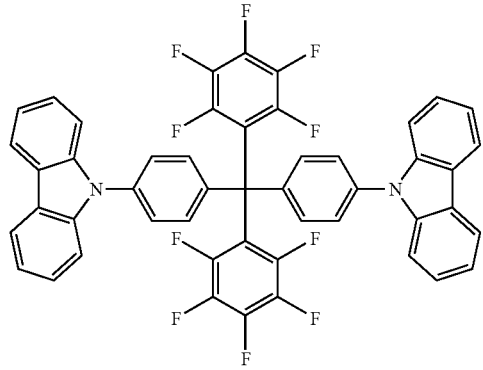
HC8
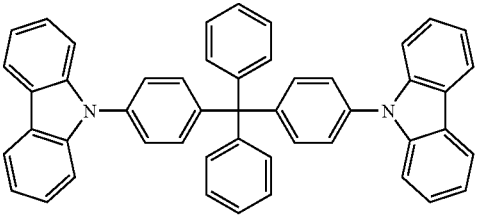
HC9
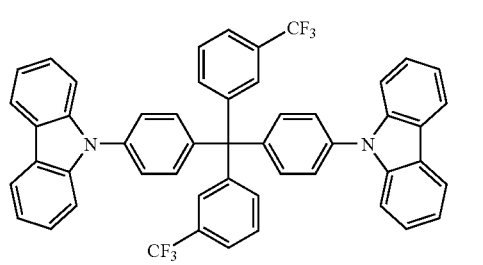
HC10
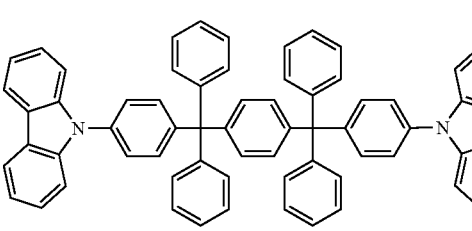
HC11
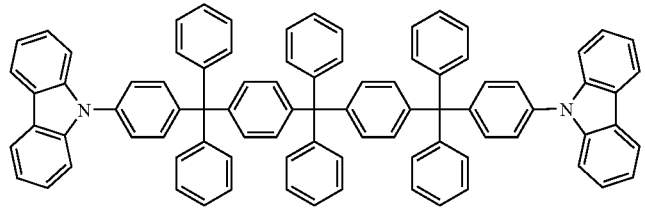

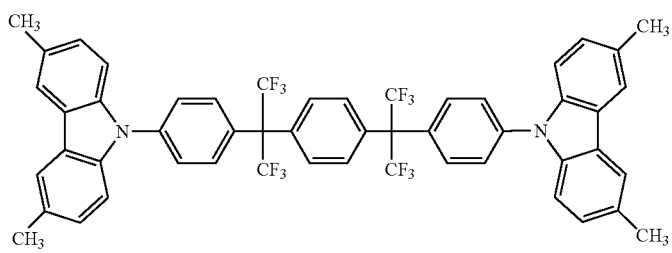

HC12

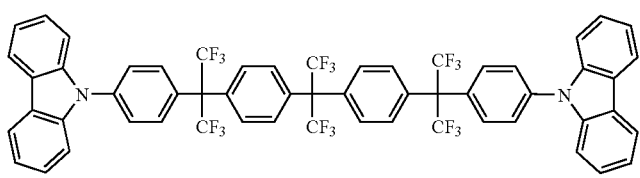

HC13

Typical synthetic examples of the compound in the invention will be shown below. Other compounds can be also synthesized in the same manner as in the examples.

SYNTHETIC EXAMPLE 1

Synthesis of Exemplified Compound 1-2

1-Bromo-4-iodobenzene of 50 g, 24 g of carbazole, 0.6 g of copper powder, and 19 g of potassium carbonate were added to 200 ml of dimethlformamide, and heated under reflux for 11 hours. After that, water was added to the resulting reaction solution, and the organic solution phase was separated, and purified according to column chromatography. The solvent was evaporated to obtain a solid residue. The solid residue was recrystallized from acetonitrile to obtain 33 g of Compound A (white product, yield: 72%). Compound A of 8 g was dissolved in a 100 ml anhydrous tetrahydrofuran, and maintained at −70° C. with dry ice. Then, the resulting solution was added with 24 ml of a butyllithium n-hexane solution, stirred for one hour, further added with a solution in which 6.0 ml of trimethoxyborane was dissolved in 20 ml of anhydrous tetrahydrofuran, and stirred at room temperature for one day. After that, the resulting solution was added with 10% sulfuric acid solution, and stirred for one hour. The solvent of the solution was evaporated, and 20 ml of acetonitrile were added to the resulting residue, and filtered to obtain 4.5 g of Compound B. Compound B of 3.0 g and Compound C of 1.2 g were dissolved in 200 ml of anhydrous tetrahydrofuran, and reacted while heating with agitation for 20 hours in the presence of sodium carbonate and a palladium catalyst. After reaction was completed, the resulting reaction solution was mixed with water and ethyl acetate, and the organic solution phase of the mixture was separated, and dried over magnesium sulfate. The solvent of the dried solution was distilled off under reduced pressure, and the resulting residue was dissolved in toluene, and purified according to column chromatography. The solvent of the purified solution was evaporated to obtain a residue, and the residue was recrystallized from toluene to obtain 1.2 g of Exemplified compound 1-2 (Yield 45%).

The recrystallized product was confirmed to be Exemplified compound 1-2 according to NMR spectra or mass spectra. A melting point of Exemplified compound 1-2 was 320 to 321° C.

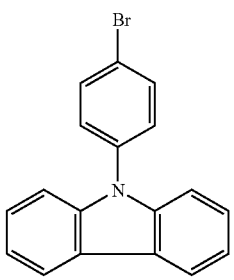

Compound A

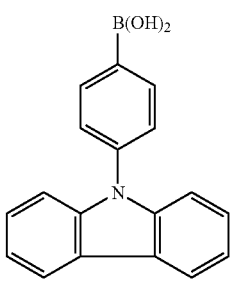

Compound B

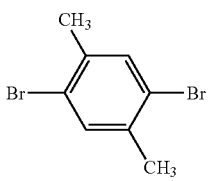

Compound C

SYNTHETIC EXAMPLE 2

Synthesis of Exemplified Compound 4-4

Twenty g of 4-methylcyclohexanone and 38 g of aniline was added to concentrated hydrochloric acid and heated under reflux for 40 hours. The resulting reaction solution was neutralized, and mixed with water and ethyl acetate. Subsequently, the organic solution phase of the mixture was separated, and dried over magnesium sulfate. The solvent of the dried organic solution was distilled off under reduced pressure, and the residue was purified according to column chromatography to obtain 31 g of an amine compound. The resulting amine compound was brominated according to Sandmeyer reaction to obtain a brominated compound. Then, carbazol and 1.1 g of the brominated compound were incorporated in a xylene solvent, and reacted while heating with agitation for 8 hours while stirring in the presence of palladium acetate and tri-tert-butylphosphine as catalysts and of potassium carbonate as a base. After reaction was completed, the resulting reaction solution was mixed with ethyl acetate, tetrahydrofuran and water, and the organic solution phase of the mixture was separated, and dried over magnesium sulfate. The solvent of the dried solution was distilled off under reduced pressure, and the residue was purified according to column chromatography. The purified product was recrystallized from toluene to obtain 1.2 g of Exemplified compound 4-4 (Yield 75%). The recrystallized product was confirmed to be Exemplified compound 4-4 according to NMR spectra or mass spectra.

SYNTHETIC EXAMPLE 3

Synthesis of Exemplified Compound HA-1

The diamine compound described below of 2.6 g, 5.1 g of 2,2'-dibromophenyl, 0.45 g of bis(dibenzilydeneacetone)-palladium, 0.85 g of tri-tert-butylphospine, and sodium tert-butoxide were mixed in 60 ml of toluene, and reacted with agitation for 8 hours at refluxing temperature under a nitrogen atmosphere. The resulting mixture was added with toluene and water, and the organic solution phase of the mixture was separated, and purified according to silica gel column chromatography. The purified product was recrystallized from toluene to obtain 1.7 g of light brown crystal, Exemplified compound HA-1 (Yield 32%).

Diamine compound

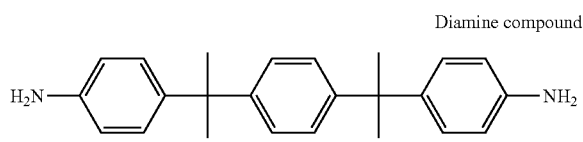

SYNTHETIC EXAMPLE 4

Synthesis of Exemplified Compound IA-1

The bisphenol compound described below of 2.0 g and 5.0 g of dibromotriphophoryl were heated at 320° C. for 5 hours in a nitrogen atmosphere. The resulting reaction mixture was added with ethyl acetate and water, and the organic solution phase of the mixture was separated, and purified according to silica gel column chromatography to obtain 1.4 g of the dibromo compound described below. Palladium acetate and tri-tert-butylphosphine a catalyst, sodium tert-butoxide as a base, 1.4 g of the dibromo compound, and 1.0 g of carbazole were mixed in 50 ml of Xylene, and the mixture was reacted with agitation for 9 hours at refluxing temperature in a nitrogen atmosphere. The resulting reaction mixture was added with toluene and water, and the organic solution phase of the mixture was separated, and purified according to silica gel column chromatography. The purified product was recrystallized from toluene to obtain 0.8 g of light brown crystal, Exemplified compound IA-1 (Yield 42%).

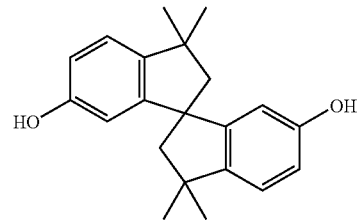

Bisphenol compound

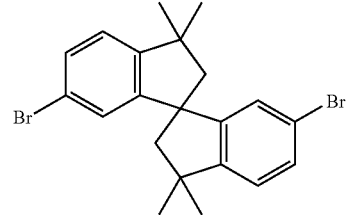

Dibromo compound

In the invention, it is effective that a hole blocking layer, which is comprised of at least one selected from the group consisting of a styryl compound, a triazole derivative, a phenanthroline derivative, an oxadiazole derivative and a boron derivative, is provided between the light emission layer and the cathode.

The hole blocking layer is formed from a compound which prevents holes injected from the hole transporting layer from flowing into the cathode and effectively transports electrons injected from the cathode to the light emission layer. Physical properties required for compounds constituting the hole blocking layer are high electron mobility, low hole mobility, and inonization potential higher than that of the light emission layer or band gap wider than that of the light emission layer. The hole blocking layer has a function which encloses electrons and holes within the light emission layer and increases emission efficiency. As a hole blocking compound meeting the above-described conditions, a compound represented by formula 5, 6, 7, or 8 is preferred.

In formula 5, 6, 7 or 8, $R_{a1}$ through $R_{a3}$, $R_{b1}$ through $R_{b4}$, and $R_{c1}$ and $R_{c2}$ independently represent an alkyl group, an aryl group or a heterocyclic group, provided that they may have a substituent; and $A_{ra}$ and $A_{rb}$ independently represent an aryl group or a heterocyclic group. Examples of the alkyl group and the aryl group are the same as those denoted in $R_1$ through $R_4$ above. Examples of the heterocyclic group include a pyrrolyl group, a pyridyl group, a furyl group or a thienyl group.

Exemplified compounds represented by formula 5, 6, 7 or 8 will be shown below, but the present invention is not limited thereto.

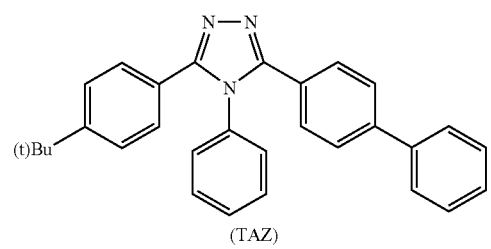

(TAZ)

-continued
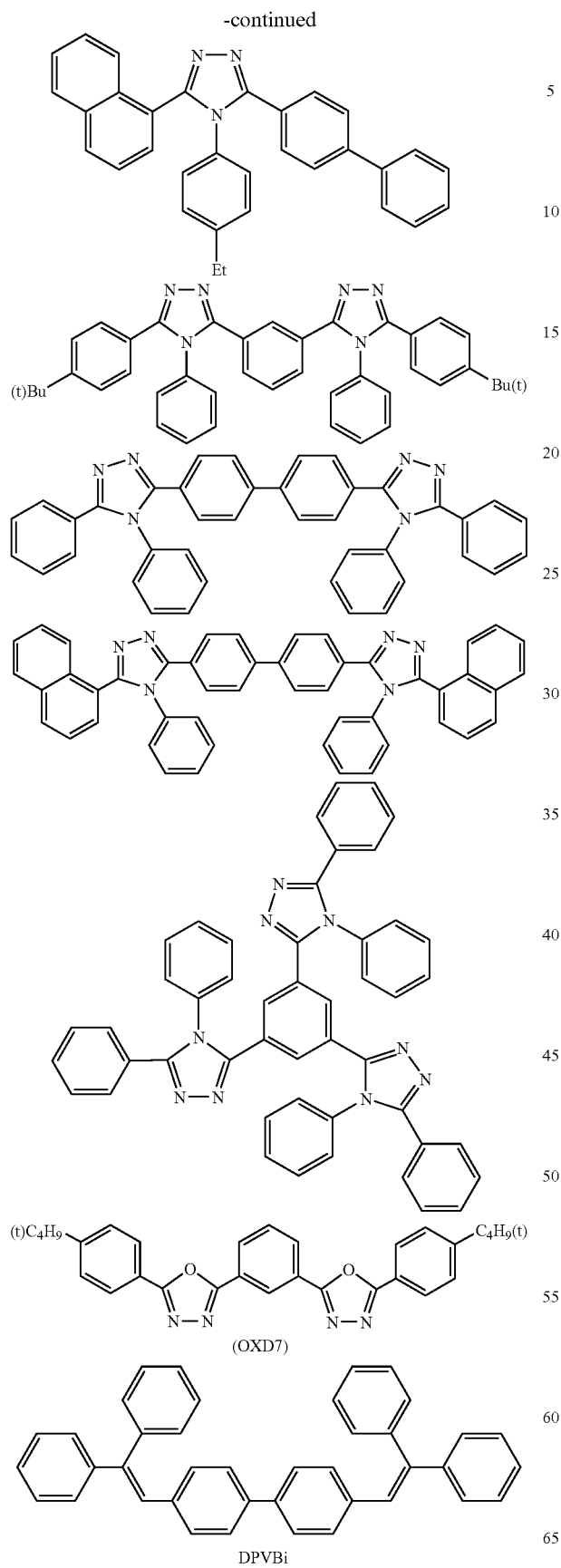
(OXD7)
DPVBi
-continued
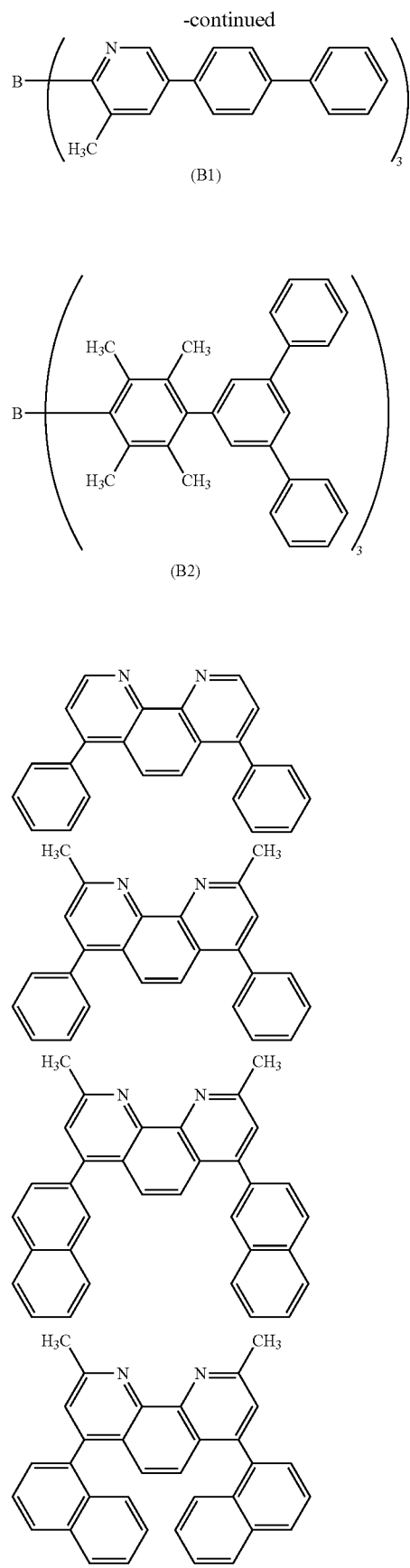
(B1)
(B2)

-continued

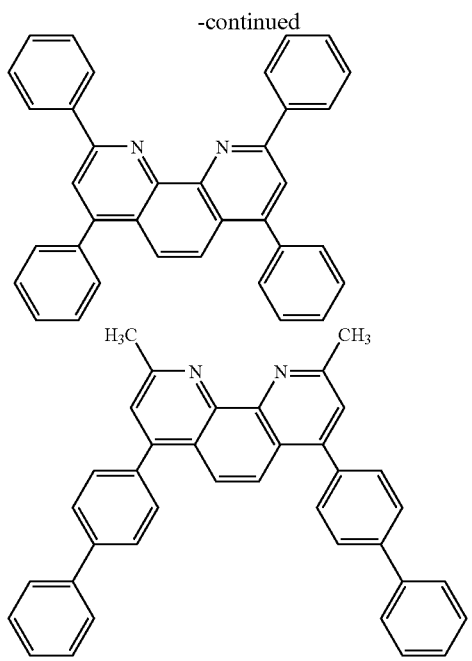

Other exemplified compounds include exemplified compounds disclosed in Japanese Patent O.P.I. Publication Nos. 2003-31367, 2003-31368, and Japanese Patent Publication No. 2721441.

Next, constitution of the organic electroluminescent element of the invention will be explained in detail.

The organic EL element of the invention comprises a component layer including a light emission layer provided between an anode and a cathode. Examples of a layer other than the light emission layer include a hole injecting layer, a hole transporting layer, a hole blocking layer, an electron transporting layer, an electron injecting layer. In the invention, preferred examples of the organic EL element will be shown below, but the present invention is not limited thereto.

I: Anode/Hole transporting layer/Light emission layer/Cathode

II: Anode/Light emission layer/Electron transporting layer/Cathode

III: Anode/Hole transporting layer/Light emission layer/Electron transporting layer/Cathode IV: Anode/Hole transporting layer/Light emission layer/Hole blocking layer/Electron transporting layer/Cathode V: Anode/Hole transporting layer/Light emission layer/Hole blocking layer/Electron transporting layer/Cathode buffering layer/Cathode VI: Anode/Anode buffering layer/Hole transporting layer/Light emission layer/Hole blocking layer/Electron transporting layer/Cathode buffering layer/Cathode <<Anode>>

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

Next, a light emission layer, an injecting layer, a hole transporting layer, and an electron transporting layer used in the component layer of the organic EL element of the invention will be explained.

<<Injecting Layer: Electron Injecting Layer, Hole Injecting Layer>>

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

The blocking layer is a layer provided if necessary in addition to the fundamental configuration layers as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is comprised of material having an ability of transporting electrons but an extremely poor ability of holes, which can increase a recombination probability of electrons and holes by transporting electrons and blocking holes.

On the other hand, the electron blocking layer is an hole transporting layer in a broad sense, and is comprised of material having an ability of transporting holes but an extremely poor ability of electrons, which can increase a recombination probability of electrons and holes by transporting holes and blocking electrons.

The hole transporting layer is comprised of material having an ability of transporting holes, and a hole injecting layer and an electron blocking layer are included in the hole transporting layer in a broad sense. The hole transporting layer or electron transporting layer may be a single layer or plural layers.

In the organic EL element of the invention, it is preferred that all of a host contained in the light emission layer, a hole transporting material contained in the hole transporting layer adjacent to the light emission layer, and an electron transporting material contained in the electron transporting layer adjacent to the light emission layer be compounds having a maximum fluorescence wavelength of not longer than 415 nm.

<<Light Emission Layer>>

The light emission layer in the invention is a layer where electrons and holes, injected from electrodes, an electron transporting layer or a hole transporting layer, are recombined to emit light. The portions where light emits may be portions in the light emission layer or portions at the interface between the light emission layer and the layer adjacent thereto.

The light emission layer can be formed employing a known method such as a vacuum deposition method, a spin coat method, a casting method and an LB method. The thickness of the light emission layer is not specifically limited, but is ordinarily from 5 nm to 5 µm. The light emission layer may be composed of a single layer comprising one or two or more kinds of light emission materials, or of plural layers comprising the same composition or different composition. It is preferred in the invention that the light emission layer be composed of two or more kinds of light emission materials, and one of the light emission materials is the compound in the invention.

The light emission layer can be formed by the method such as that described in Japanese Patent O.P.I. Publication No. 57-51781, in which a light emission material is dissolved in a solvent together with a binder such as a resin, and the thus obtained solution is formed into a thin layer by a method such as a spin-coat method. Thickness of the emission layer thus formed is not specially restricted. Although the thickness of the layer thus formed is optionally selected, the thickness is ordinarily from 5 nm to 5 µm.

When the light emission layer contains two or more compounds, the main compound is called a host, and another a dopant. The compound represented by formulae 1, 3, H1 through H4, I1 through I3, J1, J2, and K is preferably used as a host. In this case, the dopant content is from 0.1% to less than 15% by weight based on the host content.

<Host Compound>

In the light emission layer comprised of a mixture of two or more kinds of compounds, the compound having the highest content (by weight) in the mixture is a host compound (also referred to as simply a host) and the compound other than the host compound is a dopant compound (also referred to as simply a dopant). For example, when a compound A to a compound B ratio (by weight) in the light emission layer is 10:90, the compound A is a dopant compound, and the compound B is a host compound.

Further, when the content ratio, compound A:compound B:compound C in the light emission layer is 5:10:85, compounds A and B are dopant compounds, and compound C is a host compound.

The host compound in the light emission layer is preferably an organic compound or a complex. In the invention, the host compound has a wavelength providing phosphorescence maximum of preferably no longer than 460 nm, which enables a visible light emission, particularly a BGR light emission. The host compound, having a phosphorescence maximum wavelength of no longer than 450 nm, has a wide energy gap (ionization potential-electron affinity), and advantageously works in the carrier trap type.

The host compound is preferably a compound with high Tg (glass transition temperature <Dopant>

Next, the dopant compound will be explained.

The dopant is divided in two types in principle, one is an energy transfer type in which recombination of a carrier occurs on the host to which the carrier is transported to excite the host, the resulting energy is transferred to the dopant, and light is emitted from the dopant, and the other is a carrier trap type in which recombination of a carrier occurs on the dopant, a carrier trap material, and light is emitted from the dopant. However, in each type of the dopant, energy level of the dopant in excited state is lower than that of the host in excited state.

In the invention, a phosphorescent compound is preferably used as a dopant.

The phosphorescent compound in the invention is a compound which can emit light from the excited triplet, and has a phosphorescent quantum yield at 25° C. of not less than 0.001. The phosphorescent quantum yield at 25° C. is preferably not less than 0.01, and more preferably not less than 0.1. The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescent compound used in the invention may be any as long as it is a compound, in which the phosphorescent quantum yield measured employing any one of the solvents falls within the above-described range.

The phosphorescent compound in the invention herein referred to a phosphorescent compound which can emit phosphorescence at room temperature.

The phosphorescent compound used as the dopant in the invention is preferably a metal complex compound containing a metal belonging to a group VIII of the periodic table as a center metal, and is more preferably an iridium compound, an osmium compound, a rhodium compound, a palladium compound or a platinum compound (a platinum complex), still more preferably an iridium compound, a rhodium compound, or a platinum compound, and most preferably an iridium compound.

Examples of the phosphorescent compound include compounds disclosed in the following patent documents:

WO00/70655, Japanese Patent O.P.I. Publication Nos. 2002-280178, 2001-181616, 2002-280179, 2001-181617, 2002-280180, 2001-247859, 2002-299060, 2001-313178, 2002-302671, 2001-345183, and 2002-324679, W002/15645, Japanese Patent O.P.I. Publication Nos. 2002-332291, 2002-50484, 2002-332292, 2002-83684, Japanese Patent Publication No. 2002-540572, 2002-117978, 2002-338588, 2002-170684, 2002-352960, WO 01/93642, Japanese Patent O.P.I. Publication Nos. 2002-50483 2002-100476, 2002-173674, 2002-359082, 2002-175884, 2002-363552, 2002-184582, and 2003-7469, Japanese Patent Publication No. 2002-525808, Japanese Patent O.P.I. Publication No. 2003-7471, Japanese Patent Publication No. 2002-525833, Japanese Patent O.P.I. Publication Nos. 2003-31366, 2002-226495, 2002-234894, 2002-235076, 2002-241751, 2001-319779, 2001-319780, 2002-62824, 2002-100474, 2002-203679, 2002-343572, and 2002-203678.

Examples of the phosphorescent compound used in the invention will be listed below, but the invention is not limited thereto. These compounds can be synthesized according to a method described in Inorg. Chem., 40, 1704-1711.

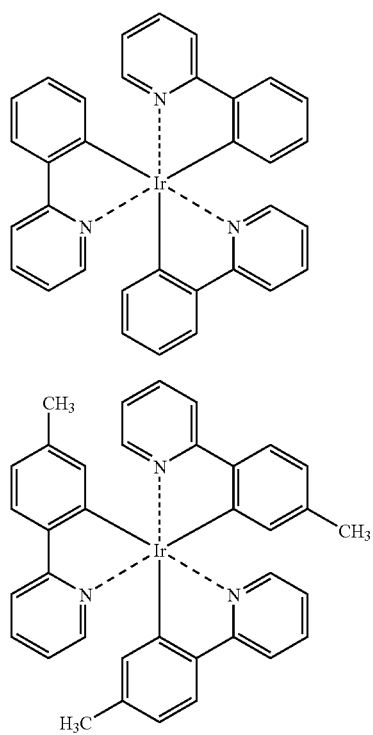

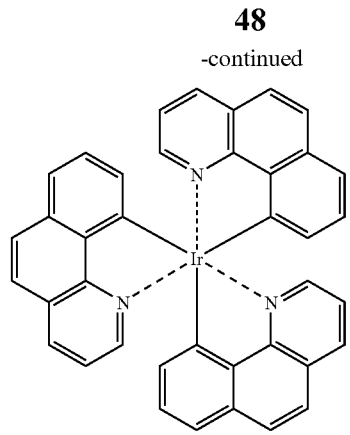

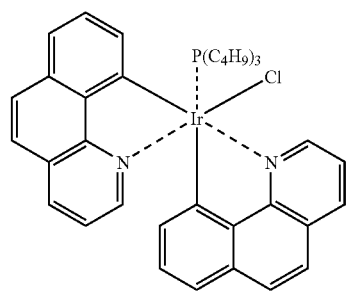

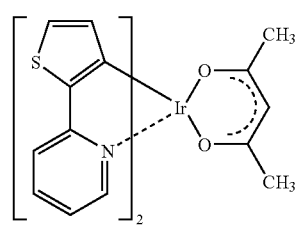

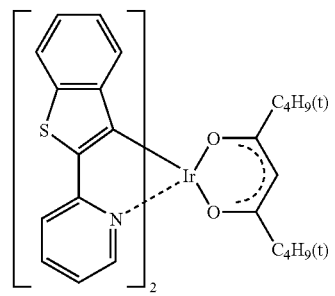

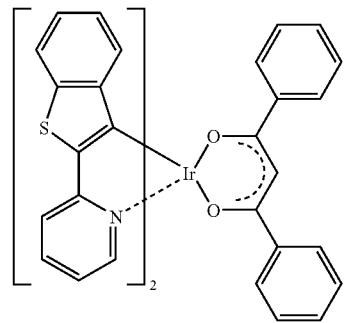

Ir-8
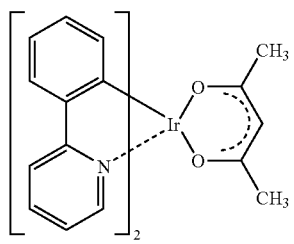
Ir-9
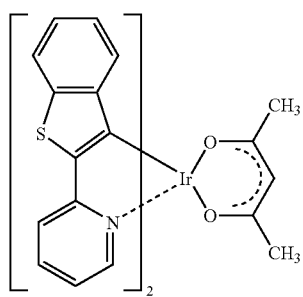
Ir-10
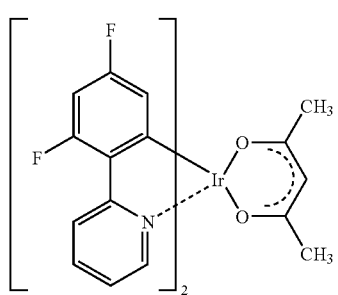
Ir-11
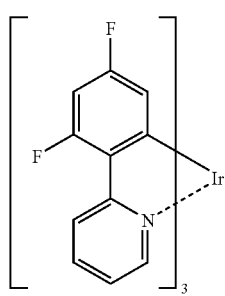
Ir-12
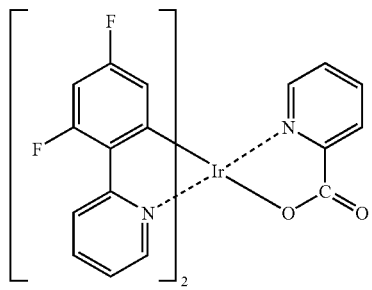
Ir-13
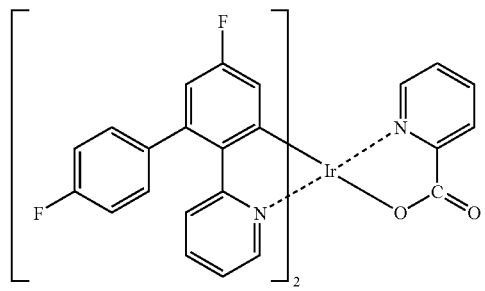
Pt-1
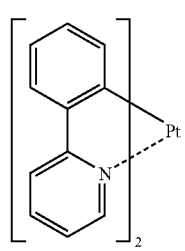
Pt-2
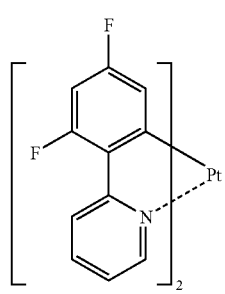
Pt-3
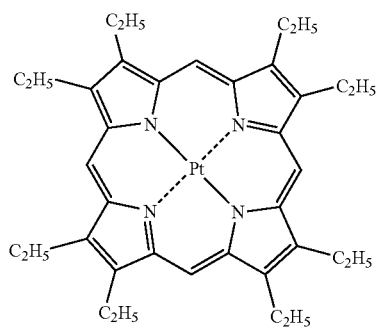
Pd-1
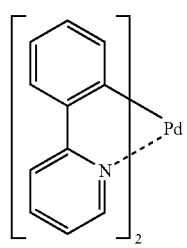

-continued
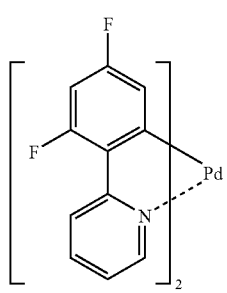
Pd-2
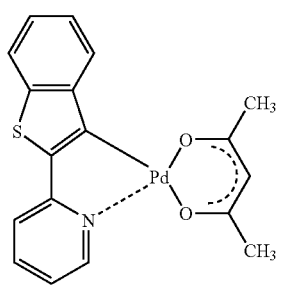
Pd-3
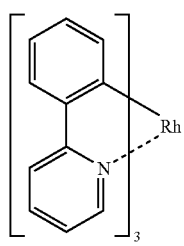
Rh-1
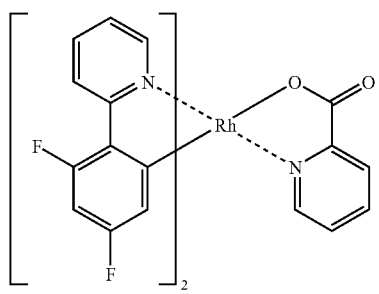
Rh-2
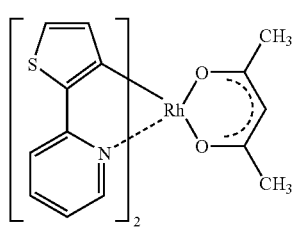
Rh-3
-continued
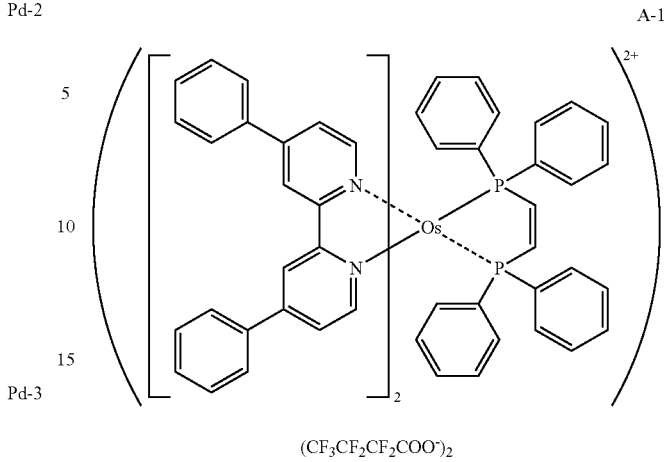
A-1
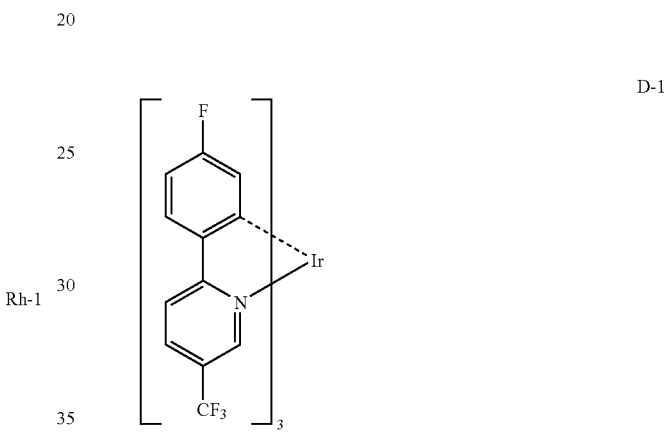
D-1
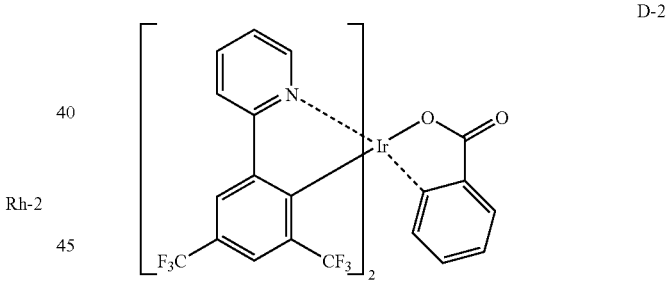
D-2
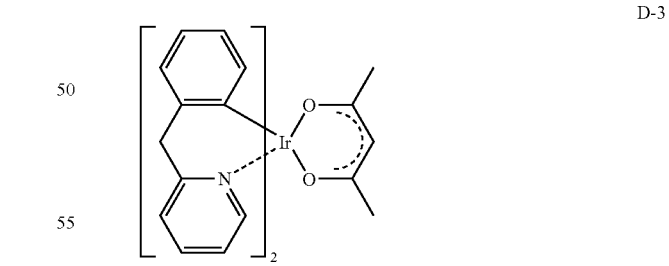
D-3
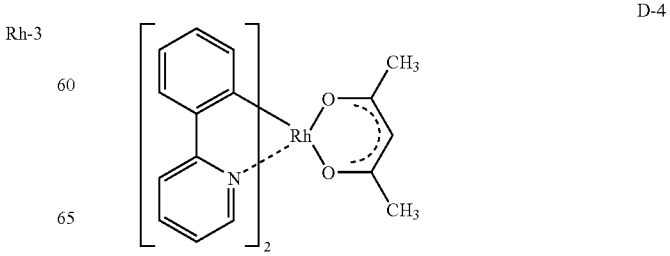
D-4

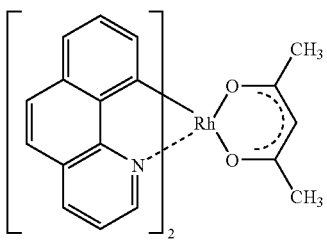

D-5

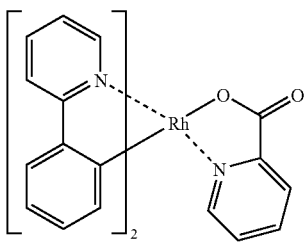

D-6

A fluorescent dopant may be added to the light emission layer besides the phosphorescent compound. Examples of the fluorescent compound include a coumarine dye, a pyrane die, a cyanine dye, a chloconium dye, a squalenium dye, an oxobenzanthracene dye, a fluorescene dye, a rhodamine dye, a pyrylium dye, a perylene dye, a stilbene dye, and a polythiophene dye, a rare earth element complex phosphorescent compound, and other known phosphorescent compounds.

<<Hole Transporting Layer>>

The hole transporting layer is comprised of material having an ability of transporting holes, and a hole injecting layer and an electron blocking layer are included in the hole transporting layer in a broad sense. The hole transporting layer or electron transporting layer may be a single layer or plural layers.

The hole transporting materials are not specifically limited, and can be optionally selected from those employed for hole transporting materials in conventional photoconductive elements or known materials used in the hole injecting layer or hole transporting layer of conventional EL elements.

The hole transporting material described above may be either an organic substance or an inorganic substance as long as it has a hole injecting ability, a hole transporting ability or an ability to form a barrier to electrons. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4, 4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p—Si and p—SiC are usable.

In the invention, the hole transporting material contained in the hole transporting layer is preferably a compound having a maximum fluorescence wavelength of not longer than 415 nm. That is, the hole transporting material is preferably a material with high Tg, which has a hole transporting ability, and prevents the emission wavelength from shifting to longer wavelength.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 to 5000 nm. The hole transporting layer may be composed of a single layer structure comprising one or two or more of the materials mentioned above.

<<Electron Transporting Layer>>

The electron transporting layer comprises a material (an electron transporting material) having an electron transporting ability, and in a broad sense refers to an electron injecting layer or a hole blocking layer. The electron transporting layer can be provided as a single layer or plural layers.

As an electron transporting material (which serves also as a hole blocking material) used in a single electron transporting layer or in the electron transporting layer closest to the cathode of plural electron transporting layers, compounds to be described below are known.

The electron transporting layer may be any layer, as long as it has a function of incorporating electrons injected from a cathode to a light emission layer, and a material used in the electron transporting layer can be optionally selected from known compounds used as electron transporting materials.

Examples of the material used in the electron transporting layer (hereinafter also referred to as electron transporting material) include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer side chain or a polymer having the material as the polymer main chain can be also used.

A metal complex of an 8-quinolynol derivative such as aluminum tris-(8-quinolynol) (Alq$_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) (Znq$_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n—Si and n—SiC may also be used as the electron transporting material in a similar way as in the hole transporting layer.

A material used in the electron transporting layer is preferably a compound having a maximum fluorescence wavelength of not longer than 415 nm. That is, the material used in the electron transporting layer is preferably a material with high Tg, which has an electron transporting ability, and prevents the emission wavelength from shifting to longer wavelength.

The electron transporting layer can be formed by layering the electron transporting material by a known method such as a vacuum deposition method, a spin coat method, a casting method, an ink jet method, an LB method, a transfer method, or a printing method. The thickness of the electron transporting layer is not specifically limited, but is ordinarily from 5 to 5000 nm. The electron transporting layer may be composed of a single layer structure comprising one or two or more of the materials mentioned above.

<<Substrate (Referred to as Also Base Plate, Base or Support)>>

Examples of a substrate preferably employed for the organic electroluminescence element in the invention include glass, quartz and plastic. Especially preferred one is a resin film capable of providing flexibility to the organic EL element. When light is taken out from the substrate side, the substrate is transparent or translucent.

The resin film is not specifically limited, and examples of the resin film include films of polyesters such as polyethylene terephthalate and polyethylene naphthalate; polyethylene; polypropylene; cellophane; cellulose esters such as cellulose diacetate, cellulose triacetate, cellulose acetate butyrate, cellulose acetate propionate, cellulose acetate phthalate, and cellulose nitrate or their derivatives; polyvinylidene chloride; polyvinyl alcohol; polyethylene vinyl alcohol; syndiotactic polystyrene; polycarbonate; norbornene resin; polymethylpentene; polyether ketone; polyimide; polyether sulfone; polysulfone; polyether ketone imide; polyamide; fluorine-contained resin; nylon; polymethyl methacrylate; polyacrylate or polyarylate; norbornene resin (or cyclolefin resin) such as ARTON (produced by JSR Co., Ltd.) or APER (produced by Mitsui Chemical Co., Ltd.); and an organic and inorganic hybrid resin. As the organic and inorganic hybrid resin, there is a resin obtained from a combination of an organic resin and an inorganic resin (silica, alumina, titania, or zirconia) obtained according to a sol-gel reaction.

The surface of the resin film may be covered with a cover layer of an inorganic or organic compound or a hybrid cover layer comprised of both compounds. Examples of the cover layer include a silica layer according to a sol-gel method, organic layers formed according to coating of polymers (including layers obtained by subjecting a layer containing a polymerizable organic compound to post-treatment such as UV irradiation or heating), a DLC layer, and a metal oxide or metal nitride layer. Examples of the metal oxide or metal nitride constituting the metal oxide or metal nitride layer include a metal oxide such as silicon oxide, titanium oxide, or aluminum oxide, a metal nitride such as silicon nitride, and a metal nitride oxide such as silicon nitride oxide or titanium nitride oxide.

The resin film, whose surface is covered with a cover layer of an inorganic or organic compound or a hybrid cover layer comprised of both compounds, is preferably a film with high barrier having a water vapor transmittance of not more than 0.01 g/m$^2$·day·atmospheric pressure plasma discharge treatment apparatus.

A second embodiment of the organic electroluminescent element of the invention is an organic electroluminescent element comprising a component layer including a light emission layer, wherein the component layer contains an electron transporting material having a phosphorescence 0-0 band of not more than 450 nm, and the light emission layer contains a phosphorescent compound and a compound represented by formula A above. The organic electroluminescent element preferably emits a white light.

In formula A, $R_1$, $R_2$, and $R_3$ independently represent a substituted or unsubstituted alkyl group or a substituted or unsubstituted cycloalkyl group. Examples of the substituent include an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, or a pentadecyl group), a cycloalkyl group (for example, a cyclopentyl group or a cyclohexyl group), an alkenyl group (for example, a vinyl group or a allyl group), an alkinyl group (for example, a propargyl group), an aryl group (for example, a phenyl group, or a naphthyl group), a heteroaryl group (for example, a furyl group, a thienyl group, a pyridazinyl group, a pyrimidinyl group, a pyrazinyl group, a triazinyl group, an imidazolyl group, a pyrazolyl group, a thiazolyl group, a benzimidazolyl group, a benzoxazolyl group, a quinazolyl group, or a phthalazinyl group), a saturated heterocyclic group (for example, a pyrrolidinyl group, an imidazolidinyl group, a morpholinyl group or an oxazolidinyl group), an alkoxy group (for example, a methoxy group, an ethoxy group, a propoxy group, a pentyloxy group, a hexyloxy group, an octyloxy group, or a dodecyloxy group), a cycloalkoxy group (for example, a cyclopentyloxy group, or a cyclohexyloxy group), an aryloxy group (for example, a phenoxy group or a naphthyloxy group), an alkylthio group (for example, a methylthio group, an ethylthio group, a propylthio group, a pentylthio group, a hexylthio group, an octylthio group, or a dodecylthio group), a cycloalkylthio group (for example, a cyclopentylthio group or a cyclohexylthio group), an arylthio group (for example, a phenylthio group, or a naphthylthio group), an alkoxycarbonyl group (for example, a methyloxycarbonyl group, an ethyloxycarbonyl group, a butyloxycarbonyl group, an octyloxycarbonyl group, or a dodecyloxycarbonyl group), an aryloxycarbonyl group (for example, a phenyloxycarbonyl group, or a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, or a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecycarbonyl group, a phenylcarbonyl group, a naphthylcarbonyl group, or a pyridylcarbonyl group), an acyloxy group (for example, an acetyloxy group, an ethylcarbonyloxy group, a butylcarbonyloxy group, an octylcarbonyloxy group, a dodecycarbonyloxy group, or a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a a dodecycarbonylamino group, a phenylcarbonylamino group, a naphthylcarbonylamino group, or a pyridylcarbonyl group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecyaminocarbonyl group, a phenylaminocarbonyl group, a naphthylaminocarbonyl group, or a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group, or a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, or a 2-pyridylsulfinyl group), an alkylsulfonyl or arylsulfonyl group (for example, a methylsulfonyl group, an ethylsulfonyl group, a butylsulfonyl group, a cyclohexylsulfonyl group, a 2-ethylhexylsulfonyl group, a dodecylsulfonyl group, a phenylsulfonyl group, a naphthylsulfonyl group, or a 2-pyridylsulfonyl group), an amino group (for example, an amino group, an ethylamino group, a dimethylamino group, a butylaminocarbonyl group, a cyclopentylamino group, a 2-ethylhexylamino group, a dodecyamino group, an anilino group, a naphthylamino group, or a 2-pyridylamino group), a cyano group, a silyl group (for example, a trimethylsilyl group, a triisopropylsilyl group, a triphenylsilyl group or a phenyldiethylsilyl group), a fluorine atom and a chlorine atom.

Further, $R_1$, $R_2$, and $R_3$ may have a substituent such as a residue derived from a compound represented by formula A above, or another carbazole residue. Accordingly a compound, in which in formula A, $R_1$, $R_2$, or $R_3$ has this substituent, is a polymer or copolymer having in the molecule plural chemical structures represented by formula A.

In formula A, n1 represents an integer of from 0 to 5, and n2 and n3 independently represent an integer of from 0 to 4. When n1, n2, or n3 is two or more, plural $R_1$, $R_2$, and $R_3$ independently is the same or different. Any two of $R_1$, $R_2$, and $R_3$ may combine with each other to form a ring.

Exemplified compound of the compound represented by formula A will be listed below, but the invention is not limited thereto.

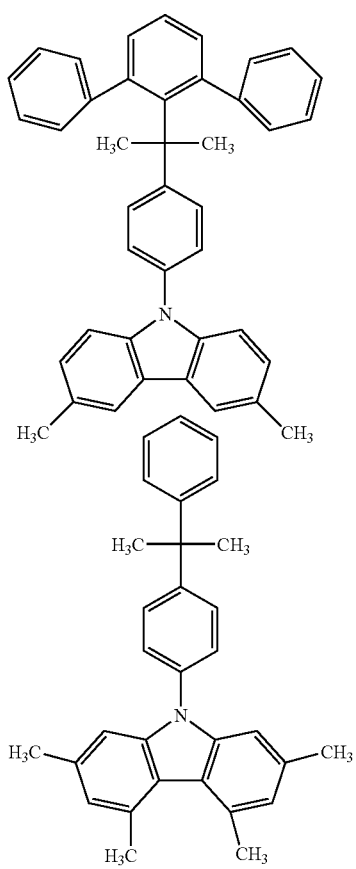

11-1

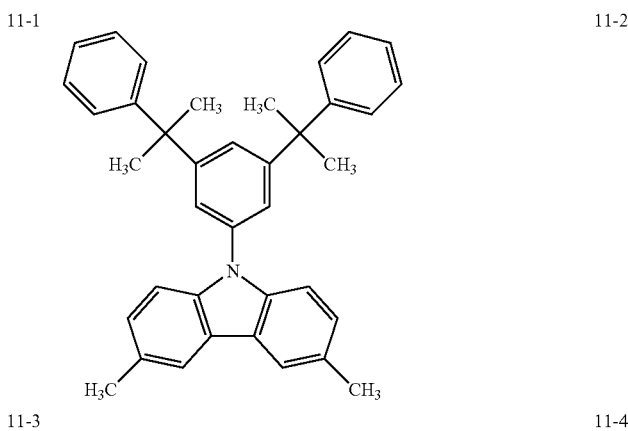

11-2

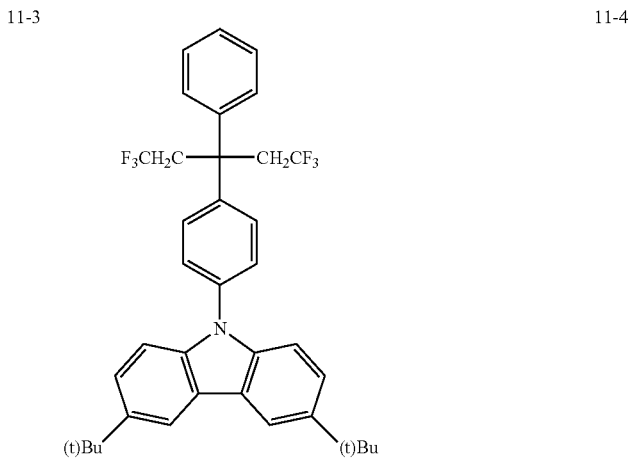

11-3 11-4

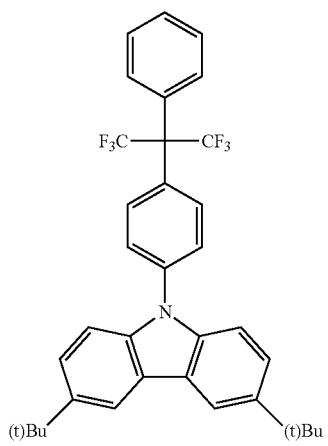
11-5
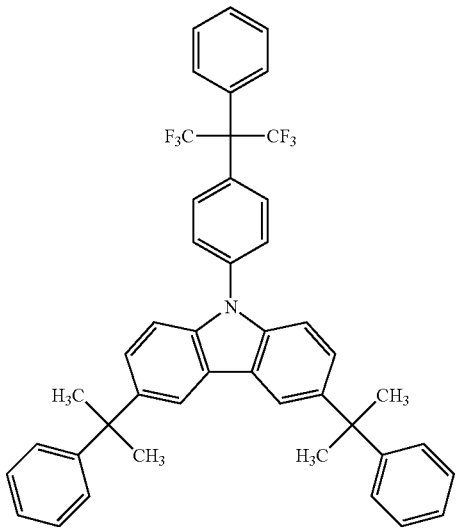
11-6
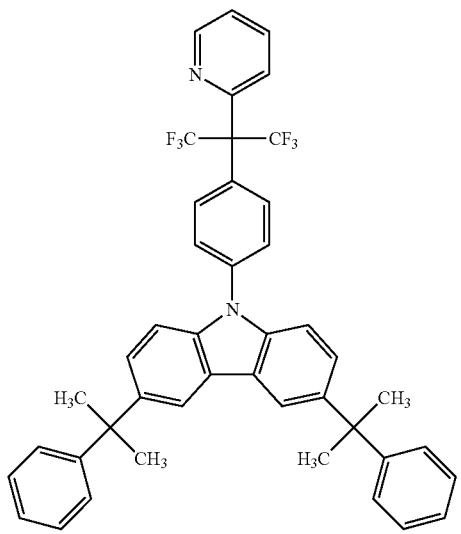
11-7
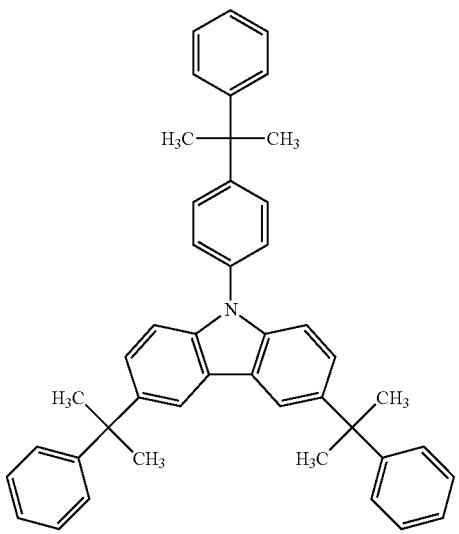
11-8
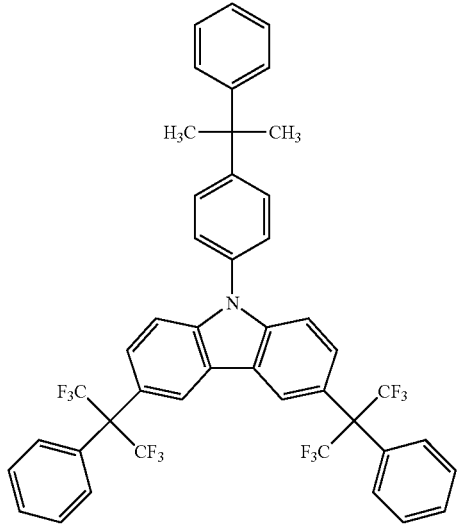
11-9
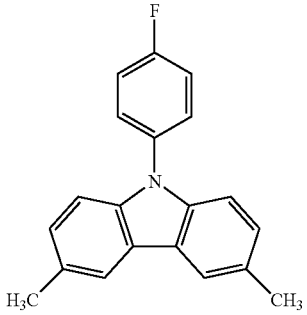
11-10

-continued
11-11
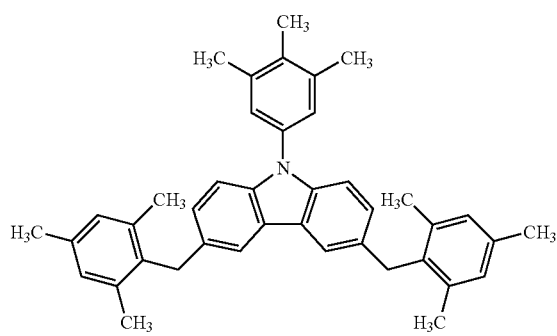
11-12
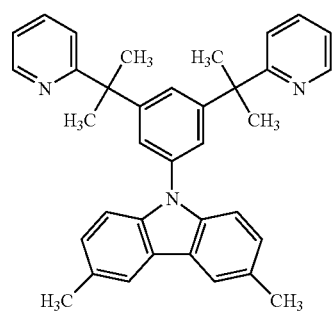
11-13
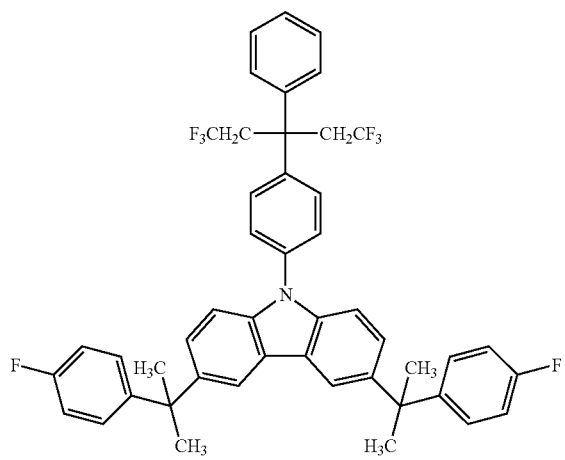
11-14
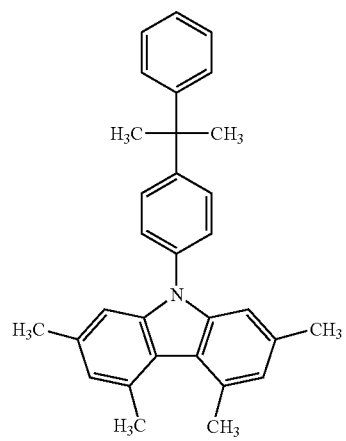
11-15
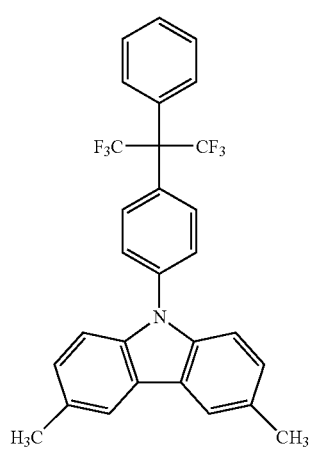
11-16
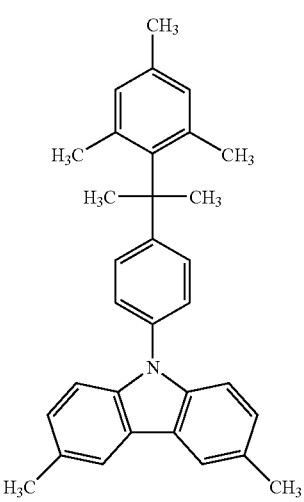

-continued
11-17
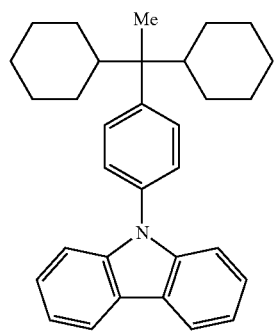
11-18
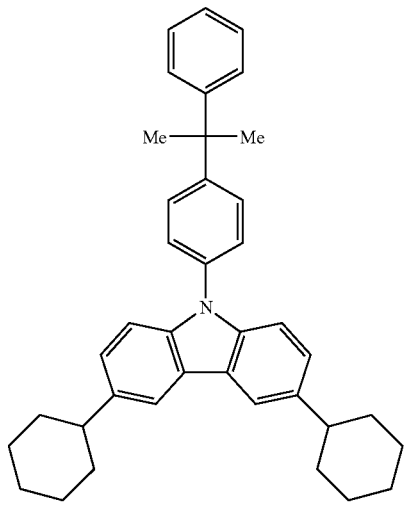
11-19
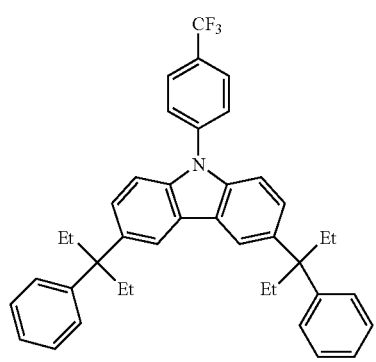
11-20
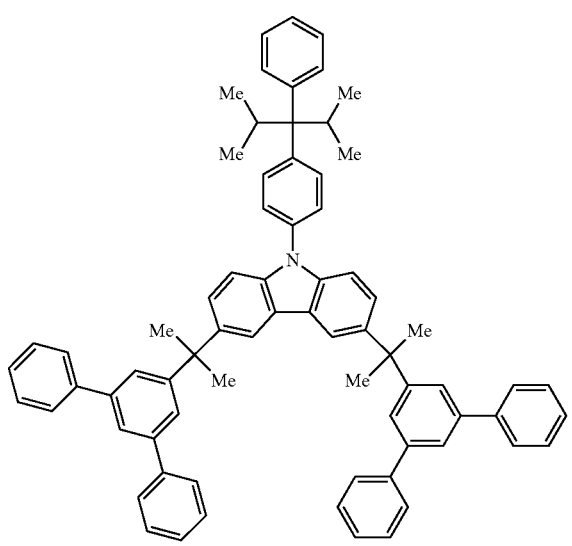
12-1
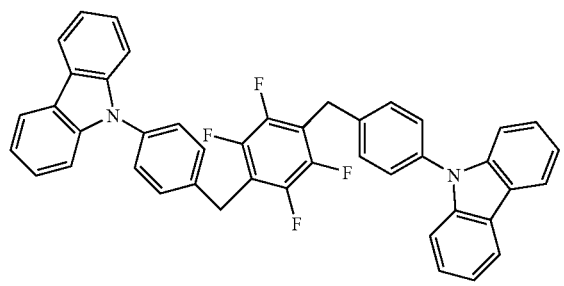
12-2
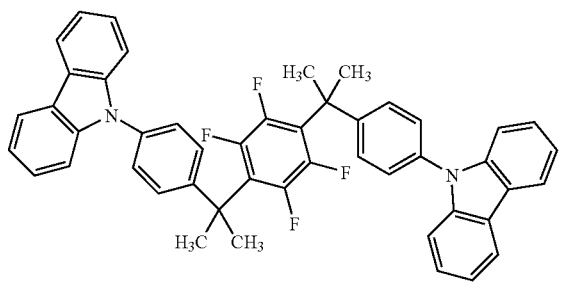

12-3
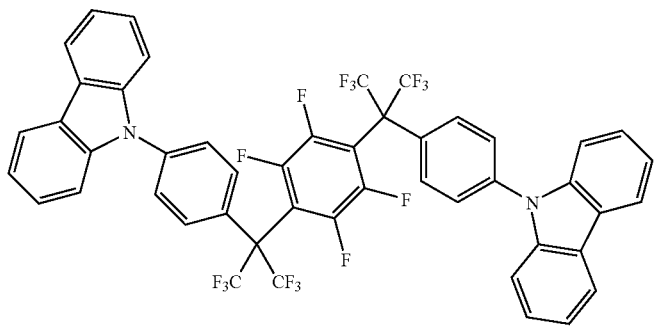
12-4
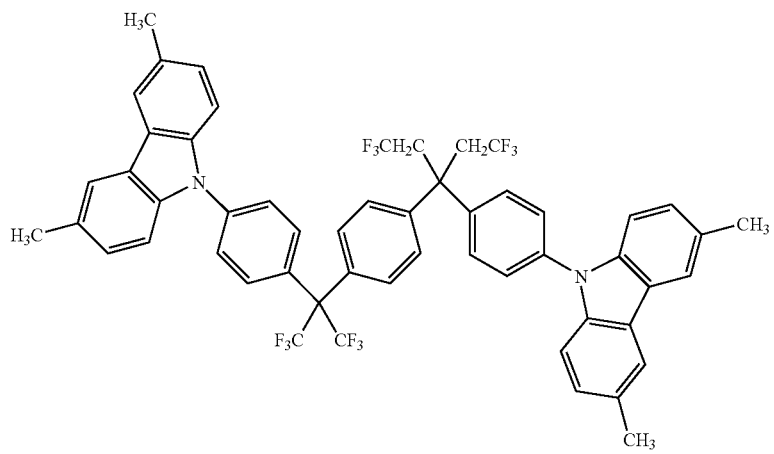
12-5
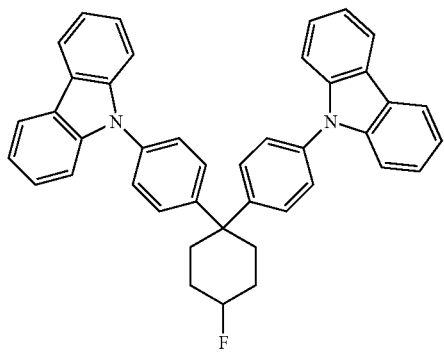
12-6
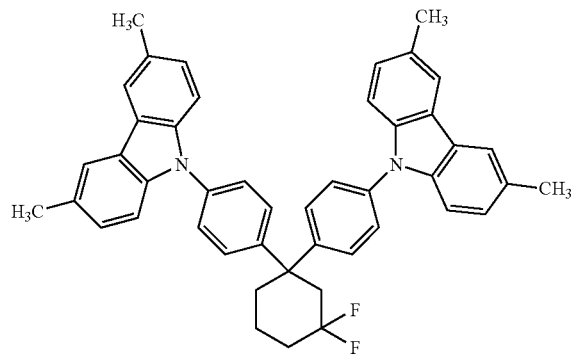
12-7
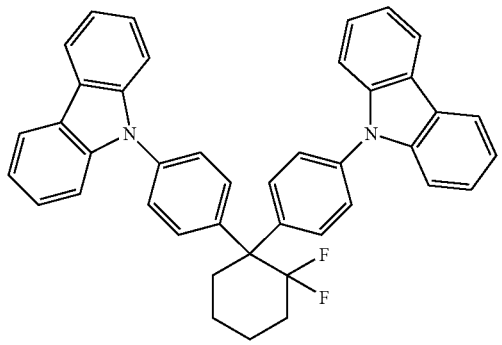
12-8
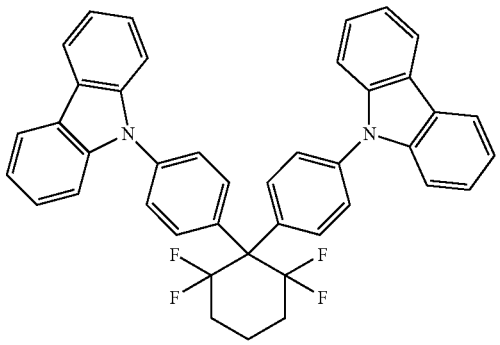

-continued
12-9
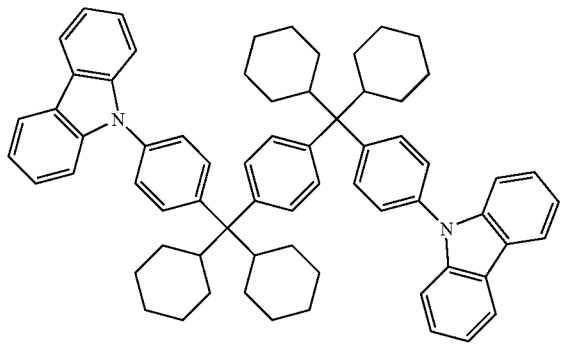
12-10
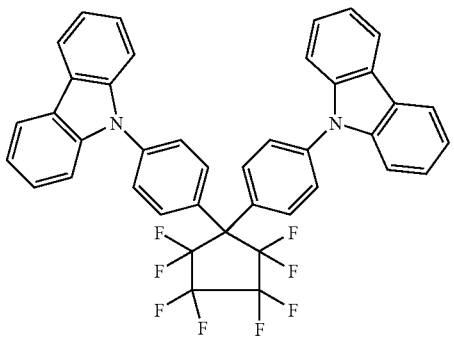
12-11
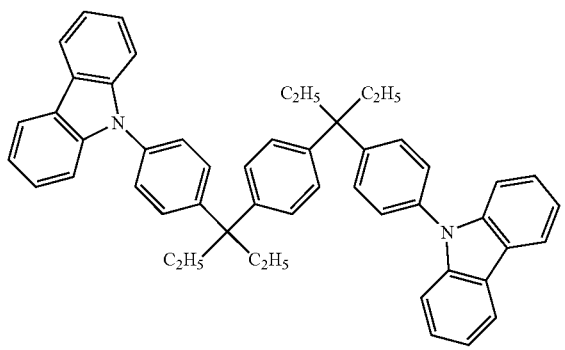
12-12
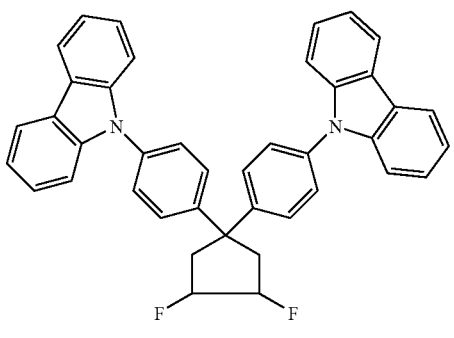
12-13
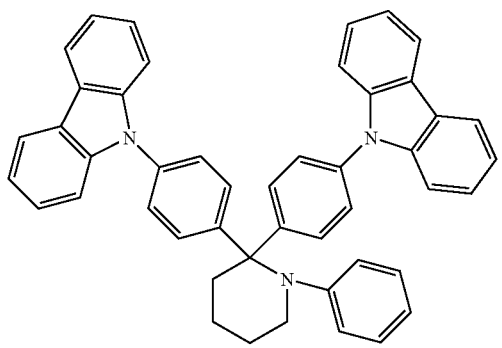
12-14
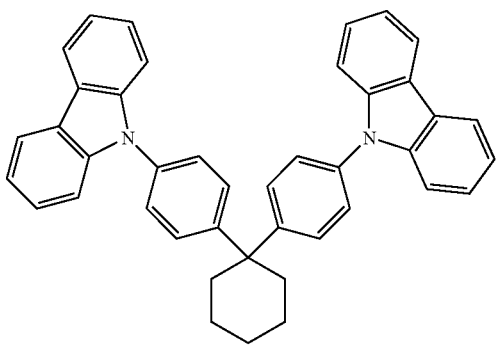
12-15
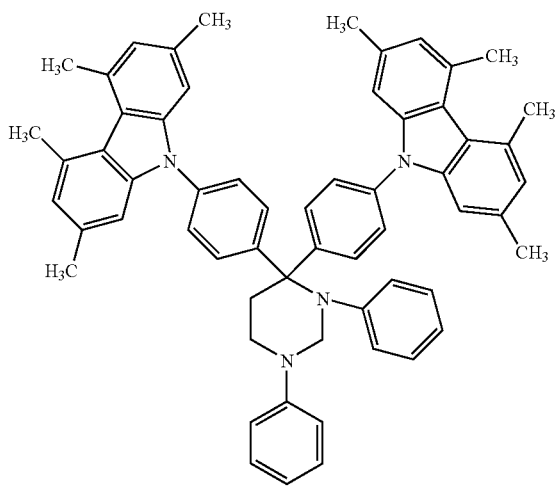
12-16
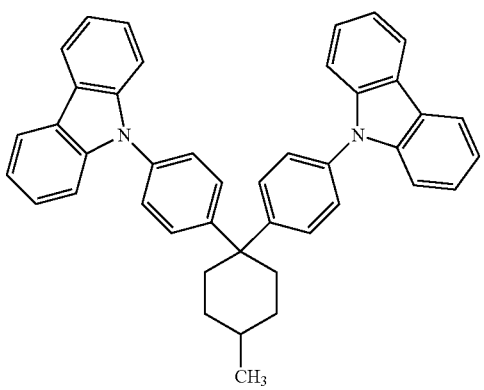

-continued
12-17
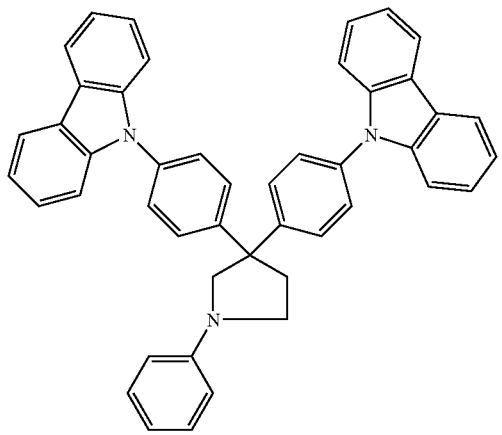
12-18
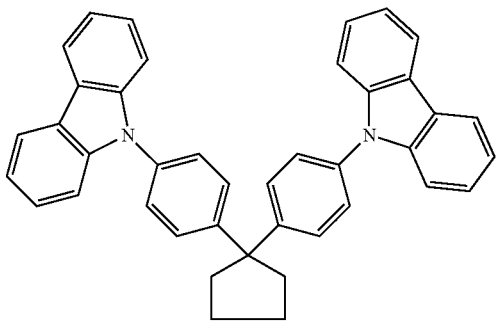
12-19
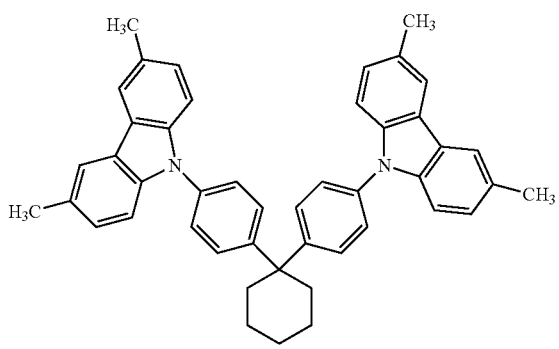
12-20
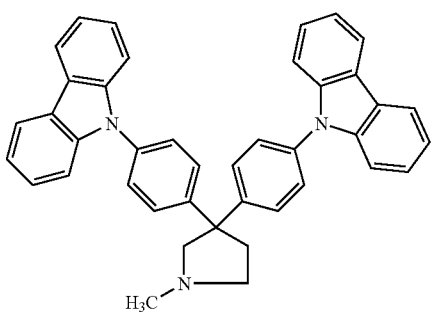
12-21
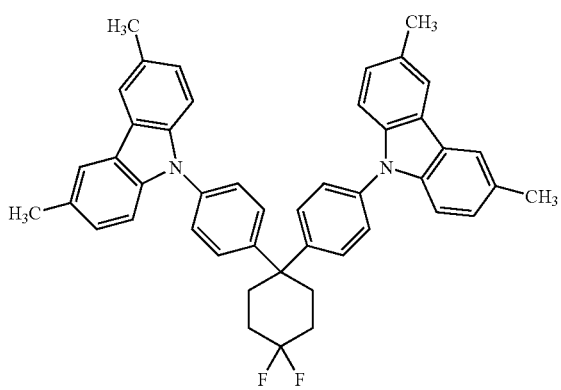
12-22
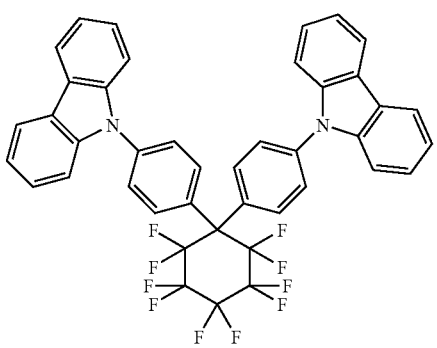

-continued
12-23
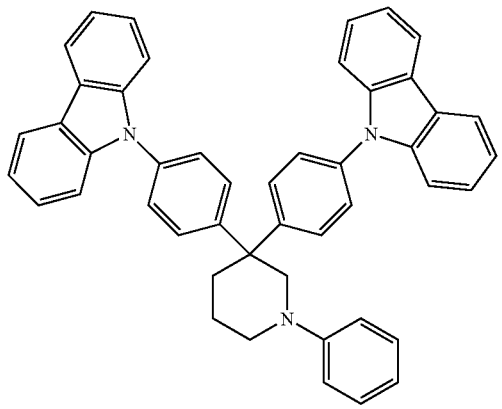
12-24
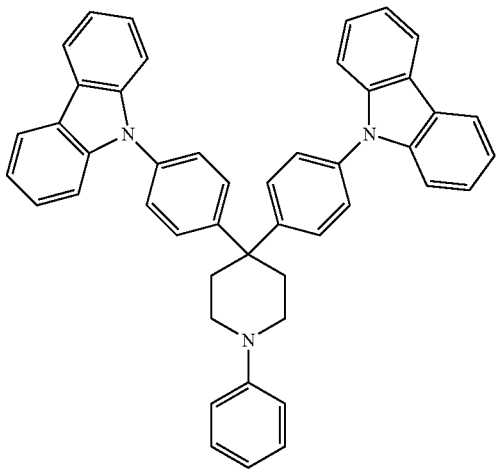
12-25
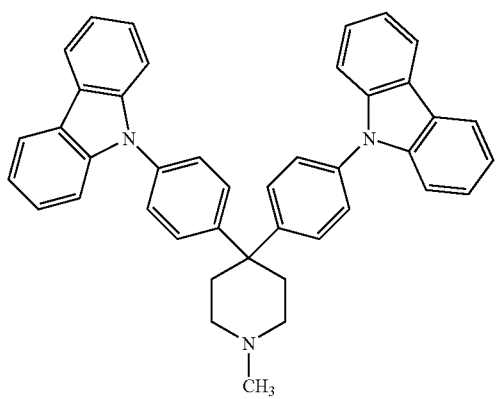
12-26
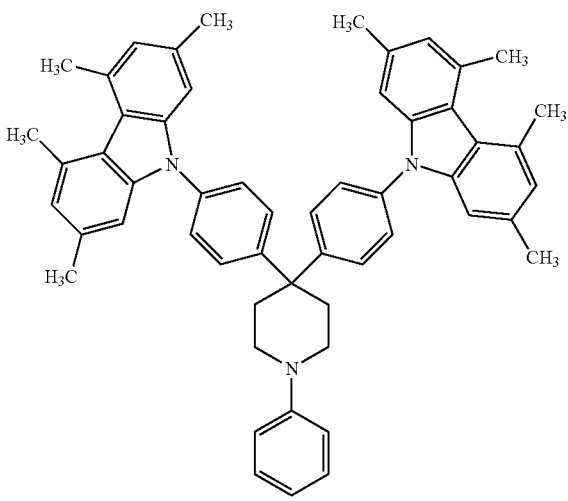
12-27
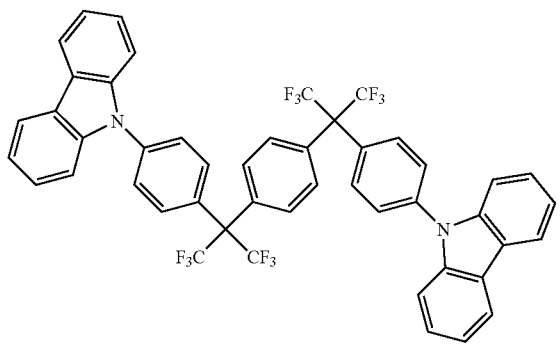
12-28
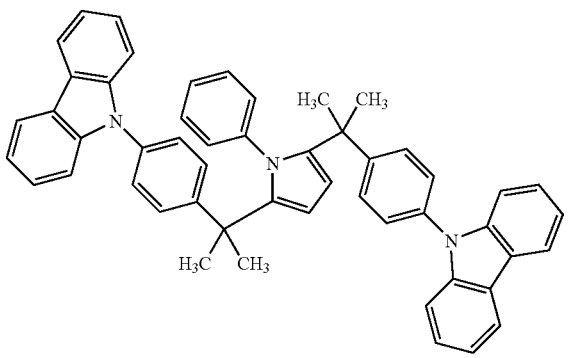

-continued
12-29
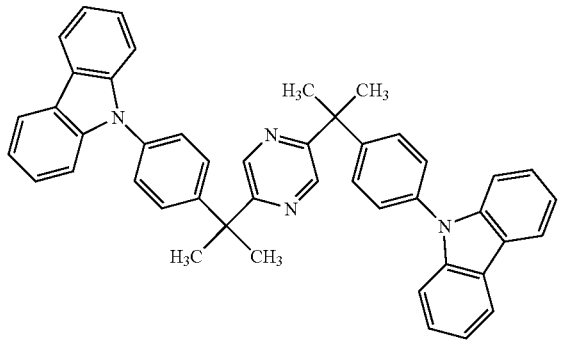
12-30
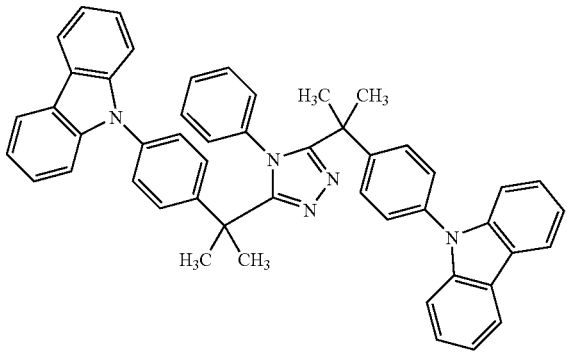
12-31
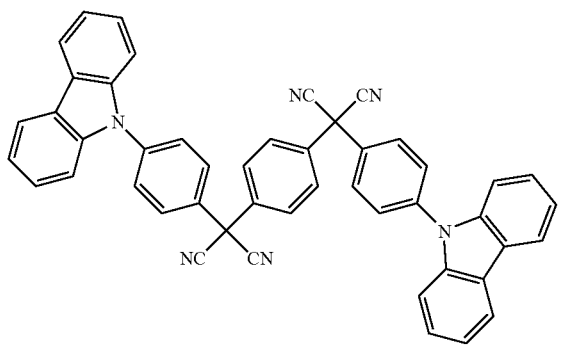
12-32
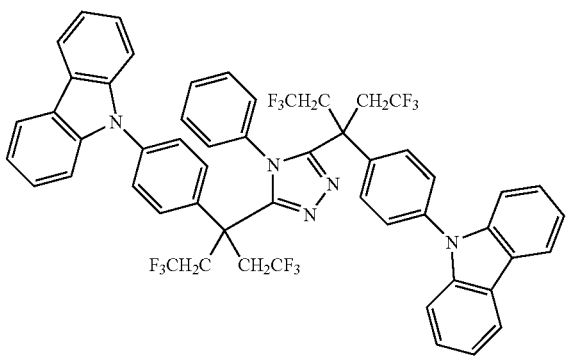
12-33
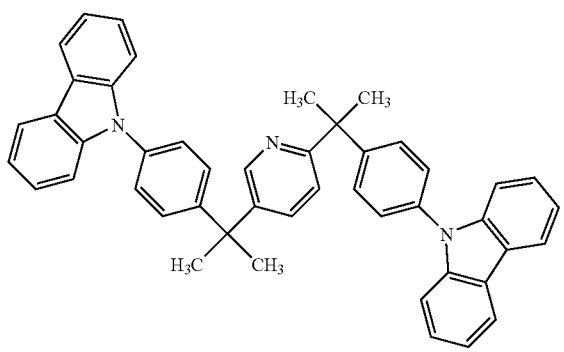
12-34
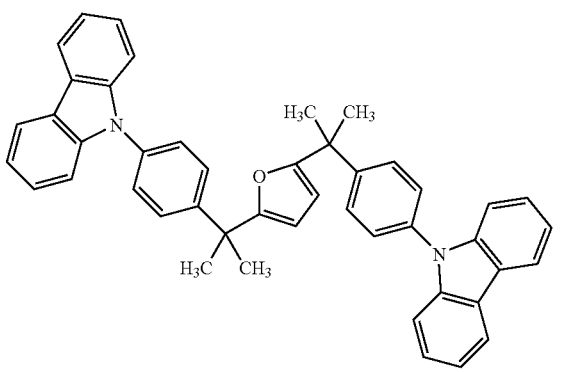
12-35
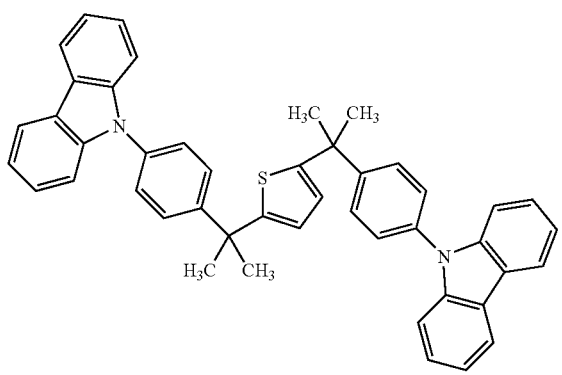
12-36
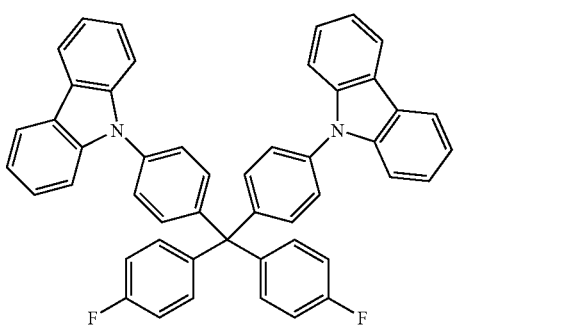

-continued
12-37
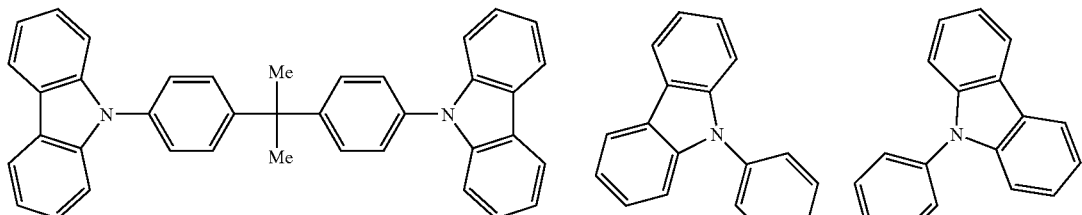
12-38
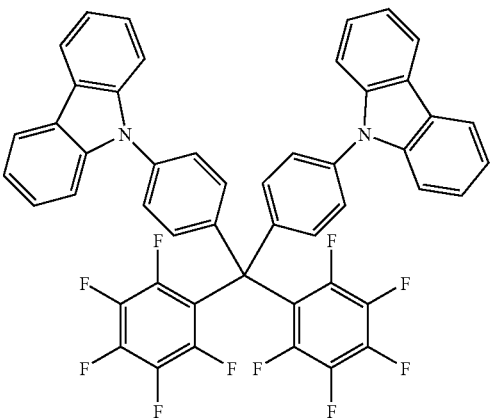
12-39
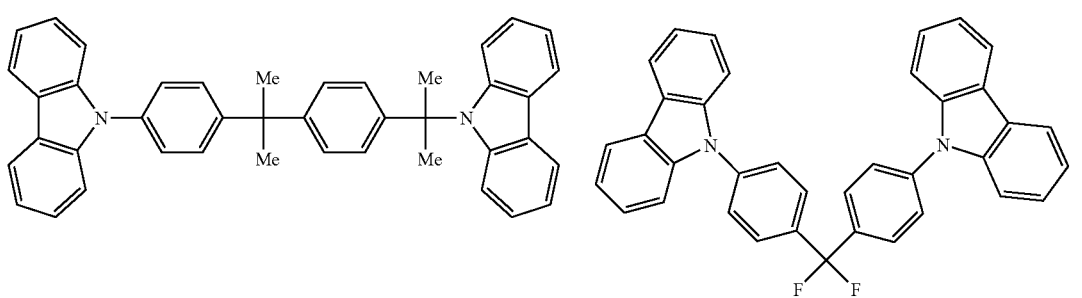
12-40
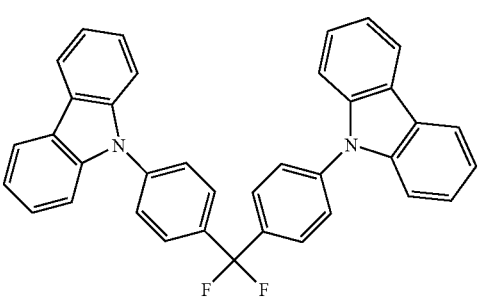
12-41
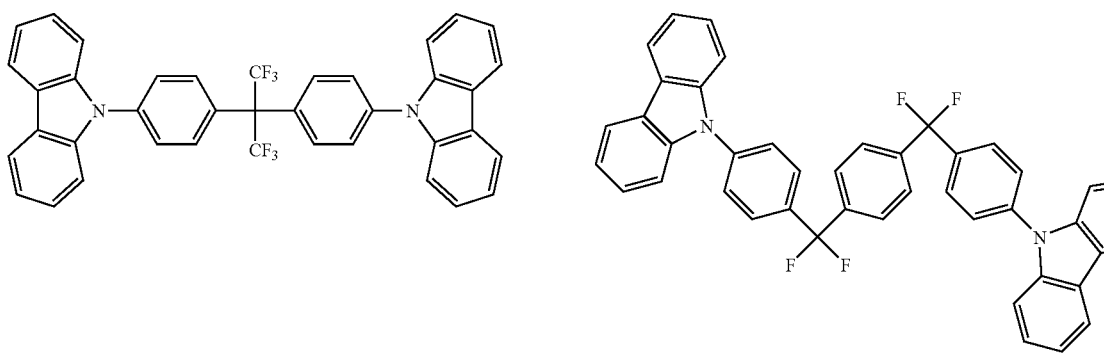
12-42
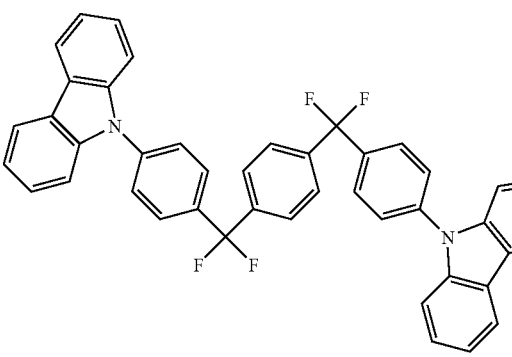
12-43
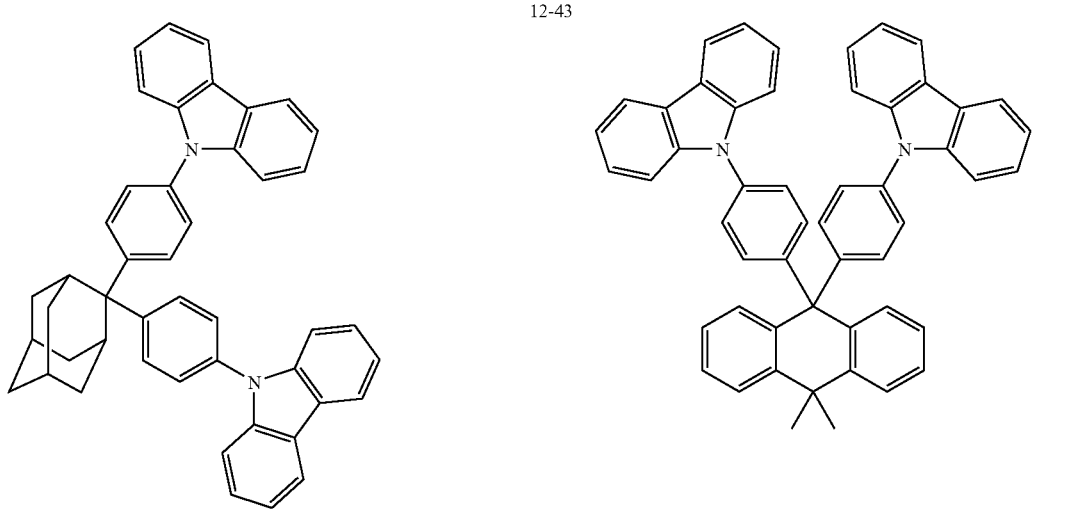
12-44
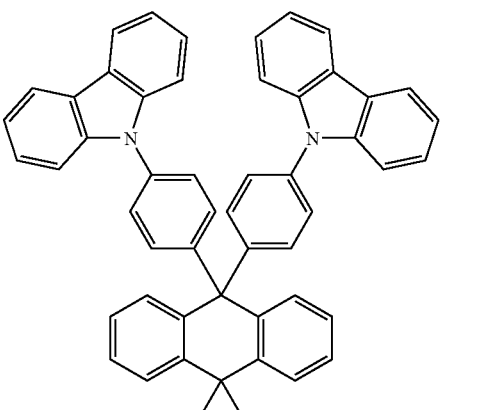

-continued
12-45
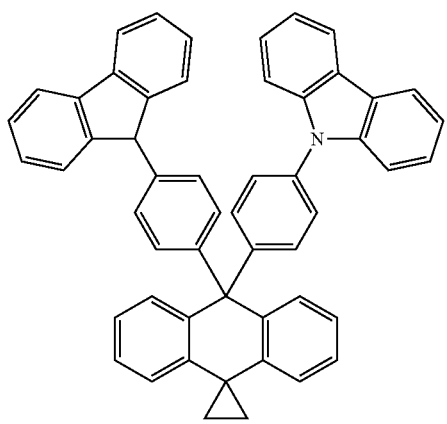
12-46
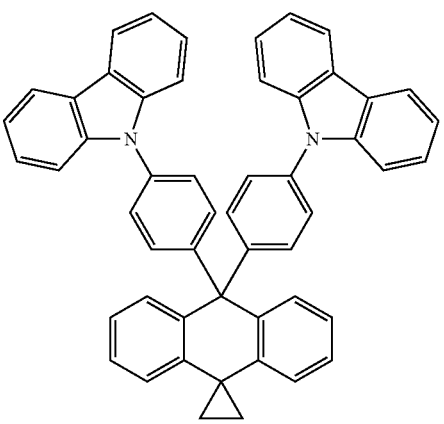
12-47
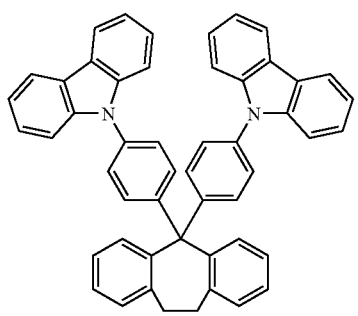
12-48
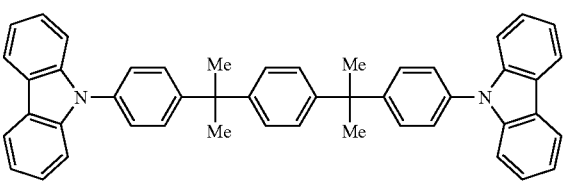
13-1
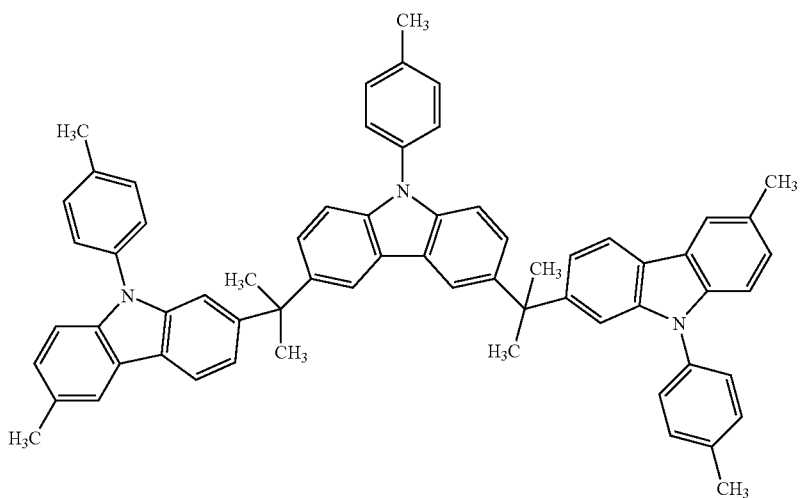
13-2
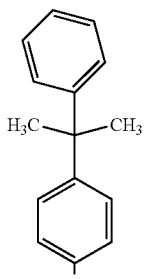

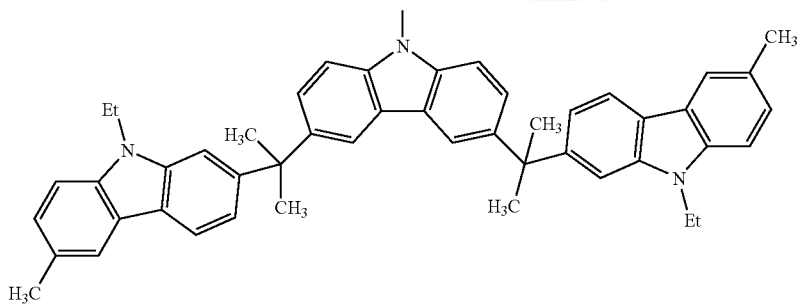
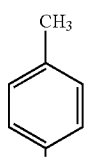
13-3
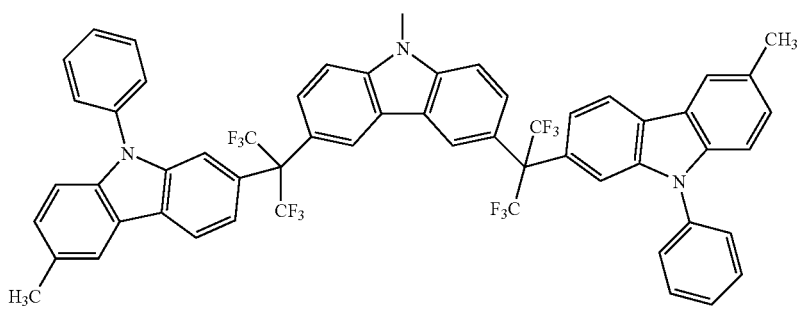
13-4
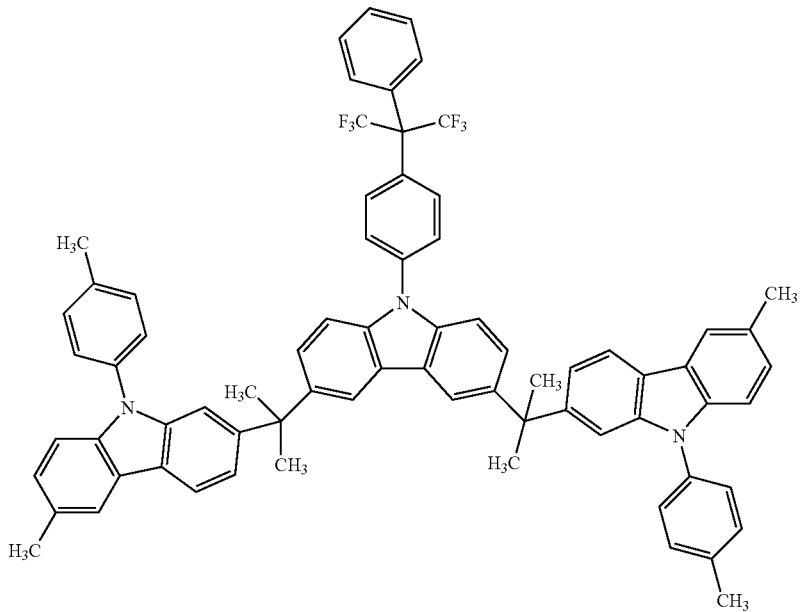

13-5
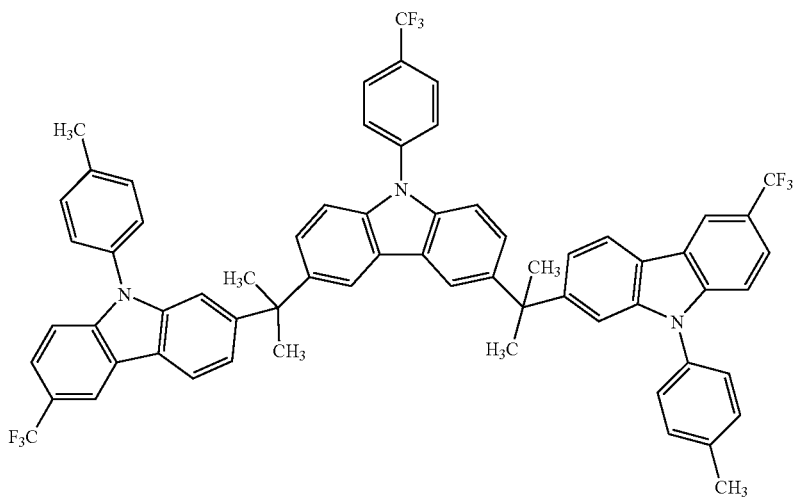
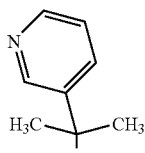
13-6
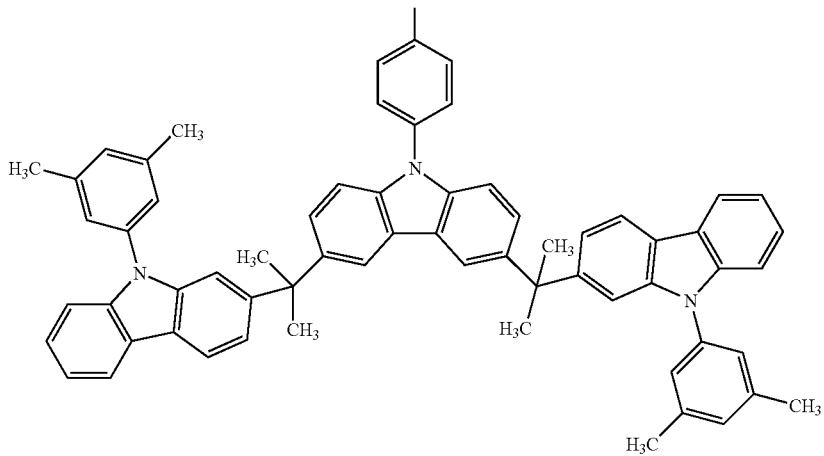
13-7
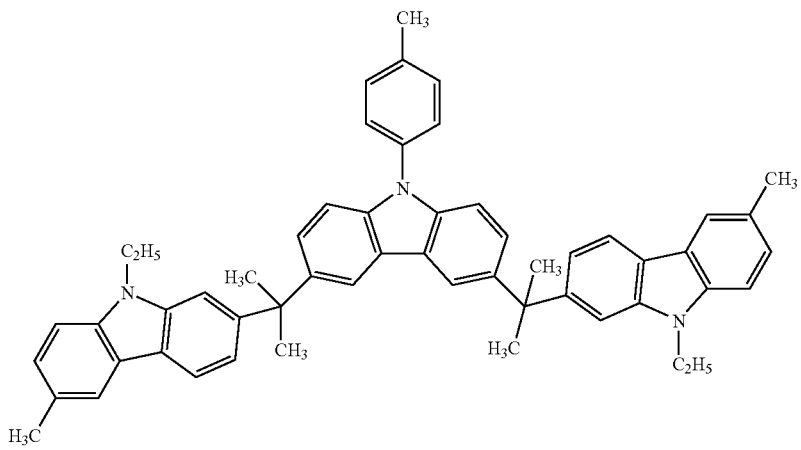

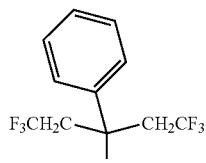
13-8
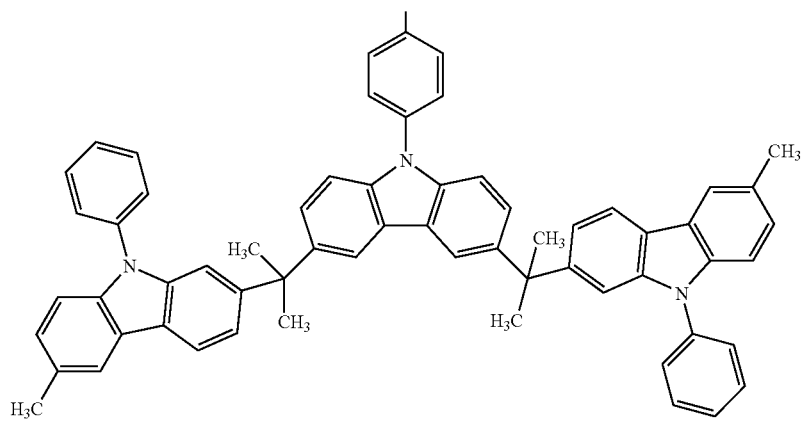
13-9
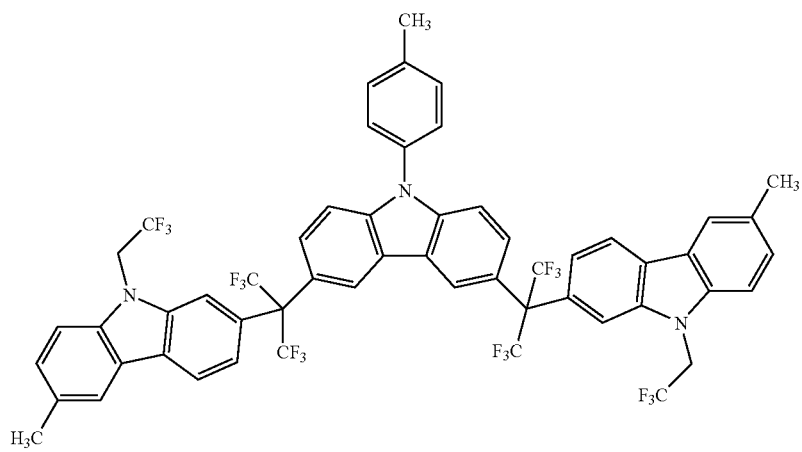
13-10
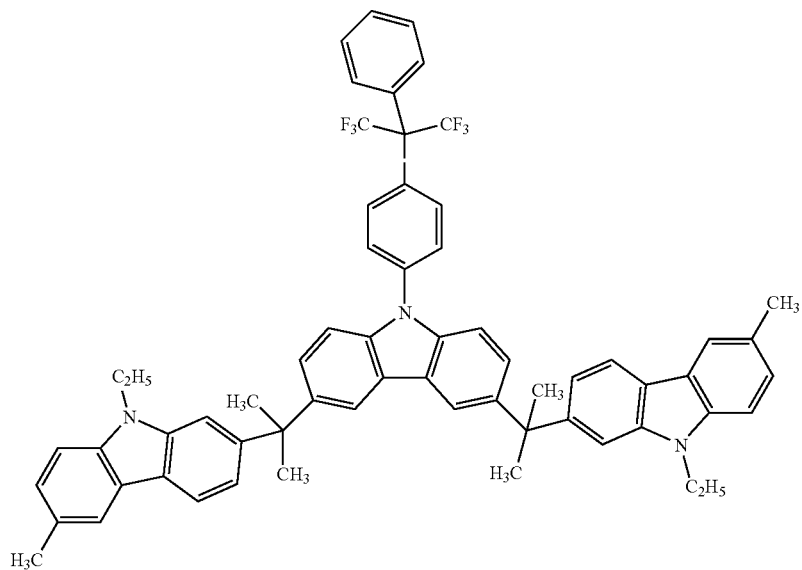

13-11
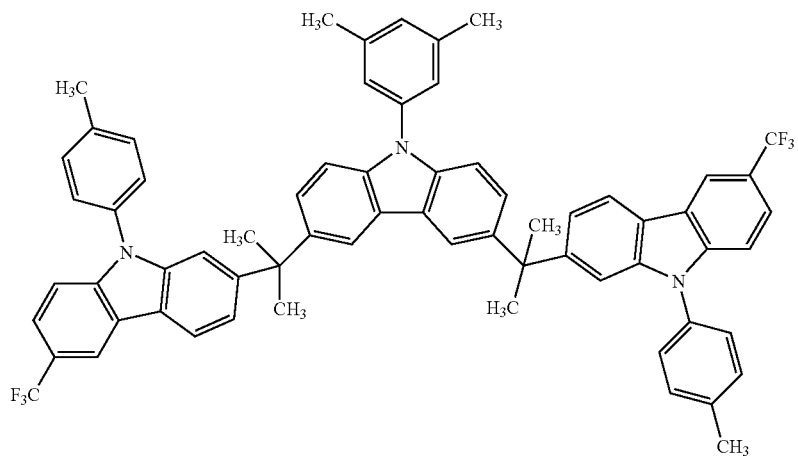
13-12
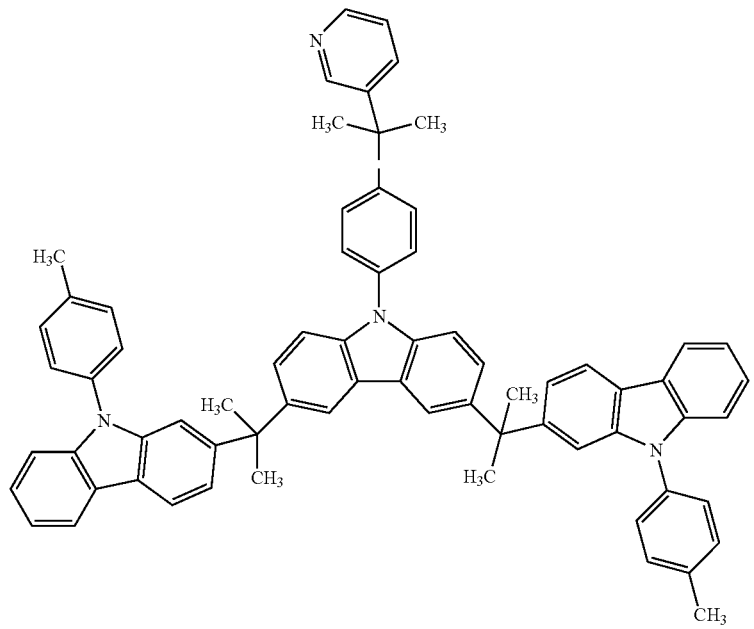
13-13
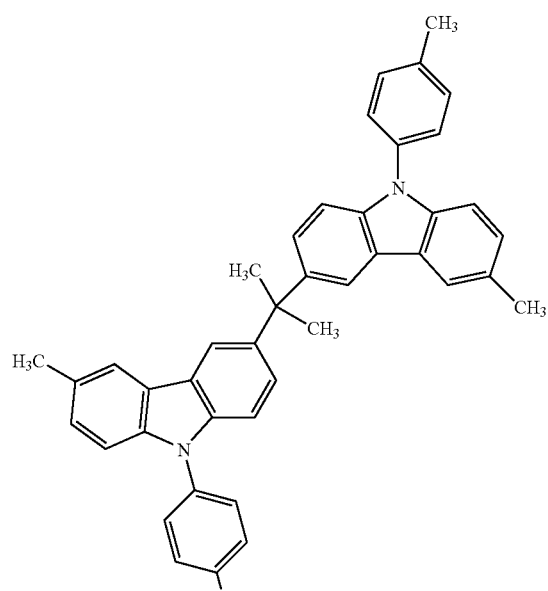

-continued
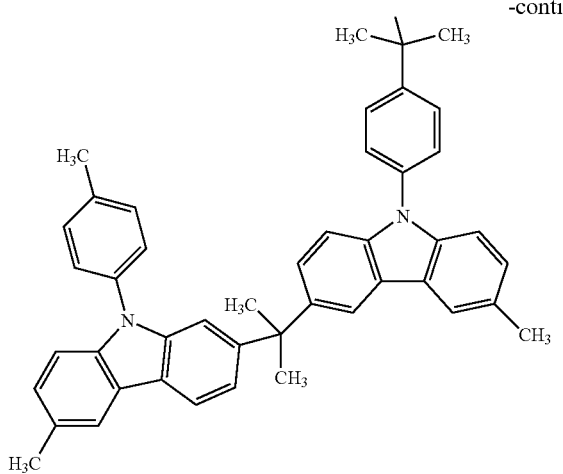
13-14
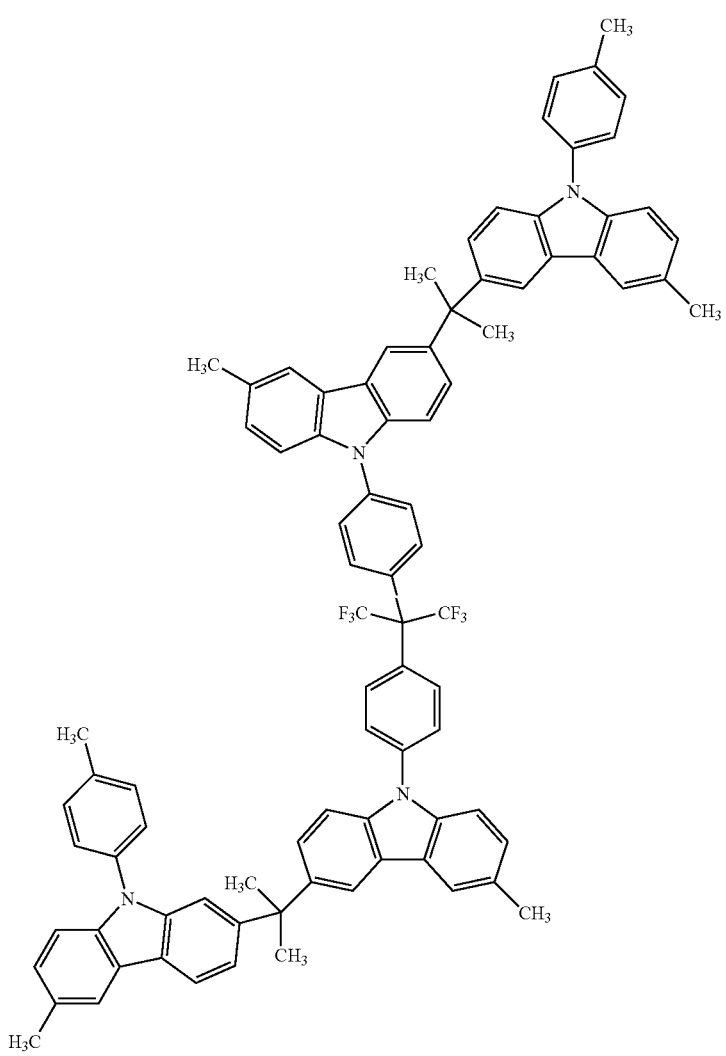

-continued
13-15
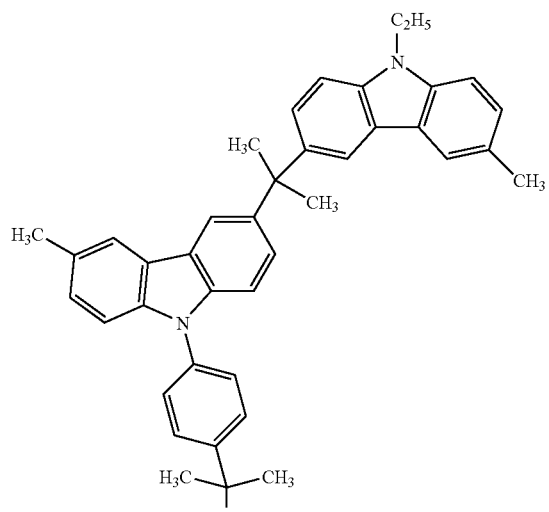
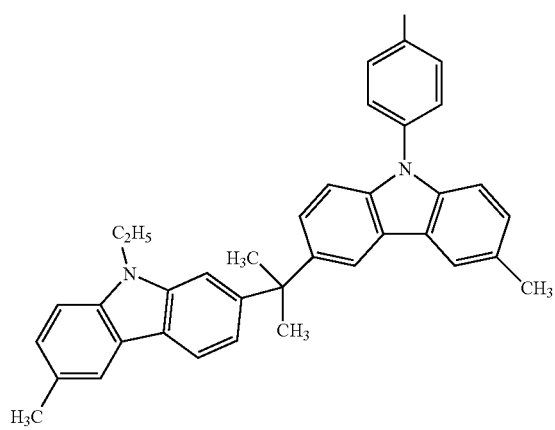
13-16
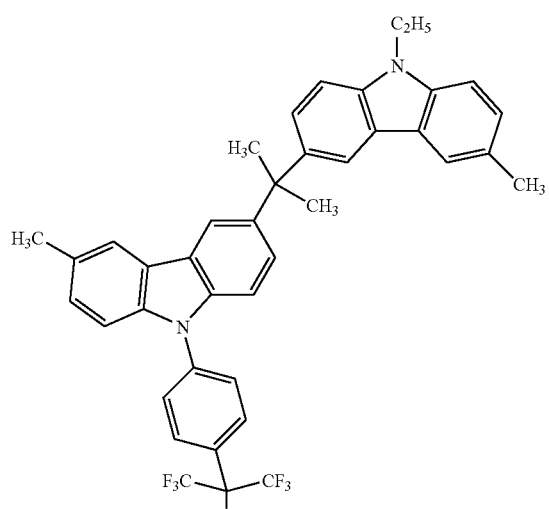

-continued
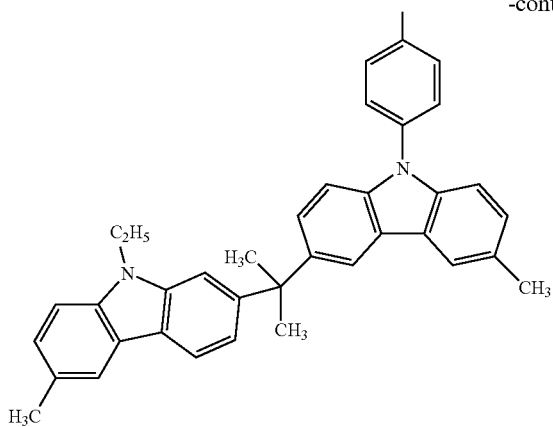
13-17
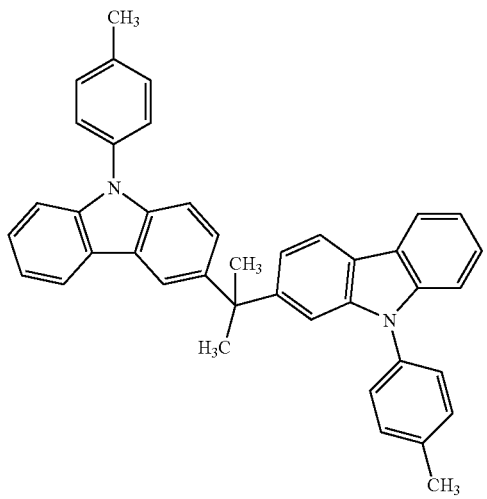
13-18
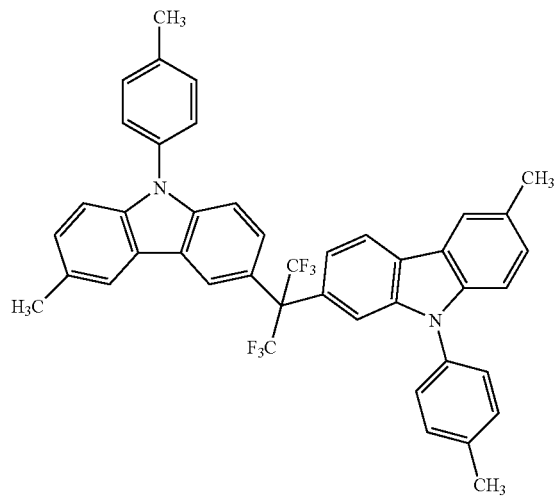
13-19
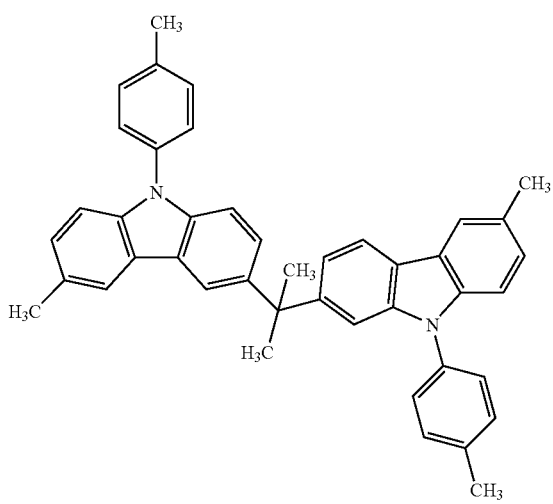
13-20
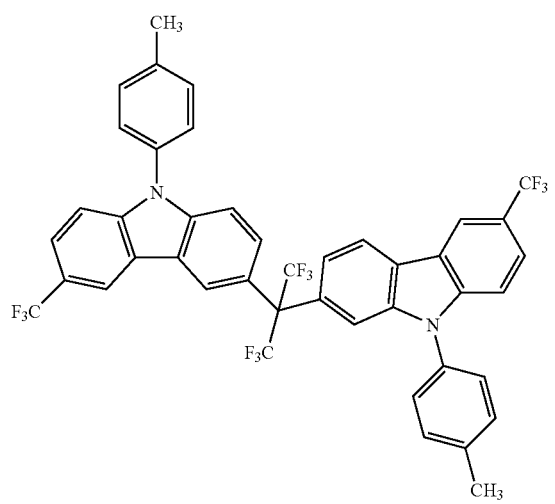
14-1
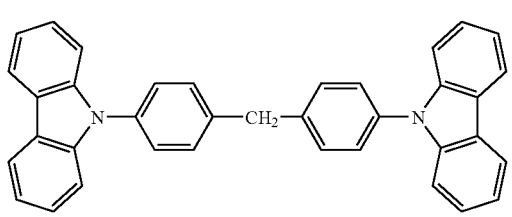
14-2
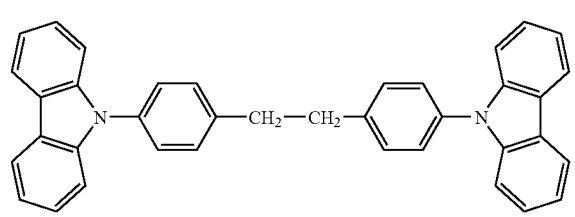

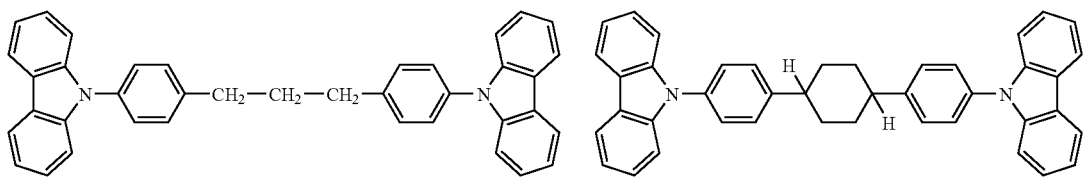
14-3 14-4
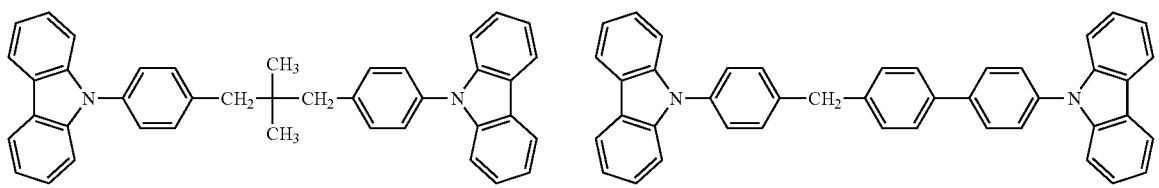
14-5 14-6
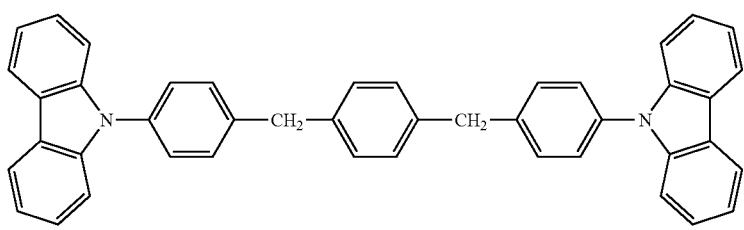
14-7
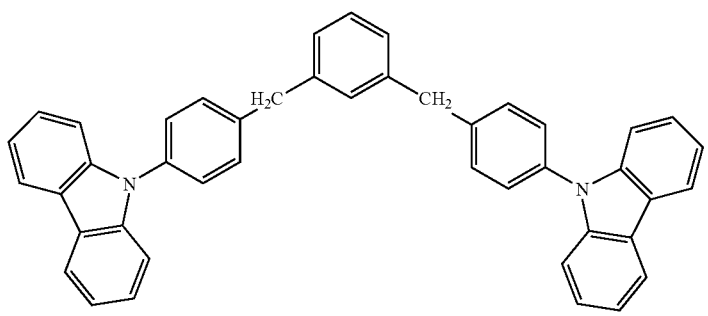
14-8
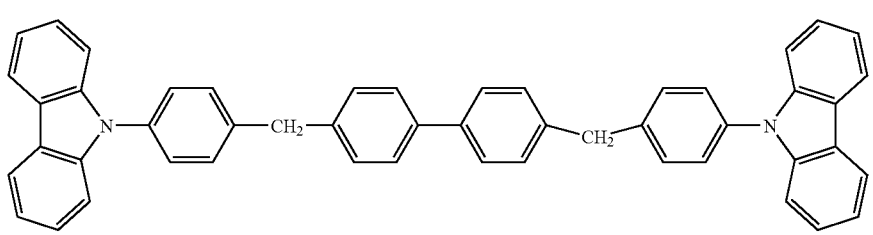
14-9

-continued
14-10
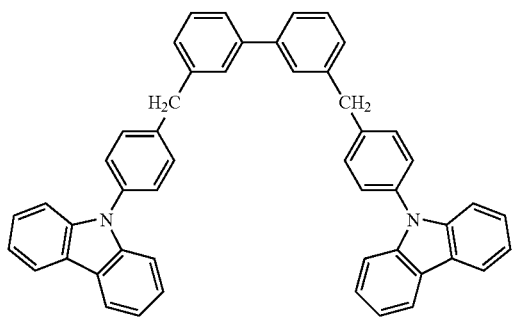
14-11
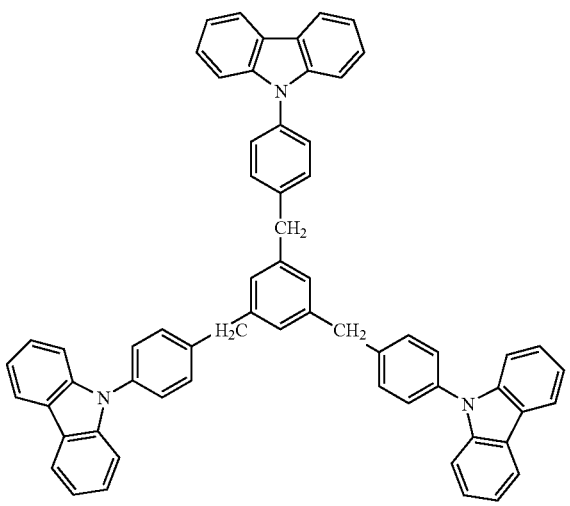
14-12
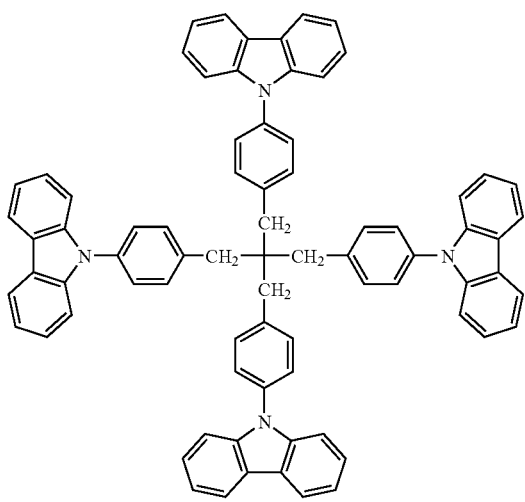
14-13
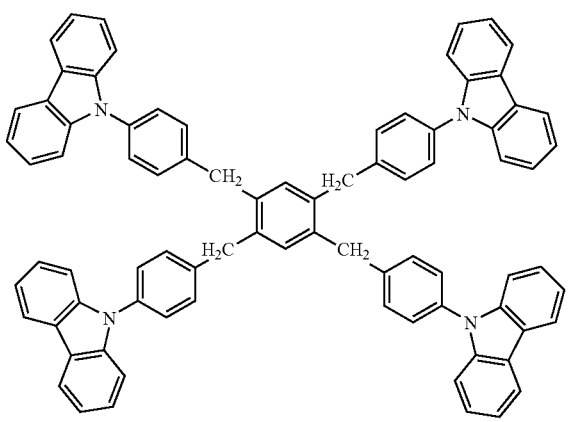
14-14
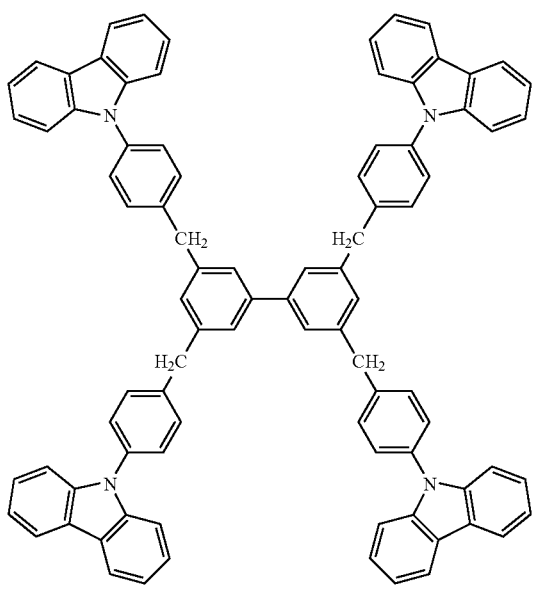
14-15
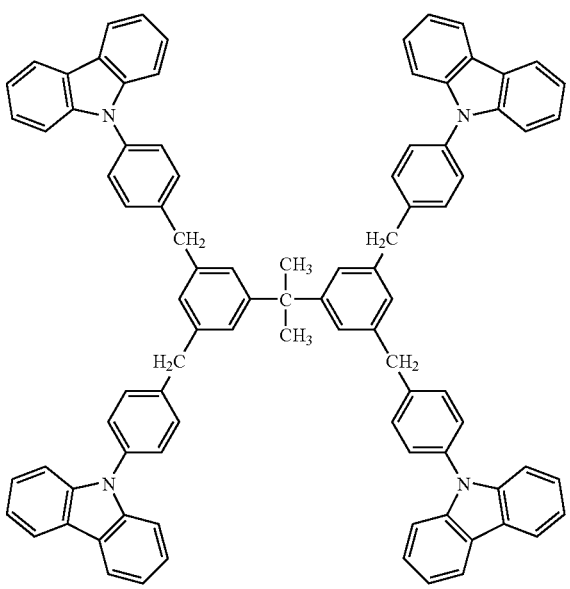

-continued
14-16
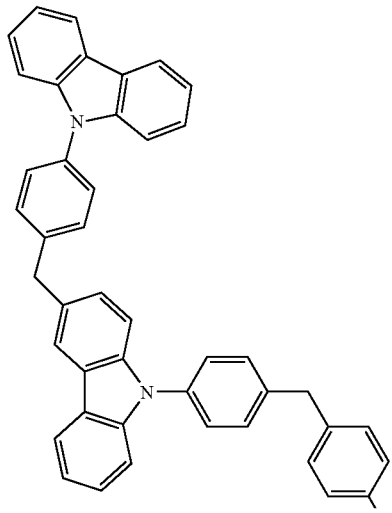
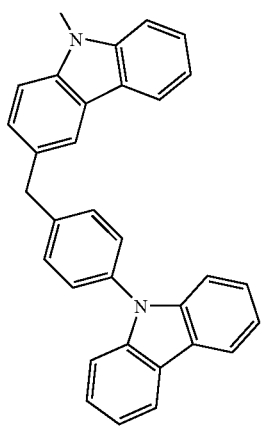
14-17
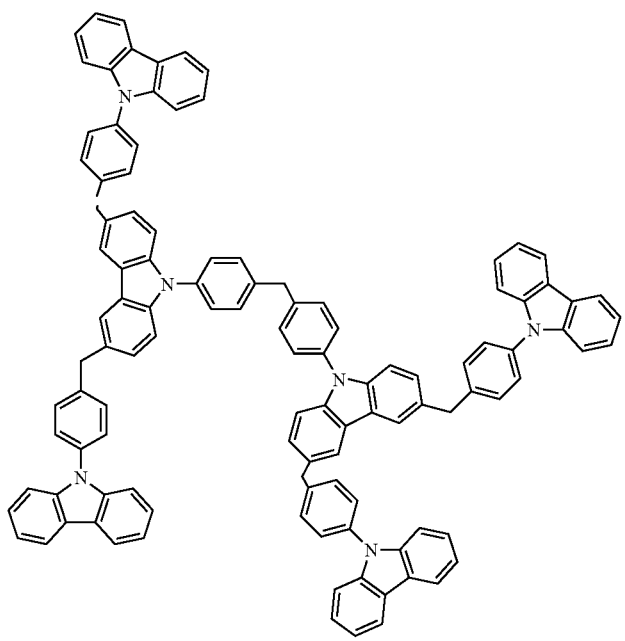

14-18
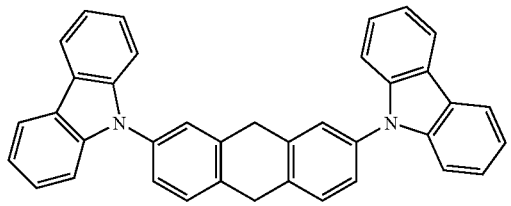
14-19
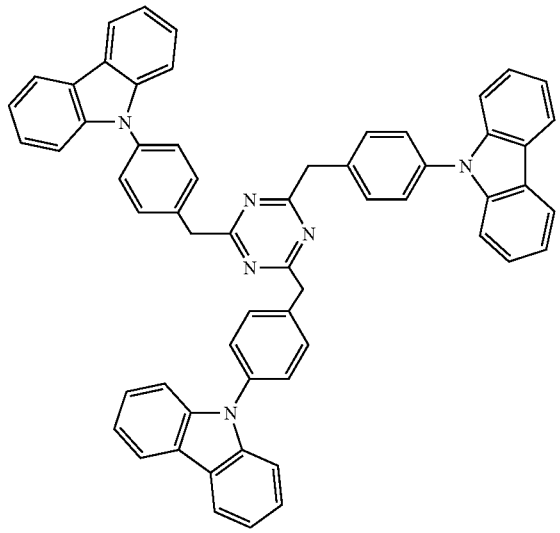
14-20
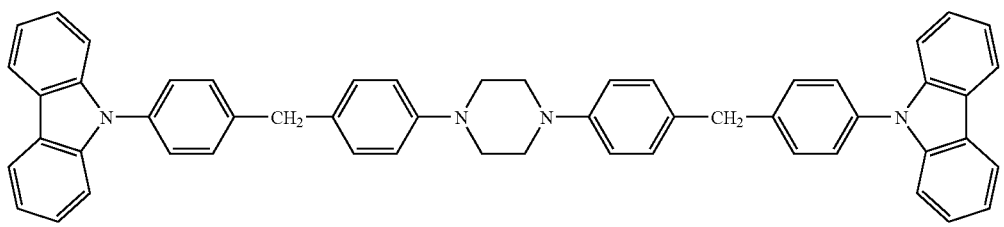
14-21
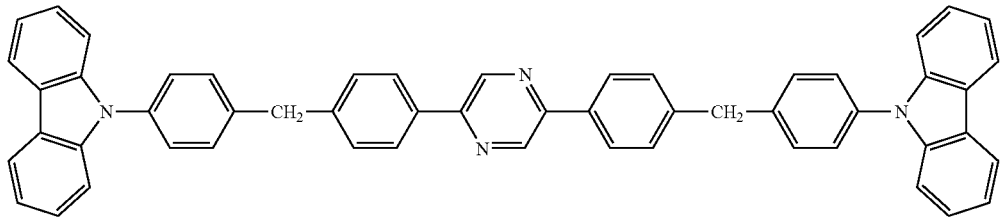
14-22
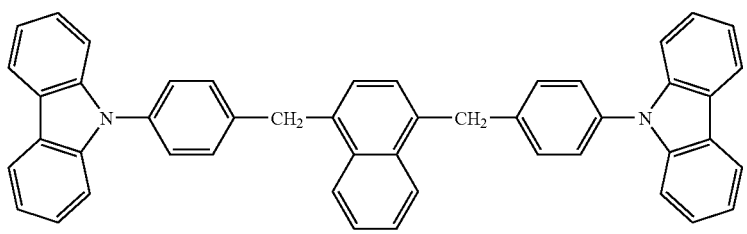
14-23
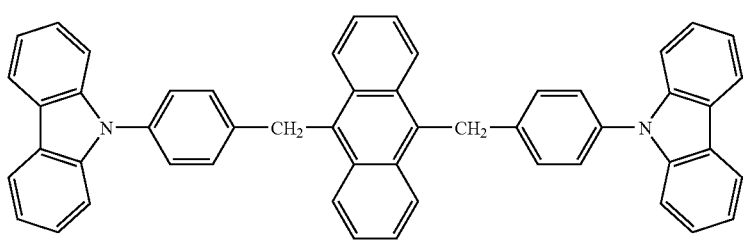

-continued
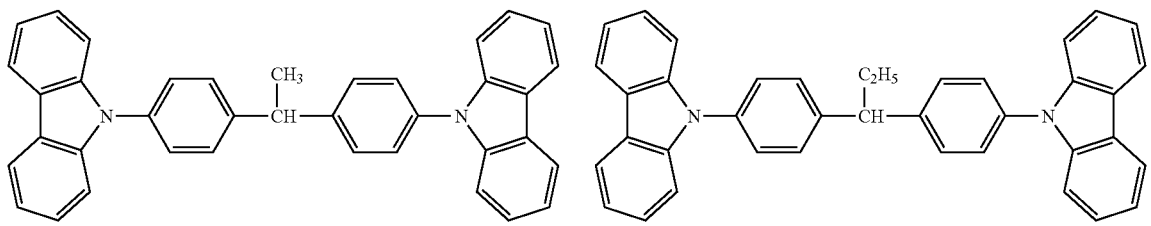
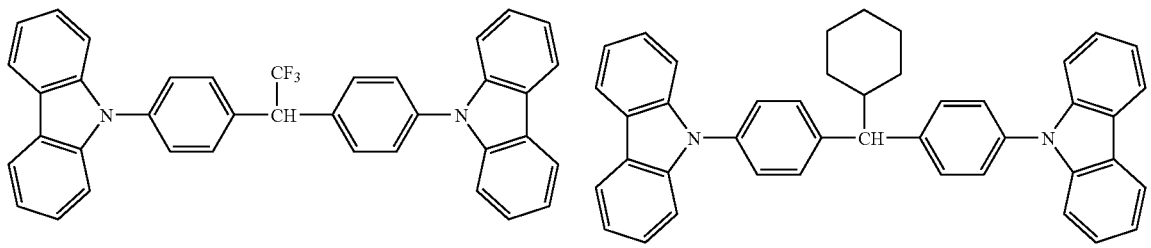
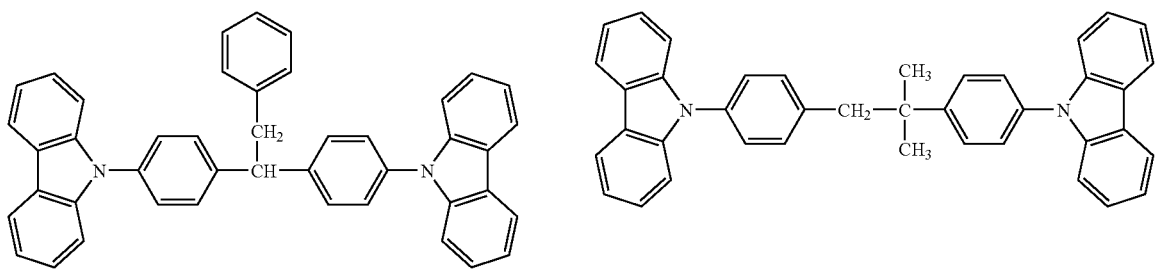
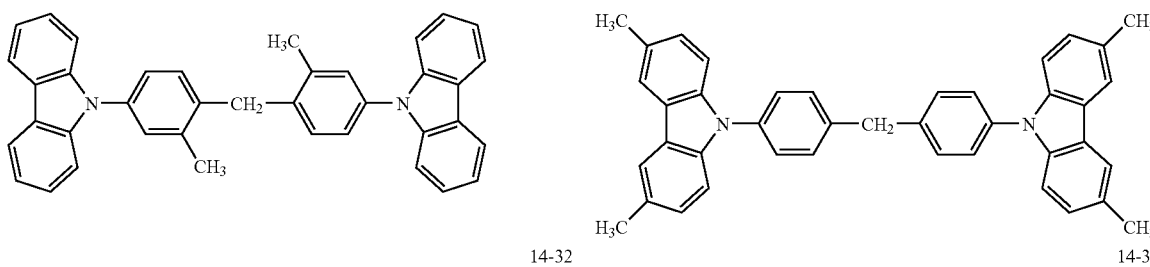
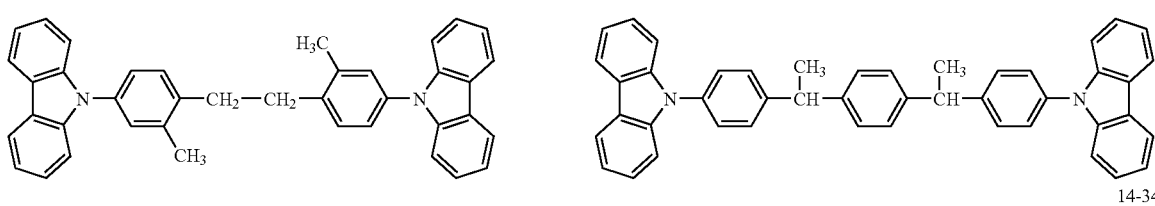
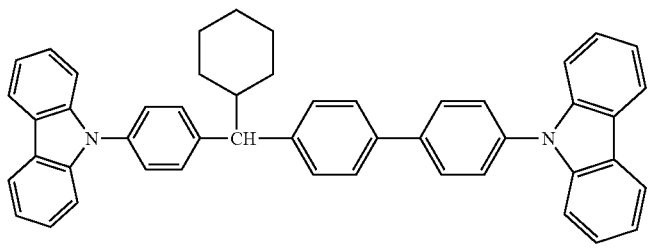

14-35
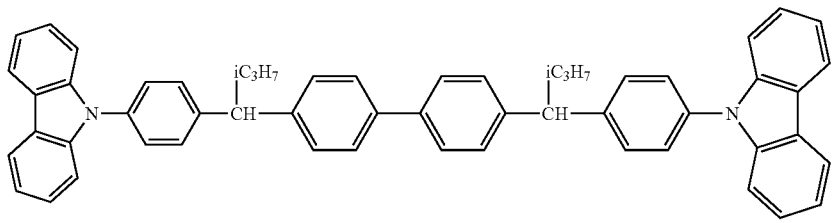
14-36
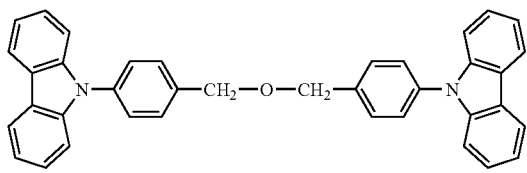
14-37
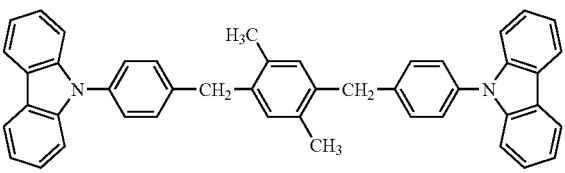
14-38
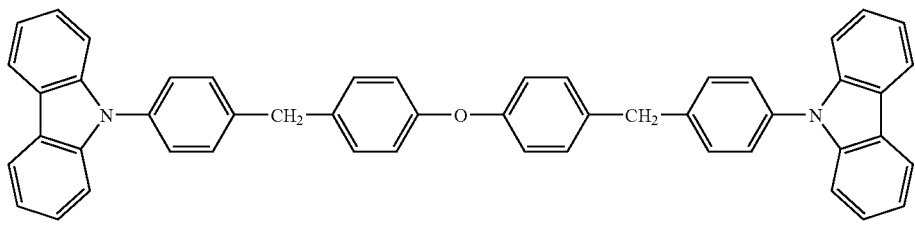
14-39
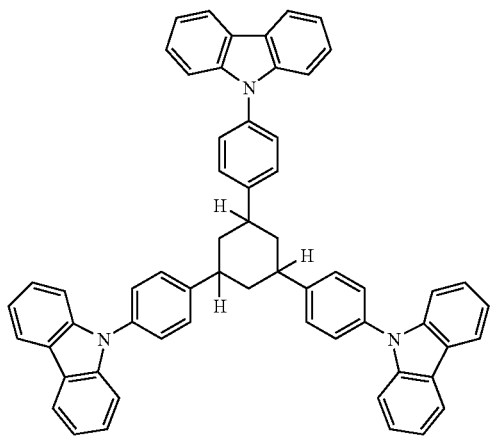
14-40
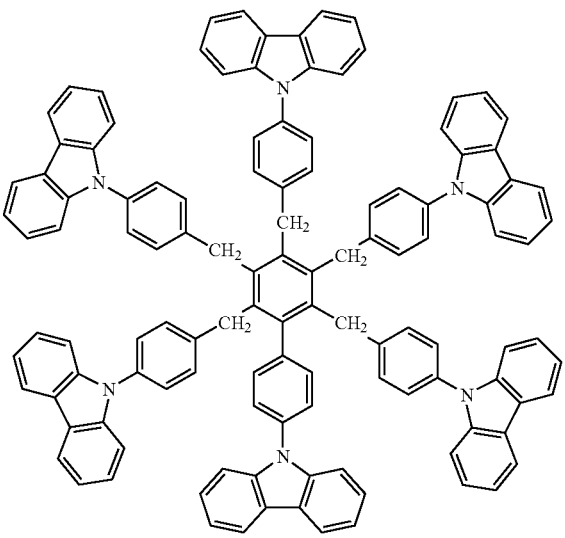
14-41
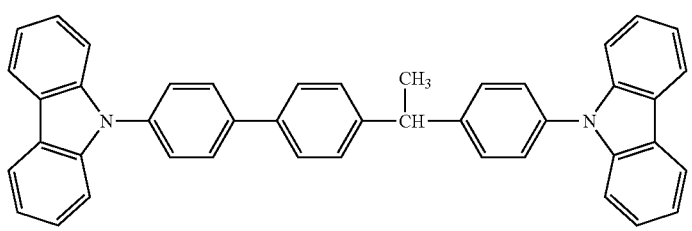
14-42
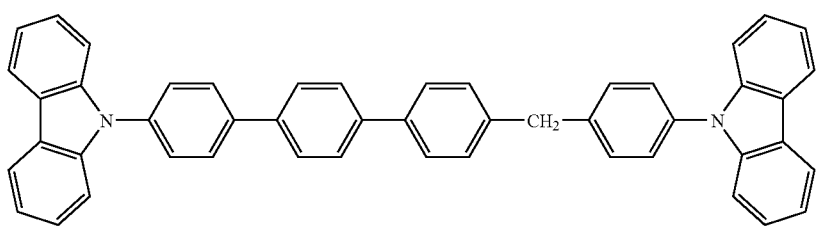

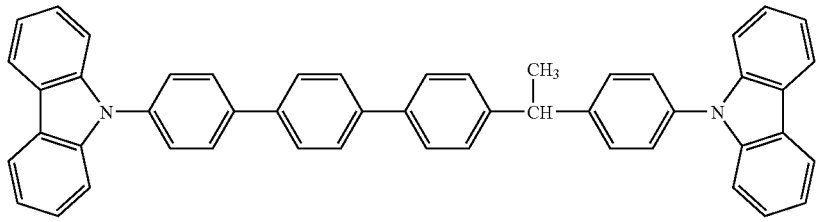

14-43

The compound in the invention has a molecular weight of preferably from 600 to 2,000. The compound with a molecular weight of from 600 to 2,000 has a high Tg (glass transition temperature), and provides improved thermal stability and extends life of the organic EL element. The compound in the invention has a molecular weight of more preferably from 800 to 2,000.

The compound in the invention represented by formula A can be synthesized according to well-known methods in the art such as a method disclosed in "Tetrahedron Lett.", 39 (1998), p. 2367-2370, Japanese Patent Publication No. 3161360, "Angew. Chem. Int. Ed.", 37 (1998), p. 2046-2067, "Tetrahedron Lett., 41 (2000), p. 481-484, "Synth. Commun.," 11 (7) (1981), p. 513-519, or "Chem. Rev.", 2002, 102, p. 1359-1469.

Synthesis of Exemplified Compound 11-1

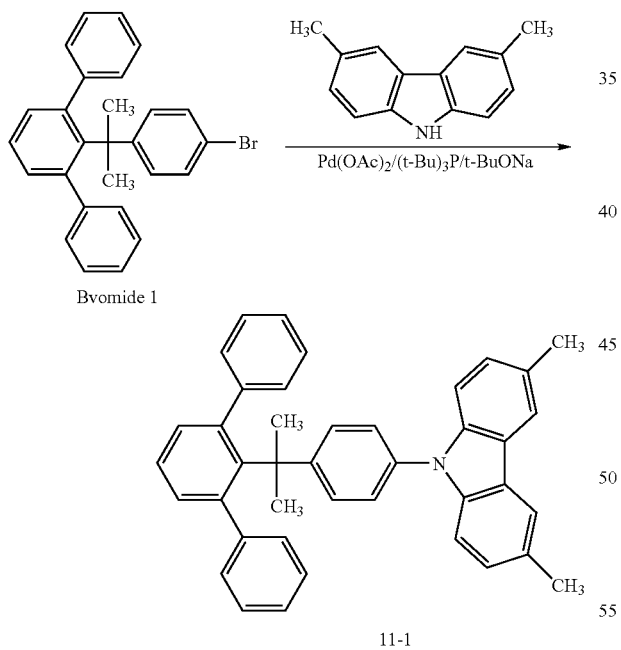

In a nitrogen atmosphere, 25 mg of palladium acetate and 0.15 ml of tri(tert-butyl)phosphine were mixed and stirred at 70° C. for 30 minutes. Bromide 1 of 1.2 g, 0.6 g of dimethylcarbazole, 0.7 g of sodium tert-butoxide, and 40 ml of xylene were added to the resulting mixture, and heated under reflux for 12 hours. After that, water was added to the resulting reaction solution, and the organic solution phase was separated, and purified according to silica gel column chromatography. The solvent was evaporated to obtain a solid residue. The solid residue was recrystallized from tolene to obtain 0.4 g of Exemplified compound 11-1 (yield: 26%).

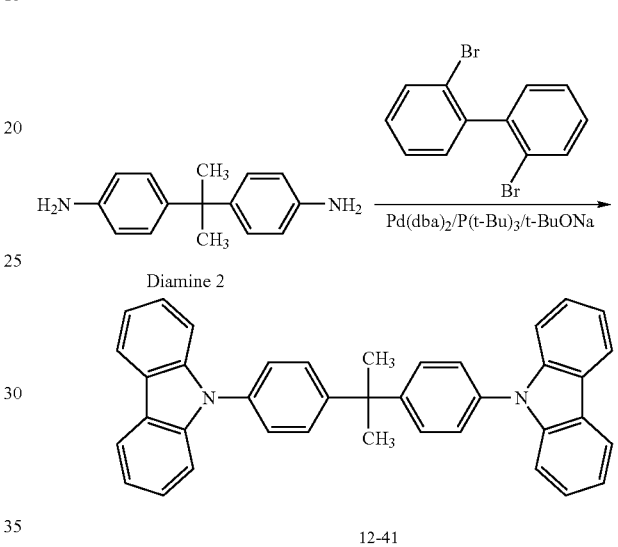

Synthesis of Exemplified Compound 12-41

In a nitrogen atmosphere, 2.5 g of diamine 2, 5.0 g of 2,2'-dibromodiphenyl, 0.5 g of bis(dibenzylideneacetone)-palladium, 0.9 ml of tri(tert-butyl)phosphine, 3.0 g of sodium tert-butoxide, and 60 ml of toluene were mixed and stirred at 60° C. for 6 hours. After that, toluene and water were added to the resulting reaction mixture, and the organic solution phase was separated, and purified according to silica gel column chromatography. The solvent was evaporated to obtain a solid residue. The solid residue was recrystallized from a mixture solvent of toluene and methanol to obtain 2.0 g of Exemplified compound 12-41 (yield: 40%).

In the invention, in addition to the compound represented by formula A, another known host compounds can be used. Further, in addition to a light emission layer containing the compound represented by formula A, another light emission layer containing the known host compound can be provided. The known host compound is not specifically limited, but is preferably a carbazole derivative, a triarylamine derivative, an aromatic borane derivative, a nitrogen-containing heterocyclic compound, a thiophene derivative, a furan derivative, or an oligoarylene compound, each having a phosphorescence 0-0 band of not more than 450 nm.

Next, a measuring method of a phosphorescence 0-0 band in the invention will be explained. Firstly, a measuring method of phosphorescence spectra will be explained.

A compound to be measured is dissolved in a mixture solvent of ethanol and methanol (=4:1 by volume) which is deoxygenated, placed in a cell for phosphorescence measurement, and exposed to exited light at a liquid nitrogen temperature of 77 K. Spectra of emission light are measured 100 ms after the excited light exposure. As emission life of phosphorescence is longer than that of fluorescence, emission observed 100 ms after the excited light exposure is considered to be phosphorescence. A compound having a phosphorescence life of less than 100 ms may be measured less than 100 ms after the exposure. However, when time after the exposure is too short, problem is caused that phosphorescence cannot be distinguished from fluorescence. It is necessary to select time which can distinguish phosphorescence from fluorescence.

In a compound, which is insoluble in the above solvent mixture, any solvent capable of dissolving the compound can be used. (In the above-described measuring method, solvent effect upon phosphorescence wavelength is substantially extremely small and does not cause problem.)

In the invention, the shortest wavelength which gives emission maximum in the phosphorescence spectra measured according to the method described above is defined as a phosphorescence 0-0 band.

Intensity of the phosphorescence spectra is ordinarily weak, and in the magnified spectra, there are some cases in which the peaks are difficult to be distinguished from noises. In such cases, stationary light spectra are magnified, and emission spectra (for convenience, referred to as phosphorescence spectra) 100 ms after light irradiation for excitation are superposed on the magnified spectra. Thereafter, wavelengths giving peaks are determined from portions of the stationary light spectra which are derived from the phosphorescence spectra, whereby the peaks can be distinguished from noises. Further, wavelengths giving peaks can be also read separating peaks from noises by subjecting the phosphorescence spectra to smoothing treatment. As the smoothing treatment, a smoothing method of Savitzky and Golay can be applied.

This host compound may be a low molecular weight compound, a polymeric compound having a repeating unit in the molecule, or a low molecular weight compound (a deposition polymerizable host) having a polymerizable group such as a vinyl group or an epoxy group.

The host compound is preferably a compound with high Tg (glass transition temperature), which has a hole transporting capability and an electron transporting capability, and prevents the emission wavelength from shifting to longer wavelength.

Examples of the host compound include compounds disclosed in the following patent documents:

Japanese Patent O.P.I. Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

The phosphorescent compound in the invention described above is preferably used as a dopant. The dopant may be dispersed in the whole or a part of the layer containing the host compound. The light emission layer may contain another compound, for example, another organic compound or complex emitting fluorescence or phosphorescence, or a compound having another function. The light emission layer may contain a polymer such as polyphenylene vinylene or polyfluorene, or a polymer material in which the dopant compound as described above is incorporated in the main or side chain of the polymer material.

Considering application of the organic EL element to an illuminator in the panel form or another form employing characteristics in that it is thin and can be provided on a resin substrate, it is practically useful to produce a white light emitting element. At present, as a single compound emitting white light has not been found, white light is obtained mixing plural color lights, which are emitted from plural emission compounds. The mixing of the plural color lights may be that of the wavelength providing emission maximum of each of three primary colors (blue, green, and red) or that of the wavelength providing emission maximum of each of complementary colors such as blue and yellow colors, or blue green and orange colors. This mixed color light emission can be carried out employing the dopant as described above, and may be carried out varying kinds or amount of the dopant contained in one light emission layer. Where there are plural light emission layers, the mixed color light emission can be carried out varying kinds or amount of the dopant contained in each of the light emission layers to emit different light form each of the light emission layers, whereby color of the emitted light can be controlled.

In the invention, an electron transporting material (hereinafter also referred to as electron transporting material in the invention) having a phosphorescence 0-0 band of not more than 450 nm is used in the component layer. Herein, the electron transporting material having a phosphorescence 0-0 band of not more than 450 nm refers to an electron transporting material which emits phosphorescence at 77 k but does not at room temperature.

Exemplified compounds of the electron transporting material in the invention will be listed below, but the present invention is no limited thereto.

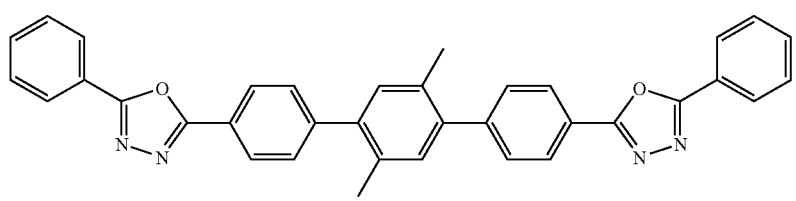

A1-1

-continued
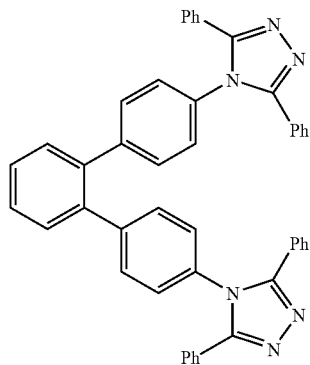
A1-2
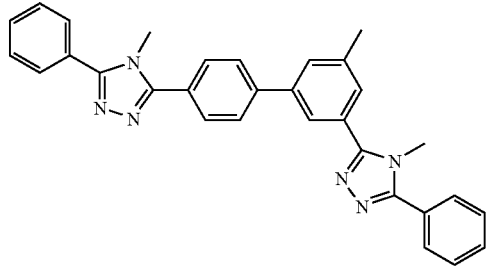
A1-3
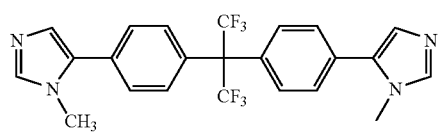
A1-4
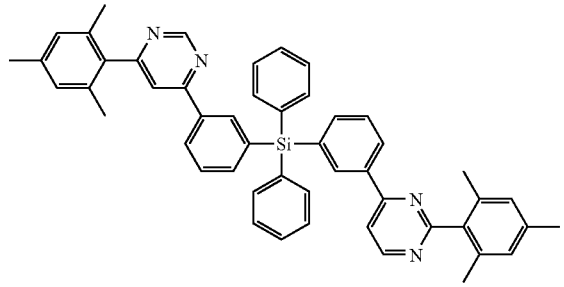
A1-5
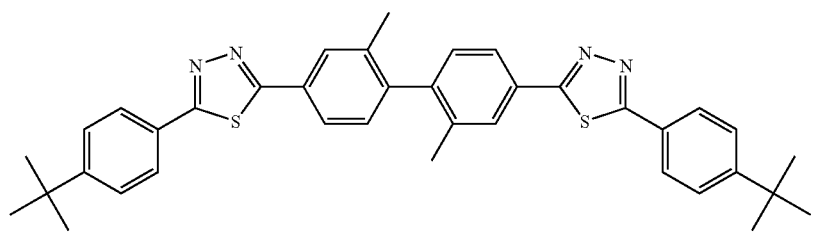
A1-6
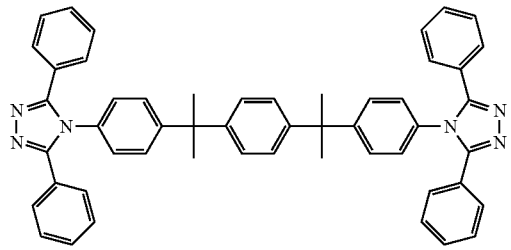
A1-7
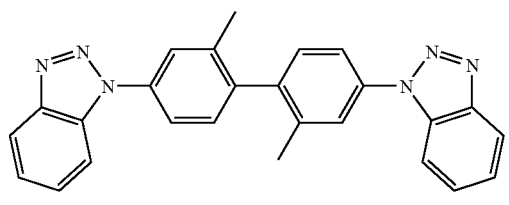
A2-1
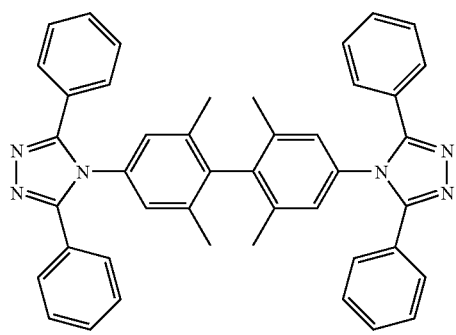
A2-2
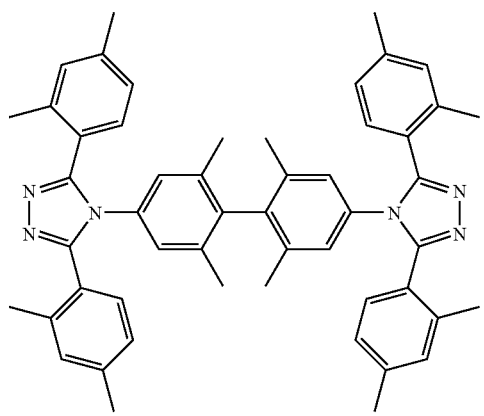
A2-3

-continued
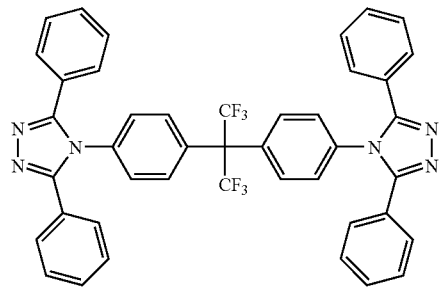
A3-1
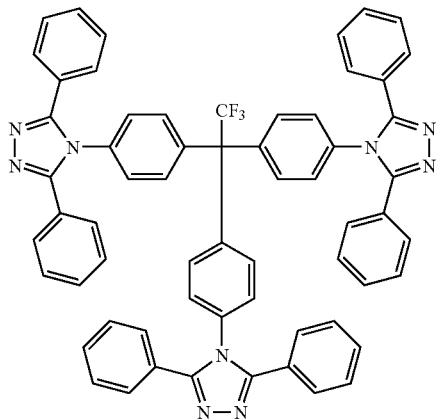
A3-2
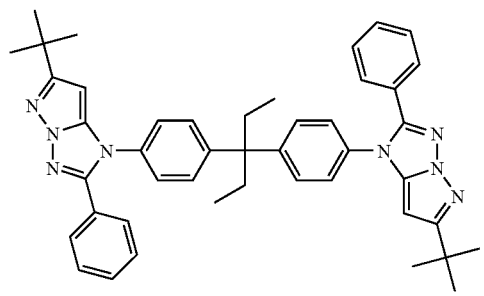
A3-3
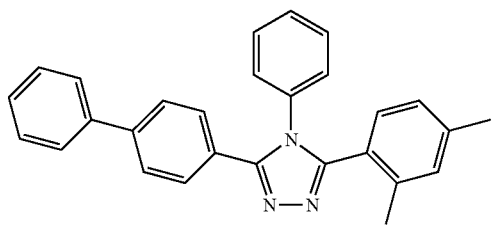
B1-1
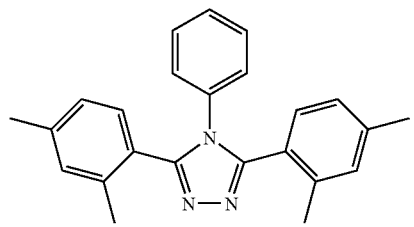
B1-2
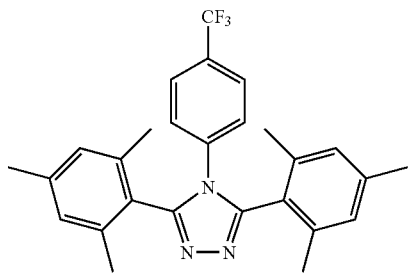
B1-3
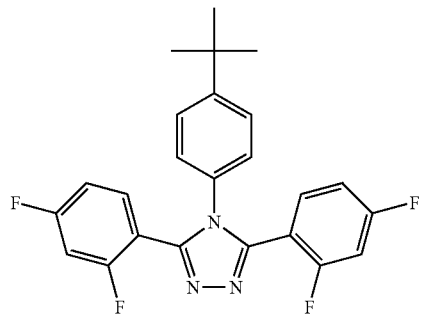
B1-4
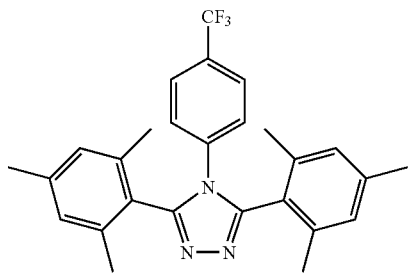
C1-1

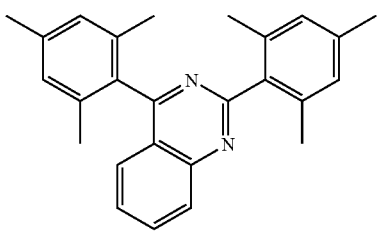 C1-2

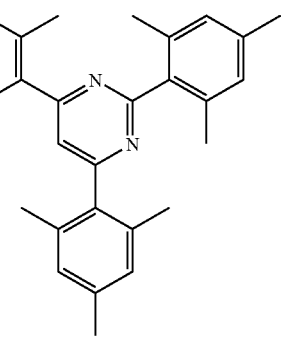 C1-3

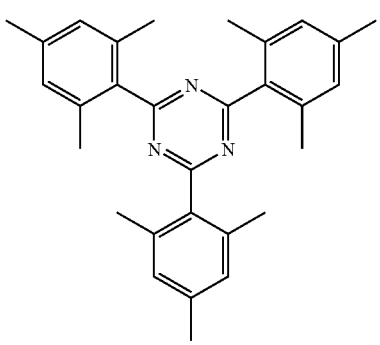 D1-1

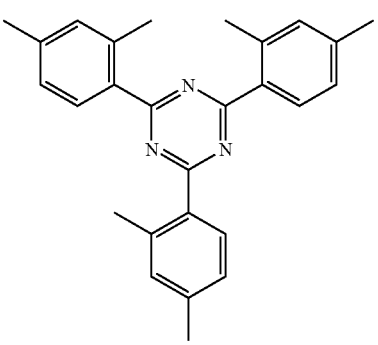 D1-2

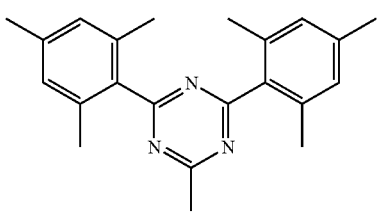 D1-3

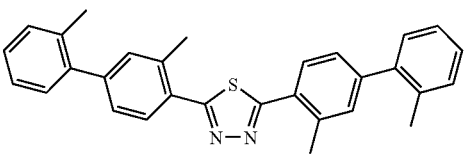 E1-1

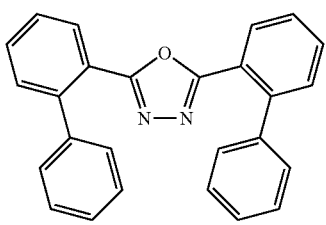 E1-2

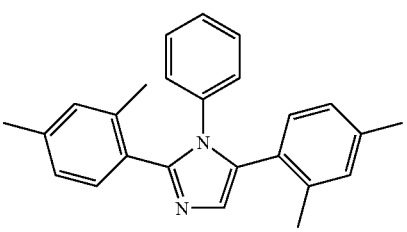 F1-1

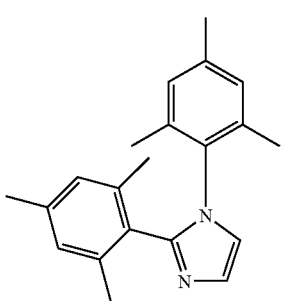 F1-2

A polymer in which the material mentioned above is introduced in the polymer chain or a polymer having the material as the polymer main chain can be also used.

Another compound known as an electron transporting material can be used in combination. The electron transporting material in the invention is preferably contained in an electron transporting layer. In addition to the electron transporting layer containing the electron transporting material in the invention, an electron transporting layer containing another electron transporting material used in the known electron transporting layer can be provided.

The electron transporting layer can be formed by layering the electron transporting material by a known method such as a vacuum deposition method, a spin coat method, a casting method, an ink jet method, an LB method, a transfer method and a printing method. The thickness of the electron transporting layer is not specifically limited, but is ordinarily from 5 to 5000 nm. The electron transporting layer may be composed of a single layer structure comprising one or two or more of the materials mentioned above.

In the organic electroluminescent element of this embodiment, materials used in the light emission layer, the anode and cathode, or materials used in the hole injecting layer, the hole transporting layer, the hole blocking layer, the electron transporting layer, the electron injecting layer, which are optionally provided, are the same as those denoted above. Further, the anode, cathode, light emission layer, hole injecting layer, hole transporting layer, hole blocking layer, electron transporting layer, or electron injecting layer can be formed according to the method as described above. The substrate in the organic electroluminescent element of the invention is as described above.

A third embodiment of the organic electroluminescent element of the invention is an organic electroluminescent element comprising a component layer including a light emission layer, wherein the component layer contains a hole transporting material having a phosphorescence 0-0 band of not more than 480 nm, and the light emission layer contains a phosphorescent compound and a compound represented by formula A above. The organic electroluminescent element preferably emits a white light.

In the invention, a hole transporting material (hereinafter also referred to as hole transporting material in the invention) having a phosphorescence 0-0 band of not more than 480 nm is used in the component layer. Herein, the hole transporting material having a phosphorescence 0-0 band of not more than 480 nm refers to an electron transporting material which emits phosphorescence at 77 k but does not at room temperature. The hole transporting material in the invention is preferably an aromatic amine having a phosphorescence 0-0 band of not more than 480 nm, and more preferably an aromatic tertiary amine having a phosphorescence 0-0 band of not more than 480 nm.

Exemplified compounds of the hole transporting material in the invention will be listed below, but the present invention is not limited thereto.

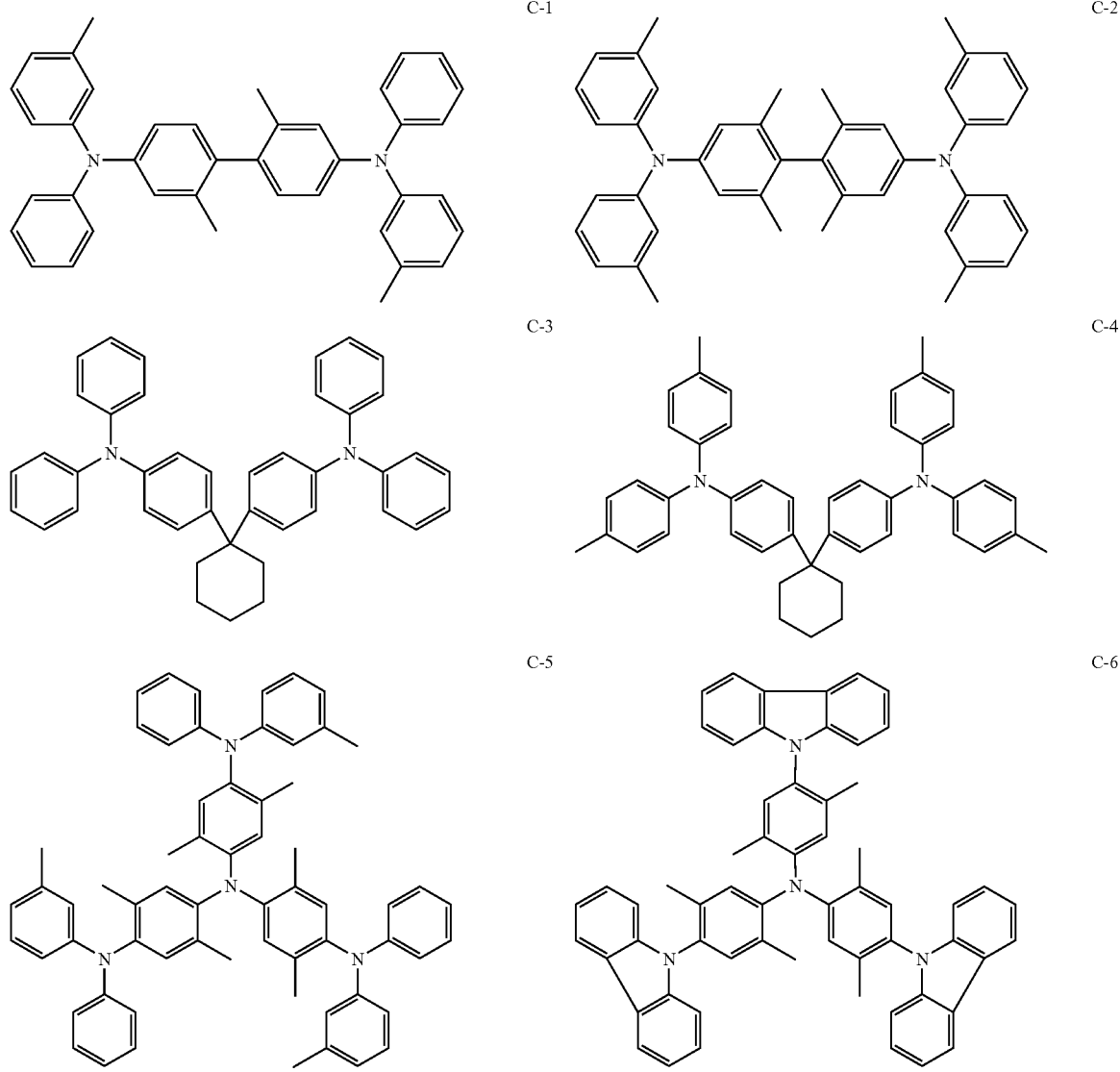

-continued
C-7
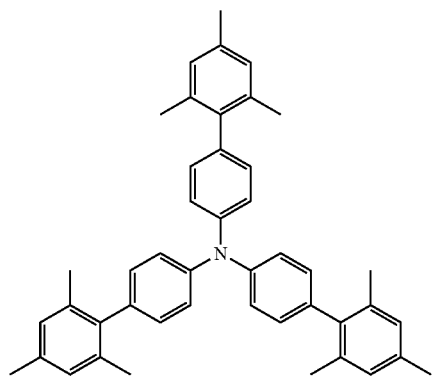
C-8
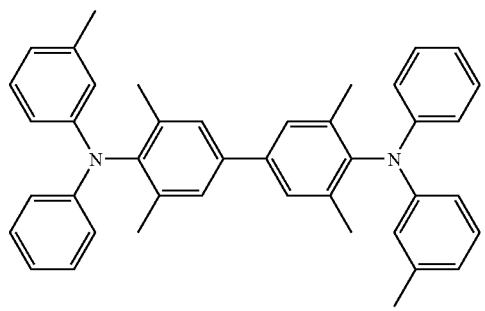
C-9
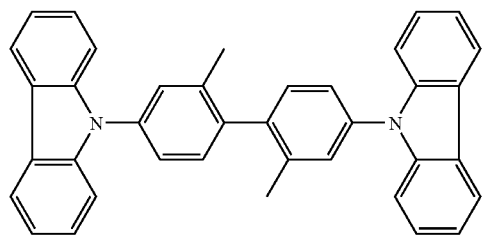
C-10
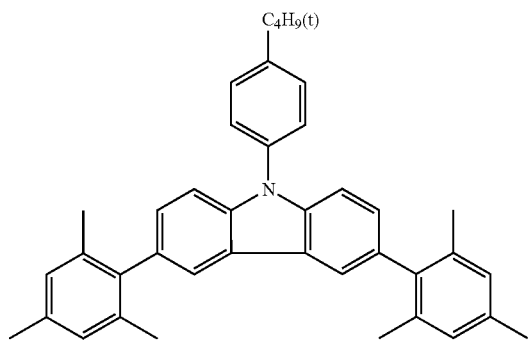
C-11
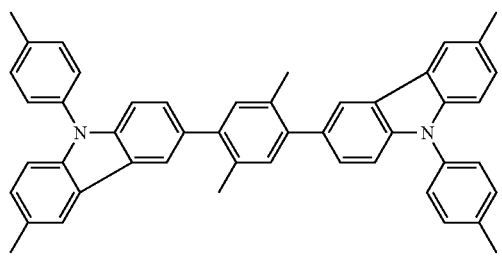
C-12
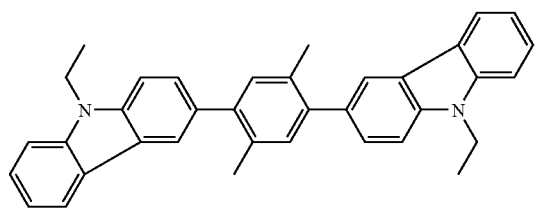
C-13
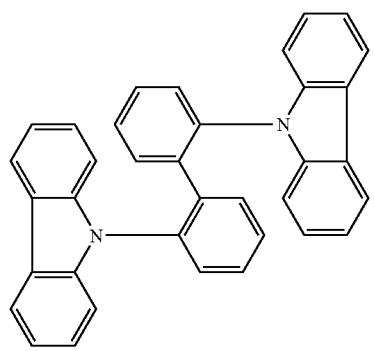
C-14
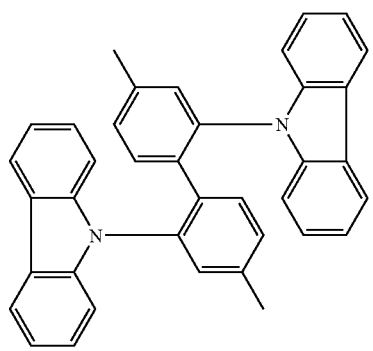

-continued
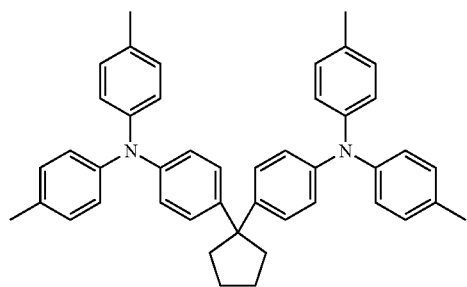
C-15
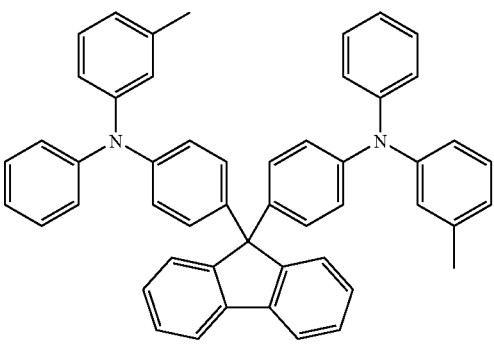
C-16
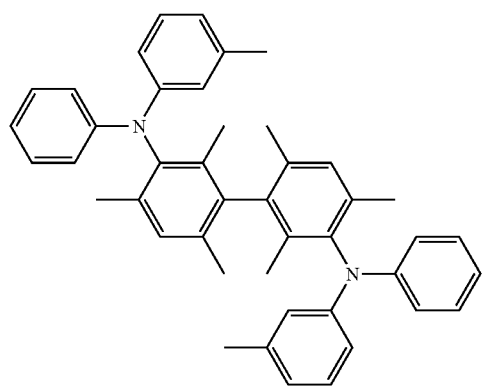
C-17
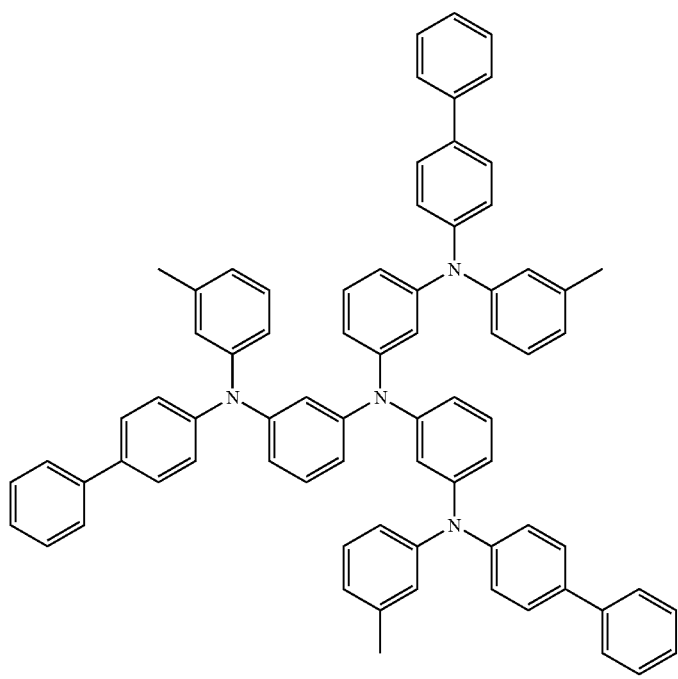
C-18

-continued

C-19
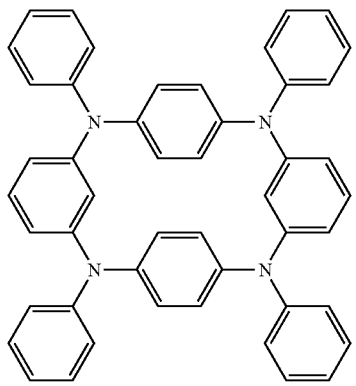

C-20
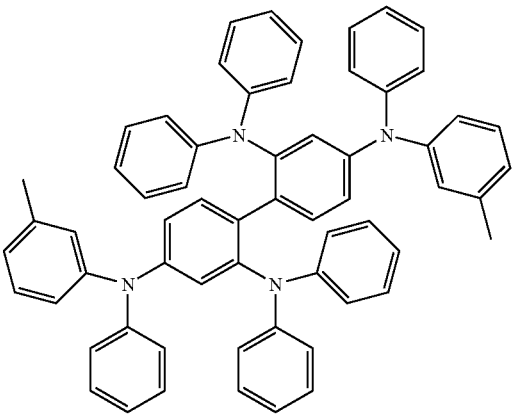

C-21
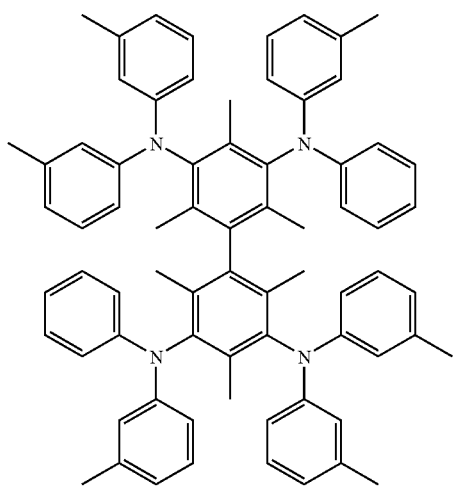

C-22
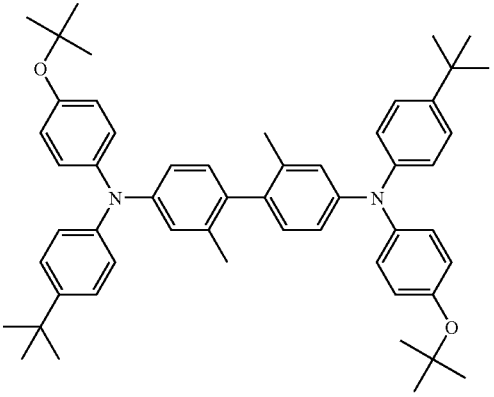

C-23
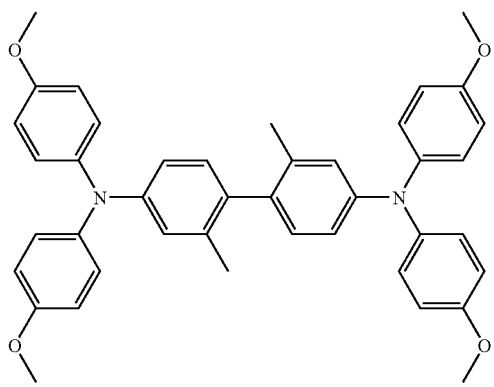

In this embodiment, another compound known as a hole transporting material as described above can be used in combination.

The hole transporting material in the invention is preferably contained in a hole transporting layer. In addition to the hole transporting layer containing the hole transporting material in the invention, a hole transporting layer containing another hole transporting material used in the known hole transporting layer can be provided.

The hole transporting layer can be formed by layering the hole transporting material by a known method such as a vacuum deposition method, a spin coat method, a casting method, an ink jet method, an LB method, a transfer method and a printing method. The thickness of the hole transporting layer is not specifically limited, but is ordinarily from 5 to 5000 nm. The hole transporting layer may be composed of a single layer structure comprising one or two or more of the materials mentioned above.

In the organic electroluminescent element of this embodiment, materials used in the light emission layer, the anode and cathode, or materials used in the hole injecting layer, the hole transporting layer, the hole blocking layer, the electron transporting layer, the electron injecting layer, which are optionally provided, are the same as those denoted above. Further, the anode, cathode, light emission layer, hole injecting layer, hole transporting layer, hole blocking layer, electron transporting layer, or electron injecting layer can be formed according to the method as described above. The substrate in the organic electroluminescent element of the invention is as described above.

A fourth embodiment of the organic electroluminescent element of the invention comprises a light emission layer containing a compound represented by formula A and a phosphorescent compound having a phosphorescence 0-0 band of not more than 480 nm. When the light emission layer contains two or more kinds of compounds as in this embodiment, a main compound constituting the light emission layer is called a host compound or simply a host, and another compound a dopant compound or simply a dopant. In an organic electroluminescent element emitting phosphorescence, energy is transferred from the host compound to a phosphorescent dopant, and light is emitted from the phosphorescent dopant, resulting in phosphorescence. It is preferred in the invention that the compound represented by formula A is a host and the phosphorescent compound is a dopant. The dopant used may be one kind or two or more kinds thereof. When there are plural light emission layers, the dopant contained in each of the light emission layers may be the same or different. Herein, the phosphorescent compound refers a phosphorescent compound emitting phosphorescence at room temperature. The phosphorescent compound has a phosphorescence quantum yield at 25° C. of preferably not less than 0.01, and more preferably not less than 0.1, measured according to the method described above.

The phosphorescent compound having a phosphorescence 0-0 band of not more than 480 nm is any compound as long as it has a phosphorescence 0-0 band of not more than 480 nm and its excited triplet state excited at room temperature (of from 15 to 30° C.) is stable. The light emission layer containing such a compound as a dopant realizes a high internal quantum yield. Examples of the phosphorescent compound include compounds described in Y. Wang et al., "Appl. Phys. Lett., Vol. 79 (4), p. 449-451 (2001) and C. Adachi et al., "Appl. Phys. Lett., Vol. 79 (4), p. 2082-2084 (2001). The phosphorescent compound is preferably a complex containing iridium, osmium, rhodium or platinum as a center metal and an organic ligand, and more preferably an iridium or rhodium complex.

The organic ligand of the complex is selected so that the complex provides a phosphorescence 0-0 band of not more than 480 nm. As a method for obtaining such a complex, there is a method in which an electron withdrawing group such as a fluorine atom or a trifluoromethyl group is incorporated in the complex, a bulky substituent is incorporated in the complex to give a twisted structure or an alkylene group is incorporated between the aromatic ring ligands as a linkage group.

Exemplified compounds of the phosphorescent compound having a phosphorescence 0-0 band of not more than 480 nm include D-1, D-2, D-3, D-4, D-5, D-6, Ir-10, Ir-11, and Ir-12 described above, but the invention is not limited thereto.

The phosphorescence 0-0 band of D-4, D-5 and D-6 is 465 nm, 465 nm and 462 nm, respectively, which were measured according to the measuring method of a phosphorescence 0-0 band in the invention described above.

In the organic electroluminescent element of this embodiment, materials used in the light emission layer, the anode and cathode, or materials used in the hole injecting layer, the hole transporting layer, the hole blocking layer, the electron transporting layer, the electron injecting layer, which are optionally provided, are the same as those denoted above. Further, the anode, cathode, light emission layer, hole injecting layer, hole transporting layer, hole blocking layer, electron transporting layer, or electron injecting layer can be formed according to the method as described above. The substrate in the organic electroluminescent element of the invention is as described above.

The external emission efficiency of the organic electroluminescence element of the invention is preferably not less than 1%, and more preferably not less than 2% at room temperature. Herein, external quantum yield (%) is represented by the following formula:

External quantum yield (%)=(the number of photons emitted to the exterior of the organic electroluminescence element×100)/(the number of electrons supplied to the organic electroluminescence element)

A hue improving filter such as a color filter may be used in combination. The multicolor light emission apparatus of the invention comprises at least two organic EL elements each having a different maximum emission wavelength. Next, preferable examples in the preparation of the organic EL element will be explained.

<<Preparation of Organic EL Element>>

For one example, the preparation of the organic EL element, which has the constitution, Anode/Hole injecting layer/Hole transporting layer/Light emission layer/Electron transporting layer/Electron injecting layer/Cathode, will be described. A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emission layer, the electron transporting layer and the electron injecting layer, which constitute the element, are formed on the resulting anode in that order as organic compound thin layers.

As methods for formation of the thin layers, there are a spin coating method, a casting method, an ink jet method, a vacuum deposition method, and a printing method, however, a spin coating method and a vacuum deposition method are preferably used, since a uniform layer can be formed and a pinhole is formed with difficulty. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 μm.

After these layers has been formed, a thin layer comprised of a material for a cathode is formed thereon to prepare a cathode, employing, for example, a deposition method or sputtering method to give a thickness of not more than 1 μm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum a different layer formation method may be inserted. When the different method is used, its process is required to be carried out under a dry inert gas atmosphere.

In the multicolor display of the invention, the light emission layer only is formed using a shadow mask, and other layers than the light emission layer may be common, and can be formed employing a vacuum method, a casting method, a spin coat method or a printing method in which patterning employing the shadow mask is not required.

When the light emission layer only is formed by patterning, the layer formation method, although not specifically limited, is carried out preferably according to a deposition method, an ink jet method or a printing method. When a deposition method is used as the layer formation method, patterning of the layer is preferably carried out employing a shadow mask.

Further, the organic EL element can be prepared in the reverse order, in which the cathode, the electron injecting layer, the electron transporting layer, the light emission layer, the hole transporting layer, the hole injecting layer, and the anode are formed in that order.

When a direct current voltage, a voltage of 2 to 40 V is applied to the thus obtained multicolor display, setting the anode as a +polarity and the cathode as a −polarity, light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The multicolor display of the invention can be used as a display device, a display, or various light emission sources. The display device or the display, which employs three kinds of organic EL elements, an element emitting a blue light, an element emitting a red light and an element emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

Examples of the light emission sources include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL element of the invention may be an organic EL element having a resonator structure.

The organic EL element having a resonator structure is applied to a light source for a photo-memory medium, a light source for an electrophotographic copier, a light source for an optical communication instrument, or a light source for a photo-sensor, but its application is not limited thereto. In the above application, a laser oscillation may be carried out.

<<Display>>

The organic EL element of the invention can be used as a lamp such as an illuminating lamp or a light source for exposure, as a projection device for projecting an image, or as a display for directly viewing a still image or a moving image display device (a display) or a light emission source. When the element is used in a display for reproducing a moving image, the driving method may be either a simple matrix (passive matrix) method or an active matrix method. The display can present a full color image, employing two or more kinds of organic EL elements each emitting light with a different color.

PRACTICAL EMBODIMENT OF THE INVENTION

One example of the display comprising the organic EL element of the invention will be explained below employing Figures.

FIG. 1 is a schematic drawing of one example of a display comprising an organic EL element. FIG. 1 is a display such as that of a cellular phone, displaying image information due to light emission from the organic EL.

A display 1 comprises a display section A having plural pixels and a control section B carrying out image scanning based on image information to display an image in the display section A. The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
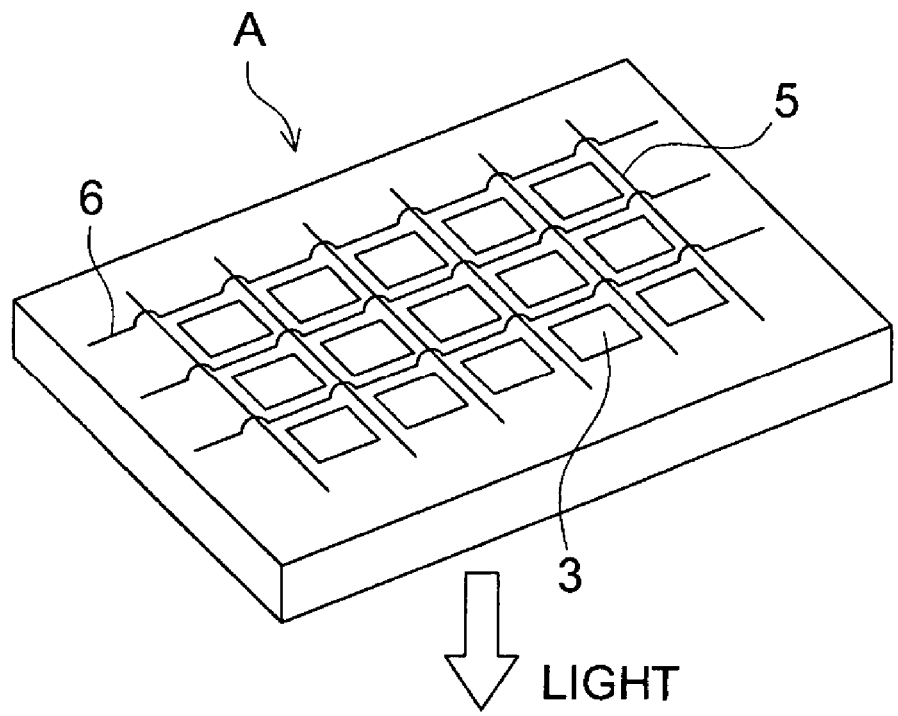
FIG. 2 is a schematic drawing of a display section A.

FIG. 2 is a schematic drawing of a display section A. The display section A comprises a glass substrate, plural pixels 3, and a wiring section comprising plural scanning lines 5 and plural data lines 6. The main members of the display section A will be explained below.

In FIG. 2, light from pixels 3 is emitted in the direction of an arrow. The plural scanning lines 5 and plural data lines 6 each are composed of an electroconductive material, the lines 5 and the lines 6 being crossed with each other at a right angle, and connected with the pixels 3 at the crossed points (not illustrated). The plural pixels 3, when the scanning signal is applied from the scanning lines 5, receive the data signal from the data lines 6, and emit light corresponding to the image data received. Provision of red light emission pixels, green light emission pixels, and blue light emission pixels side by side on the same substrate can display a full color image.

Next, an emission process of pixels will be explained.

Figure 3:
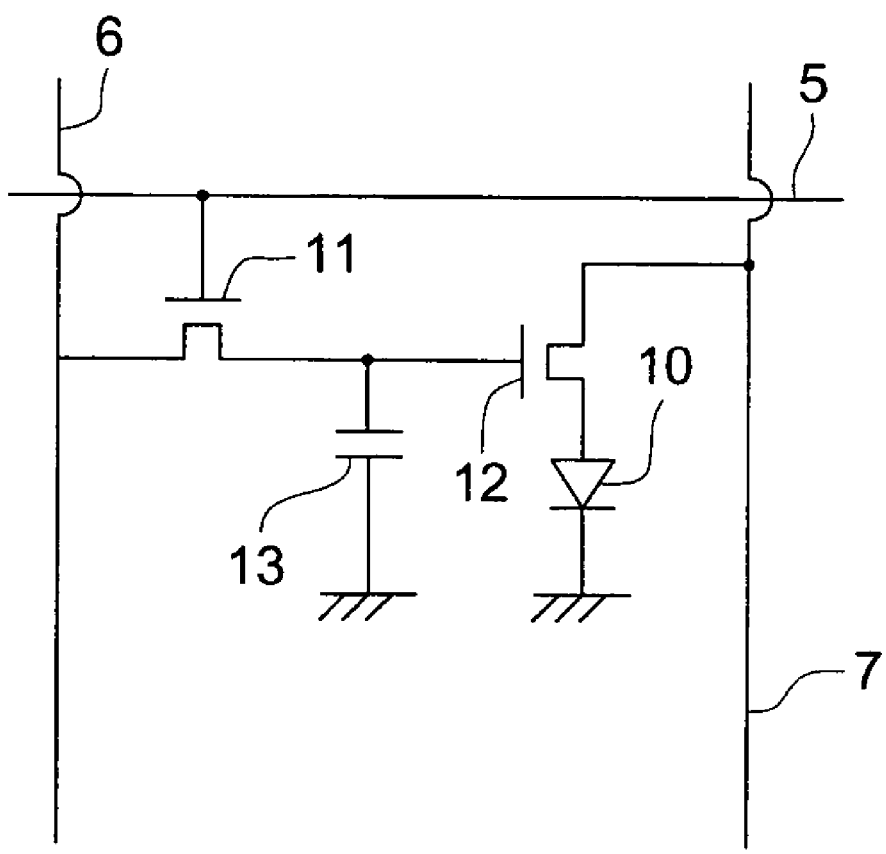
FIG. 3 is a schematic drawing of a pixel.

FIG. 3 is a schematic drawing of a pixel. The pixel comprises an organic EL element 10, a switching transistor 11, a driving transistor 12, and a capacitor 13. When a pixel with a red light emission organic EL element, a pixel with a green light emission organic EL element, and a pixel with a blue light emission organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is on, since the capacitor 13 maintains a charged potential of image data signal, and light emission from the organic EL element 10 continues until the next scanning signal is applied.

When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, and emission due to on-off according to a binary value of the image data signals.

The electric potential of the capacitor 13 may maintain till the next application of the scanning signal, or may be discharged immediately before the next scanning signal is applied.

In the invention, light emission may be carried out employing a passive matrix method as well as the active matrix method as described above. The passive matrix method is one in which light is emitted from the organic EL element according to the data signal only when the scanning signals are scanned.

Figure 4:
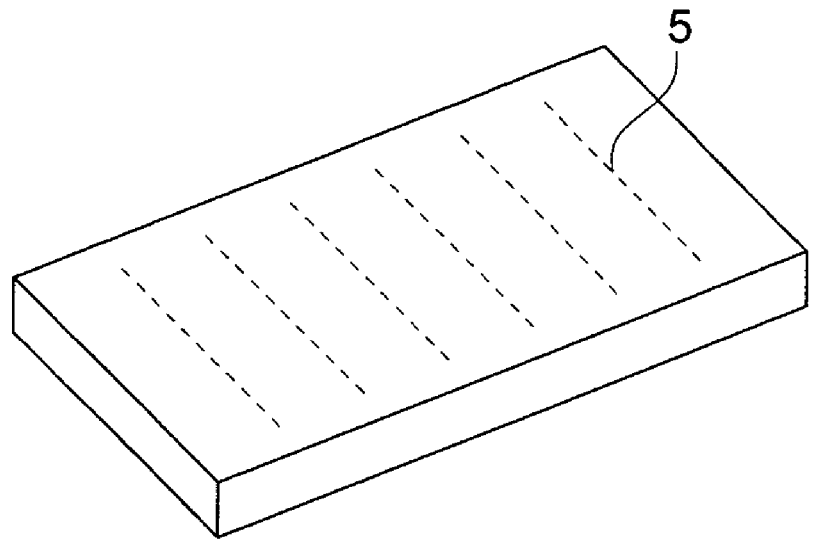
FIG. 4 is a schematic drawing of a display employing a passive matrix method.
Figure 4:
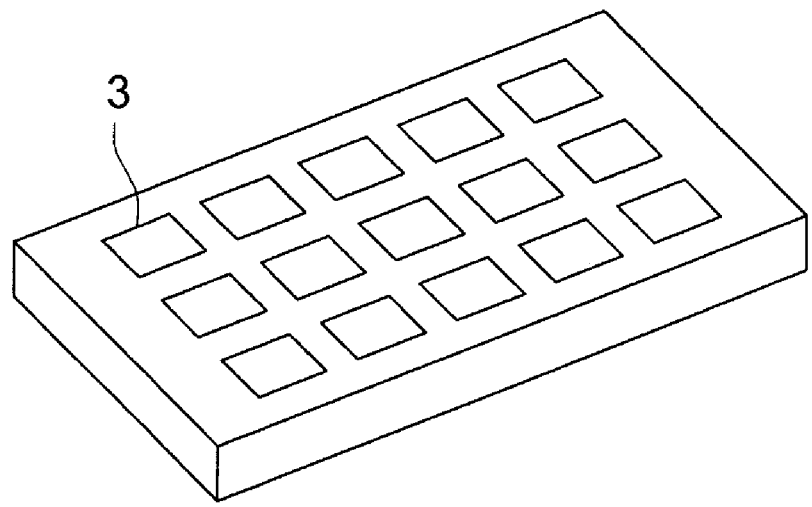
Figure 4:
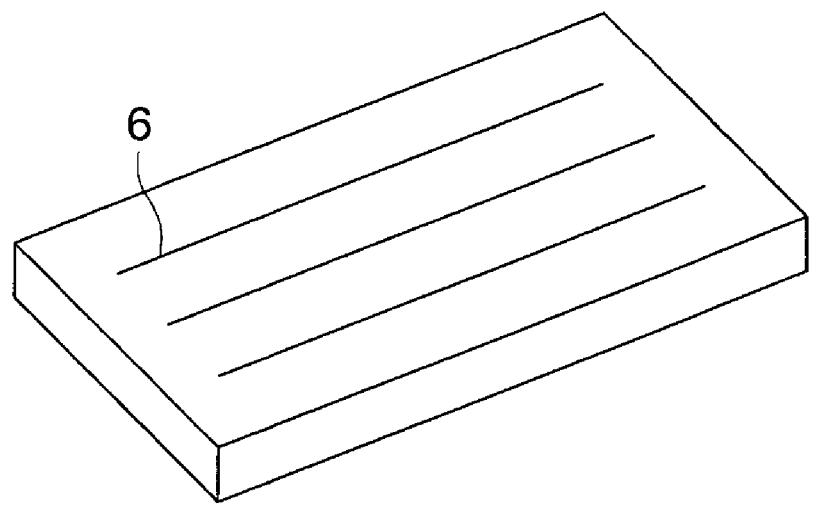

FIG. 4 is a schematic drawing of a display employing a passive matrix method.

In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

The present invention will be explained in the following examples, but is not limited thereto.

Example 1

<<Preparation of Organic EL Element Sample OLED 1-1; Comparative>>

A pattern was formed on a substrate (NA-45, manufactured by NH Technoglass Co., Ltd.) composed of a glass plate and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes.

The thus obtained transparent substrate was fixed on a substrate holder of a vacuum deposition apparatus available on the market. Further, α-NPD, CBP, Ir-12, BCP and $Alq_3$ were put in each of five resistive heating molybdenum boats, and set in the vacuum deposition apparatus.

Thereafter, pressure in the vacuum tank was reduced to $4 \times 10^{-4}$ Pa, and α-NPD was deposited onto the transparent substrate to form a hole injecting/transporting layer with a thickness of 50 nm. After that, supplying electric current to the boat carrying CBP and the boat carrying Ir-12, individually, in which the depositing speed rate of CBP to Ir-12 was adjusted to be 100:7, CBP to Ir-12 were co-deposited onto the resulting hole transporting layer to form a light emission layer with a thickness of 30 nm. Subsequently, BCP was deposited onto the resulting light emission layer to form a hole blocking layer with a thickness of 10 nm, and then, $Alq_3$ was deposited onto the resulting layer to form an electron transporting layer with a thickness of 40 nm.

Next, the vacuum tank was opened, and a stainless steel mask having a rectangular hole was placed on the electron injecting layer. Further, 3 g of magnesium were put in a resistive heating molybdenum boat and 0.5 g of silver were put in a tungsten basket for deposition. The resulting boat and basket were set in the vacuum tank. Pressure in the vacuum tank was reduced to $2 \times 10^{-4}$ Pa. Then, the boat carrying magnesium was heated by supplying an electric current so as to deposit magnesium at a deposition speed of from 1.5 to 2.0 nm/sec, and at this time, the basket carrying silver was simultaneously heated so as to deposit silver at a deposition speed of 0.1 nm/sec to form a cathode electrode (200 nm) composed of a mixture of magnesium and silver. Thus, a comparative organic EL element sample OLED 1-1 was prepared.

<<Preparation of Organic EL Element Samples OLED 1-2 Through 1-33>>

Organic EL element samples OLED 1-2 through 1-33 were prepared in the same manner as comparative organic EL element sample OLED 1-1, except that CBP used in the light emission layer was replaced with those (comparative compounds 1 through 10 or Exemplified compounds in the invention) as shown in Table 1.

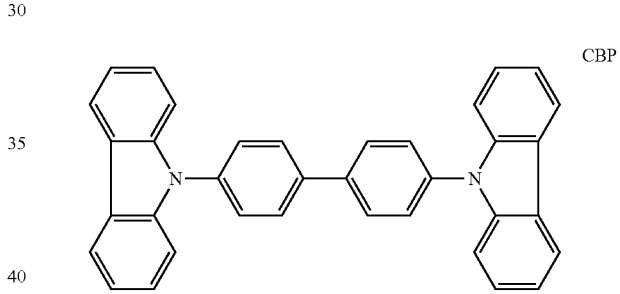

CBP

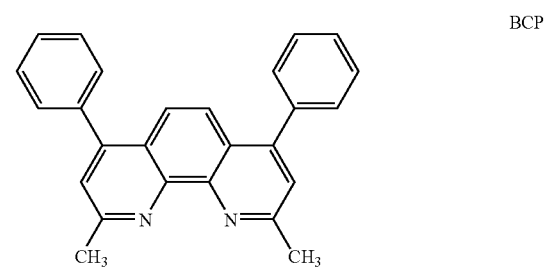

BCP

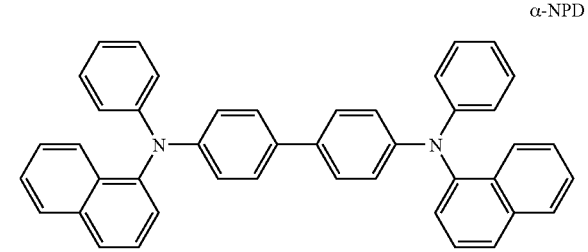

α-NPD

-continued
ALq3
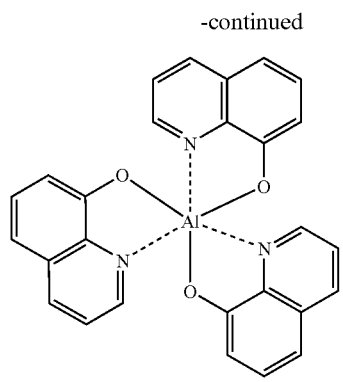
Comparative compound 1
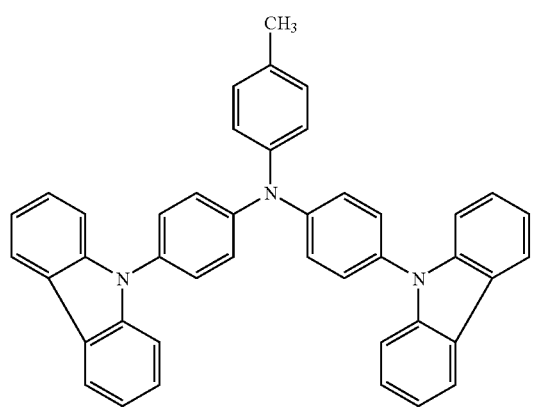
Comparative compound 2
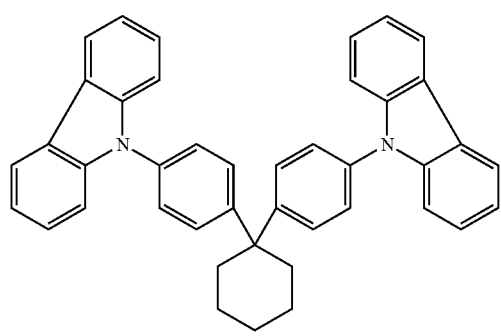
Comparative compound 3
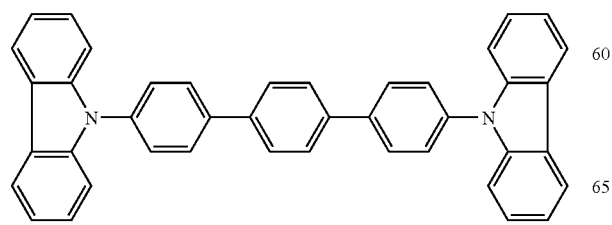
-continued
Comparative compound 4
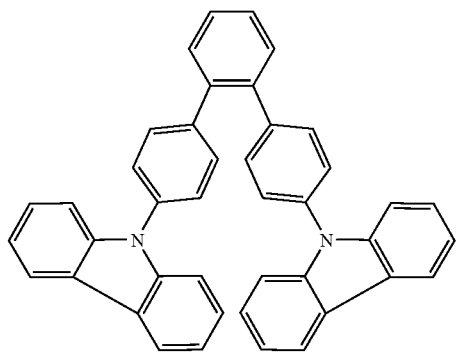
Comparative compound 5
Comparative compound 6
Comparative compound 7
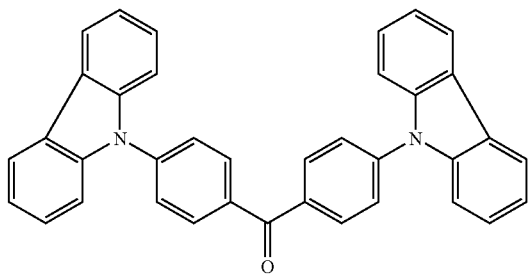

-continued

Comparative compound 8

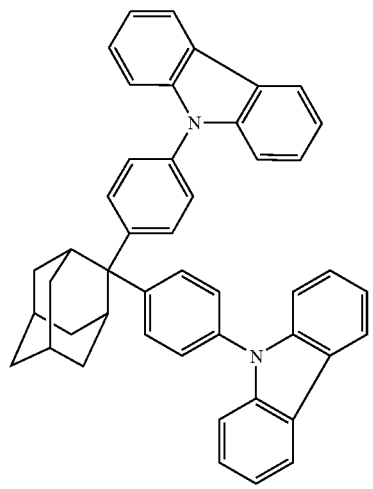

Comparative compound 9

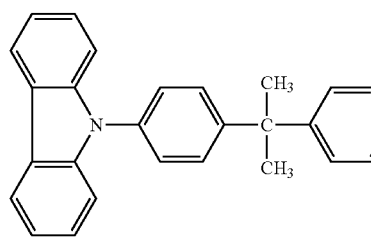

Comparative compound 10

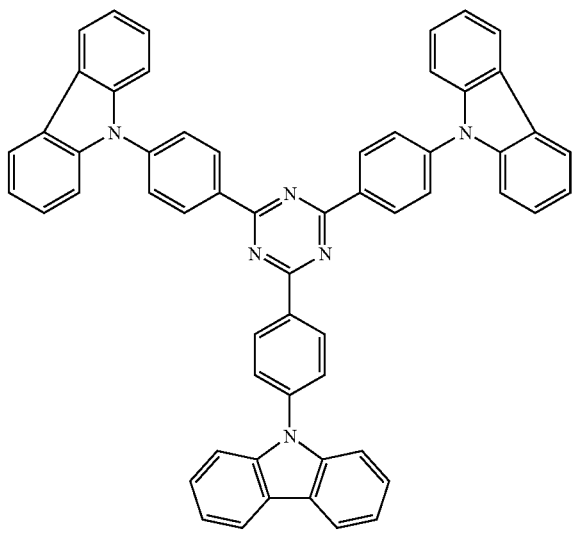

<<Evaluation of Organic EL Element Samples>>

The resulting organic EL element samples OLED 1-1 through 1-33 were evaluated as follows:

(Emission Luminance, Time when the Initial Emission Luminance Reduced by Half)

When a current of 2.5 mA/cm$^2$ was supplied to each sample at 23° C. in an atmosphere of a dry nitrogen gas, emission luminance L (cd/m$^2$) of light emitted and time (τ) when the initial emission luminance after emission reduces by half (hereinafter also referred to as half life) were measured according to CS-1000 produced by Minolta Co., Ltd.

Emission luminance and half life of the organic EL element samples OLED 1-2 through 1-33 were expressed by a relative value when the emission luminance and half life of comparative organic EL element sample OLED 1-1 were set at 100, respectively. The results are shown in Table 1.

TABLE 1

| Sample OLED No. | Compound used in light emission layer | Emission luminance | Half life | Remarks |
|---|---|---|---|---|
| 1-1 | CBP | 100 | 100 | Comp. |
| 1-2 | Comparative compound 1 | 98 | 105 | Comp. |
| 1-3 | Comparative compound 2 | 90 | 113 | Comp. |
| 1-4 | Comparative compound 3 | 102 | 109 | Comp. |
| 1-5 | Comparative compound 4 | 110 | 60 | Comp. |
| 1-6 | Comparative compound 5 | 86 | 101 | Comp. |
| 1-7 | Comparative compound 6 | 82 | 93 | Comp. |
| 1-8 | Comparative compound 7 | 77 | 74 | Comp. |
| 1-9 | Comparative compound 8 | 106 | 110 | Comp. |
| 1-10 | 1-2 | 175 | 212 | Inv. |
| 1-11 | 1-6 | 177 | 205 | Inv. |
| 1-12 | 1-7 | 190 | 170 | Inv. |
| 1-13 | 2-1 | 168 | 176 | Inv. |
| 1-14 | 2-6 | 170 | 208 | Inv. |
| 1-15 | 3-1 | 160 | 170 | Inv. |
| 1-16 | 3-3 | 172 | 183 | Inv. |
| 1-17 | 4-1 | 188 | 233 | Inv. |
| 1-18 | 4-4 | 195 | 215 | Inv. |
| 1-19 | 4-11 | 185 | 210 | Inv. |
| 1-20 | 5-2 | 170 | 172 | Inv. |
| 1-21 | Comparative compound 9 | 105 | 96 | Comp. |
| 1-22 | Comparative compound 10 | 101 | 103 | Comp. |
| 1-23 | HA-1 | 185 | 231 | Inv. |
| 1-24 | HA-3 | 189 | 234 | Inv. |
| 1-25 | HA-5 | 180 | 245 | Inv. |
| 1-26 | IA-1 | 178 | 225 | Inv. |
| 1-27 | IA-11 | 172 | 202 | Inv. |
| 1-28 | IA-13 | 178 | 198 | Inv. |
| 1-29 | JA-2 | 188 | 210 | Inv. |
| 1-30 | JA-8 | 170 | 195 | Inv. |
| 1-31 | 2-2 | 170 | 230 | Inv. |
| 1-32 | 4-12 | 180 | 235 | Inv. |
| 1-33 | 4-13 | 178 | 222 | Inv. |

Comp.: Comparative, Inv.: Inventive

As is apparent from Table 1, inventive organic EL element samples OLED 1-10 through 1-20, and 1-23 through 1-33 comprising the compound in the invention provide high emission luminance and long half life as compared with comparative organic EL element samples OLED 1-1 through 1-9, 1-21 and 1-22.

Organic EL element samples OLED 1-10G through 1-20G, and 1-23G through 1-33G were prepared in the same manner as in Organic EL element samples OLED 1-10 through 1-20, and 1-23 through 1-33, respectively, except that Ir-1 was used instead of Ir-12, and the resulting samples exhibited the same results as above. Further, organic EL element samples OLED 1-10 R through 1-20R, and 1-23 R through 1-33 R were prepared in the same manner as in organic EL element samples OLED 1-10 through 1-20, and 1-23 through 1-33, respectively, except that Ir-9 was used instead of Ir-12, and the resulting samples exhibited the same results as above. Green light was emitted from organic EL elements employing Ir-1, and red light was emitted from organic EL elements employing Ir-9.

A voltage necessary to emit light with a luminance of 50 cd/cm$^2$ was measured with respect to organic EL element samples OLED 1-4, 1-10, 1-11, and 1-12. Voltages of organic EL element samples OLED 1-10, 1-11, and 1-12 were expressed by a relative value when the voltage of organic EL element sample OLED 1-4 was set at 0 V. The voltage was −1.0 V in sample OLED 1-10, −0.7 V in sample OLED 1-11, and −0.6 V in sample OLED 1-12. It has been confirmed that these samples can be driven by a lower voltage as compared with sample employing a compound having an unsubstituted phenylene group as a host of the light emission layer.

Example 2

<<Preparation of Organic EL Element Samples OLED 2-1 Through 2-12>>

Organic EL element samples OLED 2-1 through 2-12 were prepared in the same manner as comparative organic EL element sample OLED 1-1, except that the host compound used in the light emission layer and the compound used in the hole blocking layer were replaced with those as shown in Table 2, respectively.

The resulting samples were evaluated for emission luminance, and half life in the same manner as in Example 1. The results are shown in Table 2.

In Table 2, emission luminance and half life of the organic EL element samples OLED 2-2 through 2-12 are expressed by a relative value when the emission luminance and half life of organic EL element sample OLED 2-1 were set at 100, respectively.

TABLE 2

| Sample OLED No. | Compound used in light emission layer | Compound used in hole blocking layer | Emission luminance (%) | Half life (%) | Remarks |
|---|---|---|---|---|---|
| 2-1 | CBP | BCP | 100 | 100 | Comp. |
| 2-2 | CBP | Compound A1 | 107 | 115 | Comp. |
| 2-3 | 1-2 | BCP | 177 | 215 | Inv. |
| 2-4 | 1-2 | Compound A1 | 142 | 168 | Inv. |
| 2-5 | 1-2 | TAZ | 155 | 215 | Inv. |
| 2-6 | 1-2 | OXD7 | 151 | 201 | Inv. |
| 2-7 | 1-2 | DPVBi | 147 | 244 | Inv. |
| 2-8 | 1-2 | B1 | 148 | 240 | Inv. |
| 2-9 | 1-6 | B2 | 152 | 223 | Inv. |
| 2-10 | 1-7 | B2 | 159 | 210 | Inv. |
| 2-11 | 4-4 | B2 | 162 | 230 | Inv. |
| 2-12 | 4-11 | B2 | 160 | 230 | Inv. |

Comp.: Comparative,
Inv.: Inventive

Compound A1

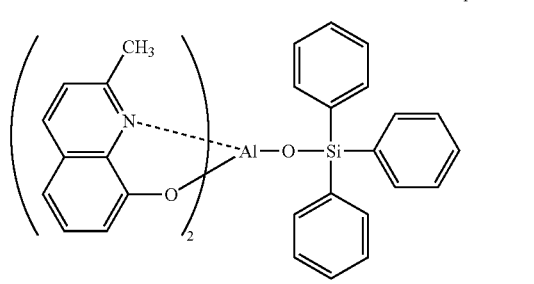

As is apparent from Table 2, inventive organic EL element samples OLED 2-3 through 2-12 employing the compound in the invention provide high emission luminance and long luminance half life as compared with comparative organic EL element samples OLED 2-1 and 2-2 employing the comparative compound.

Organic EL element samples employing the compound in the invention other than the above exhibited the same results as above. In these samples, samples employing TAZ, OXD7, DPVBi, B1 or B2 in the hole blocking layer exhibited higher emission luminance and longer life time as compared to those employing BCP or Compound A1 in the hole blocking layer.

Example 3

<<Preparation of Organic EL Element Samples OLED 3-1 Through 3-28>>

Organic EL element samples OLED 3-1 through 3-28 were prepared in the same manner as comparative organic EL element sample OLED 1-1, except that the host compound used in the light emission layer and the compound used in the hole blocking layer were replaced with those as shown in Table 3, respectively.

The resulting samples OLED 3-1 through 3-28 were evaluated for emission luminance, and half life in the same manner as in Example 1. The results are shown in Table 3.

In Table 3, emission luminance and half life are expressed by a relative value when the emission luminance and luminance half life of organic EL element sample OLED 3-1 were set at 100, respectively.

TABLE 3

| Sample OLED No. | Compound used in light emission layer | Compound used in hole blocking layer | Emission luminance (%) | Half life (%) | Remarks |
|---|---|---|---|---|---|
| 3-1 | Comparative compound 1 | Compound A1 | 100 | 100 | Comp. |
| 3-2 | Comparative compound 2 | Compound A1 | 94 | 112 | Comp. |
| 3-3 | Comparative compound 3 | Compound A1 | 104 | 111 | Comp. |
| 3-4 | Comparative compound 4 | Compound A1 | 108 | 75 | Comp. |
| 3-5 | Comparative compound 5 | Compound A1 | 92 | 105 | Comp. |
| 3-6 | Comparative compound 6 | Compound A1 | 88 | 105 | Comp. |
| 3-7 | Comparative compound 7 | Compound A1 | 83 | 90 | Comp. |
| 3-8 | Comparative compound 8 | Compound A1 | 105 | 110 | Comp. |
| 3-9 | Comparative compound 9 | Compound A1 | 110 | 109 | Comp. |
| 3-10 | Comparative compound 3 | B2 | 109 | 116 | Comp. |
| 3-11 | Comparative compound 8 | B2 | 108 | 115 | Comp. |
| 3-12 | Comparative compound 9 | B2 | 112 | 114 | Comp. |
| 3-13 | 1-12 | B2 | 166 | 195 | Inv. |
| 3-14 | 2-2 | B2 | 173 | 215 | Inv. |
| 3-15 | 3-3 | B2 | 166 | 192 | Inv. |

TABLE 3-continued

| Sample OLED No. | Compound used in light emission layer | Compound used in hole blocking layer | Emission luminance (%) | Half life (%) | Remarks |
|---|---|---|---|---|---|
| 3-16 | 4-5 | B2 | 171 | 185 | Inv. |
| 3-17 | 4-12 | B2 | 169 | 201 | Inv. |
| 3-18 | 4-13 | B2 | 165 | 204 | Inv. |
| 3-19 | 5-2 | B2 | 165 | 184 | Inv. |
| 3-20 | HA-1 | B2 | 174 | 220 | Inv. |
| 3-21 | HA-3 | B2 | 172 | 215 | Inv. |
| 3-22 | HA-5 | B2 | 170 | 225 | Inv. |
| 3-23 | IA-1 | B2 | 180 | 208 | Inv. |
| 3-24 | IA-11 | B2 | 175 | 195 | Inv. |
| 3-25 | IA-13 | B2 | 166 | 191 | Inv. |
| 3-26 | JA-1 | B2 | 162 | 195 | Inv. |
| 3-27 | JA-2 | B2 | 170 | 193 | Inv. |
| 3-28 | JA-8 | B2 | 169 | 187 | Inv. |

Comp.: Comparative,
Inv.: Inventive

As is apparent from Table 3, inventive organic EL element samples employing the compound in the invention in the light emission layer provide high emission luminance and long luminance half life as compared with comparative organic EL element samples employing the comparative compound in the light emission layer.

Further, inventive organic EL element samples employing BCP, Compound A1, OXD7, TAZ or B1 as a hole blocking material used in the hole blocking layer exhibited higher emission luminance and longer luminance life as compared to comparative organic EL element samples employing BCP, Compound A1, OXD7, TAZ or B1 as a hole blocking material in the hole blocking layer.

Example 4

<<Preparation of Organic EL Element Samples OLED 4-1 Through 4-9>>

Organic EL element samples OLED 4-1 through 4-9 were prepared in the same manner as comparative organic EL element sample OLED 1-1, except that the host compound used in the light emission layer and the compound used in the hole blocking layer were replaced with those as shown in Table 4, respectively.

The resulting sample OLED 4-1 through 4-9 were evaluated for emission luminance, and luminance half life in the same manner as in Example 1. The results are shown in Table 4.

In Table 4, emission luminance and half life are expressed by a relative value when the emission luminance and half life of organic EL element sample OLED 4-1 were set at 100, respectively.

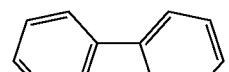

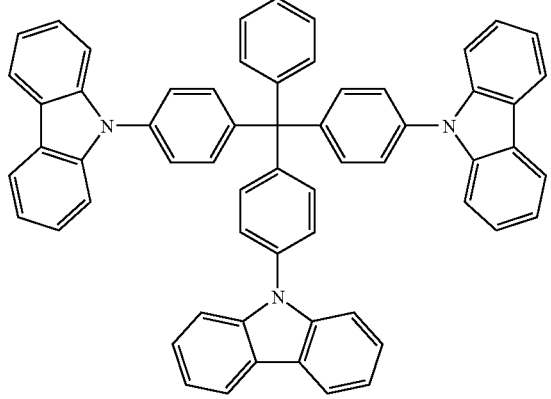

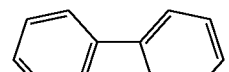

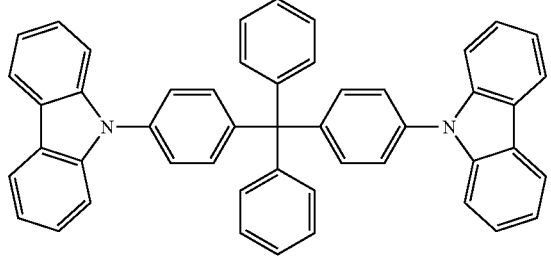

TABLE 4

| Sample OLED No. | Compound used in light emission layer | Compound used in hole blocking layer | Emission luminance (%) | Half life (%) | vanderwaals volume ($Å^3$) | Remarks |
|---|---|---|---|---|---|---|
| 4-1 | Comparative compound 9 | B2 | 100 | 100 | 49.4 | Comp. |
| 4-2 | Comparative compound 11 | B2 | 92 | 110 | 435.0 | Comp. |
| 4-3 | Comparative compound 12 | B2 | 95 | 107 | 294.4 | Comp. |
| 4-4 | 2-1 | B2 | 128 | 189 | 86.0 | Inv. |
| 4-5 | HA-3 | B2 | 142 | 223 | 84.4 | Inv. |
| 4-6 | HA-4 | B2 | 147 | 210 | 67.7 | Inv. |
| 4-7 | HC1 | B2 | 138 | 195 | 210.8 | Inv. |

TABLE 4-continued

| Sample OLED No. | Compound used in light emission layer | Compound used in hole blocking layer | Emission luminance (%) | Half life (%) | vanderwaals volume ($Å^3$) | Remarks |
|---|---|---|---|---|---|---|
| 4-8 | HC8 | B2 | 130 | 214 | 149.3 | Inv. |
| 4-9 | HC12 | B2 | 147 | 211 | 84.4 | Inv. |

Comp.: Comparative,
Inv.: Inventive

As is apparent from Table 4, inventive organic EL element samples employing the compound in the invention in the light emission layer provide high emission luminance and long half life as compared with comparative organic EL element samples employing the comparative compound in the light emission layer.

Further, when BCP, Compound A1, OXD7, TAZ or B1 is used as a hole blocking material instead of B2, the compound in the invention exhibited higher emission luminance and longer life time as compared to the comparative compound.

Example 5

<<Preparation of Full Color Image Display>>

(Preparation of Blue Light Emission Organic EL Element)

A blue light emission organic EL element was prepared in the same manner as in organic EL element sample OLED 1-1 of Example 1, except that m-MTDATXA was used instead of α-NPD in the hole injecting/transporting layer, Exemplified compound 4-4 and Ir-12 were used in the light emission layer, in which the depositing speed rate of the compound 4-4 to Ir-12 was adjusted to be 100:7, and BCP was used in the electron transporting layer, and further, lithium fluoride was deposited to form a cathode buffering layer with a thickness of 0.5 nm and then, aluminum was deposited to form a cathode with a thickness of 110 nm.

(Preparation of Green Light Emission Organic EL Element)

A green light emission organic EL element was prepared in the same manner as in the blue light emission organic EL element above, except that Ir-1 was used in the light emission layer instead of Ir-12.

(Preparation of Red Light Emission Organic EL Element)

A green light emission organic EL element was prepared in the same manner as in the blue light emission organic EL element above, except that Ir-9 was used in the light emission layer instead of Ir-12.

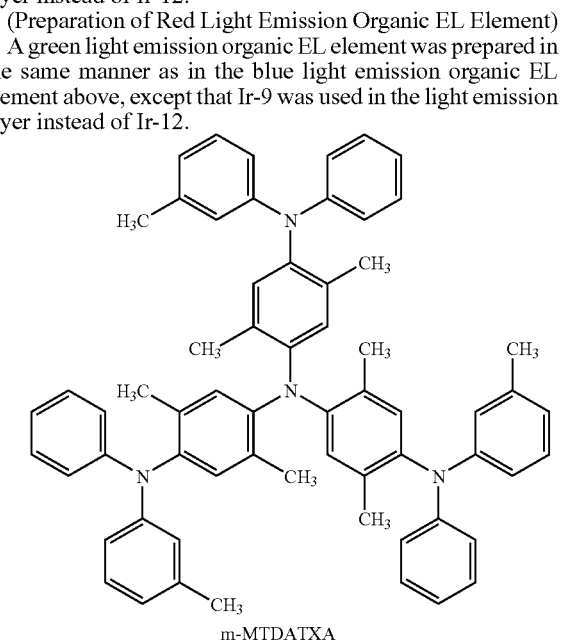

m-MTDATXA

The red, green and blue light emission organic EL elements were provided side by side on the same substrate. Thus, a full color image display according to an active matrix system was obtained which had a structure as shown in FIG. 1. FIG. 2 is a schematic drawing of a display section A of the full color image display prepared above. The display section A comprises plural pixels 3 (including blue light emission pixels, green light emission pixels, and red light emission pixels) and a wiring section including plural scanning lines 5 and plural data lines 6, which were provided on the same substrate. The plural scanning lines 5 and plural data lines 6 each are composed of electroconductive material. The plural scanning lines 5 and plural data lines 6 were crossed with each other at a right angle, and connected with the pixels 3 at the crossed points (not illustrated in detail). Each of the plural pixels 3, which comprise an organic EL element corresponding to the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. Thus, a full color image can be displayed by a red light emission pixel, a green light emission pixel, and a blue light emission pixel, each suitably arranged side by side on the same substrate.

A full color clear moving image with high luminance, high durability was obtained by driving the full color image display prepared above.

Example 1-1

<<Preparation of Organic EL Element Sample OLED 1-1-1>>

A pattern was formed on a substrate (NA-45, manufactured by NH Technoglass Co., Ltd.) composed of a glass plate and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes.

The thus obtained transparent substrate was fixed on a substrate holder of a vacuum deposition apparatus available on the market. Further, α-NPD, CBP, Ir-1, BCP and $Alq_3$ were put in each of five resistive heating tantalum boats, and set in a first vacuum chamber of a vacuum deposition apparatus.

Further, lithium fluoride was put in a resistive heating tantalum boat, aluminum was put in a resistive heating tungsten boat, and set in a second vacuum chamber of the vacuum deposition apparatus.

Pressure in the first vacuum chamber was reduced to $4\times10^{-4}$ Pa, then the first vacuum chamber was heated by supplying an electric current, and α-NPD was deposited onto the transparent substrate at a depositing speed of 0.1 to 0.2 nm/second to form a hole injecting/transporting layer with a thickness of 25 nm. After that, supplying an electric current to the boat carrying CBP as a host and the boat carrying Ir-1 as a dopant, individually, in which the depositing speed ratio of CBP to Ir-1 was adjusted to be 100:7, CBP and Ir-1 were co-deposited onto the resulting hole transporting layer to form a light emission layer with a thickness of 30 nm. Subsequently, supplying an electric current to the boat carrying BCP, BCP was deposited onto the light emission layer at a depositing speed of 0.1 to 0.2 nm/second to form an electron transporting layer with a thickness of 10 nm, and then, supplying an electric current to the boat carrying Alq$_3$, Alq$_3$ was deposited onto the resulting layer at a depositing speed of 0.1 to 0.2 nm/second to form an electron injecting layer with a thickness of 40 nm.

The resulting material was transferred to the second vacuum chamber under vacuum, and a stainless steel mask having a rectangular hole was placed on the electron injecting layer by means of remote control.

Figure 5:
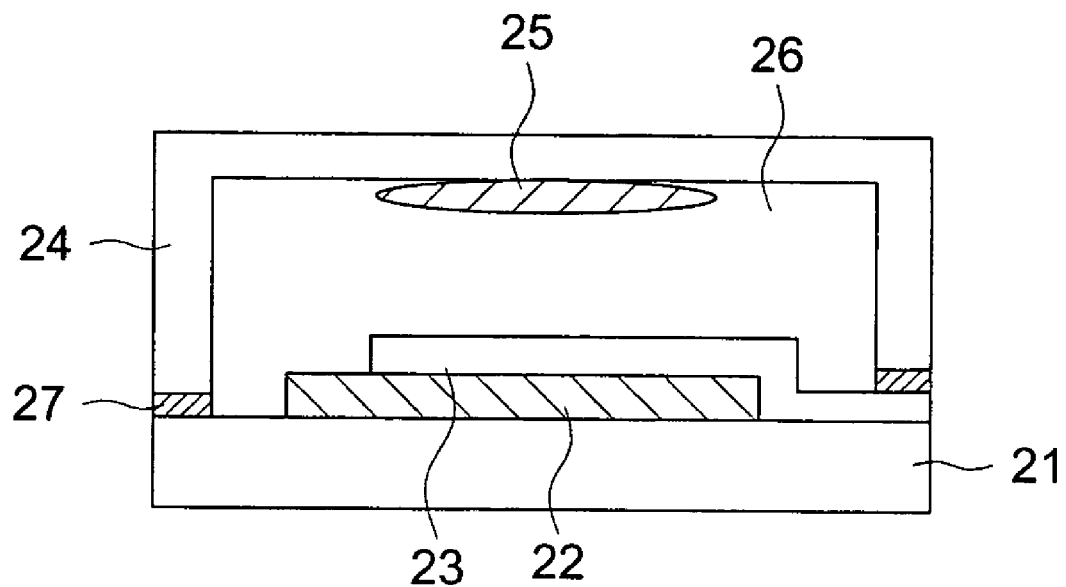
FIG. 5 is a schematic drawing of an organic electroluminescent element having a sealing structure.

After pressure in the second vacuum chamber was reduced to $2\times10^{-4}$ Pa, an electric current was supplied to the boat carrying lithium fluoride, lithium fluoride was deposited at a depositing speed of 0.01 to 0.02 nm/second to form a cathode buffering layer with a thickness of 0.5 nm, and then, supplying an electric current to the boat carrying aluminum, aluminum was deposited onto the resulting layer at a depositing speed of 1 to 2 nm/second to form a cathode with a thickness of 150 nm. The resulting material was transferred without contacting air to a globe box which was substituted with a high purity nitrogen gas (having a purity of not less than 99.999%), and treated to have a sealing structure as shown in FIG. 5. Thus, organic EL element sample OLED 1-1-1, which was sealed, was prepared.

In FIG. 5, numerical number 24 shows a glass cover, numerical number 25 barium oxide as a moisture absorbing agent, numerical number 27 an adhesive, numerical number 21 a glass substrate with a transparent electrode, numerical number 22 an organic EL element comprising a hole injecting or transporting layer, a light emission layer, an electron transporting layer and/or an electron transporting layer, numerical number 23 a cathode, and numerical number 26 a nitrogen gas. As the glass cover 24, a glass cover, to which barium oxide 25 as a moisture absorbing agent (high purity barium oxide powder produced by Aldrich Co., Ltd.) was adhered with a fluorine contained resin translucent film with an adhesive (Microtex S-NTF8031Q, produced by Nitto Denko Co., Ltd.), was used. The organic EL element sample was covered with the glass cover, where the organic EL element sample was adhered to the glass cover with a UV curable adhesive 27 cured by a UV lamp. Thus, a sealed organic EL element sample was prepared.

The chemical structure of comparative compound 1-1 used above is shown below.

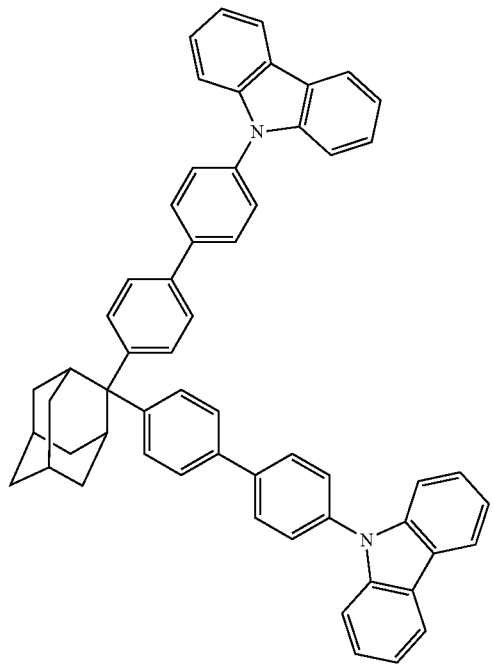

Comparative compound 1-1

<<Preparation of Organic EL Element Samples OLED 1-1-2 Through 1-1-24>>

Organic EL element samples OLED 1-1-2 through 1-1-24 were prepared in the same manner as organic EL element sample OLED 1-1-1, except that CBP as a host and BCP as an electron transporting material were replaced with those as shown in Table 1-1.

The resulting organic EL element samples OLED 1-1-1 through 1-1-24 were evaluated as follows:

<<Emission Luminance, Emission Efficiency, Durability, Initial Deterioration>>

When a direct voltage of 10V was supplied to organic EL element sample OLED 1-1-1 at 23° C. in an atmosphere of a dry nitrogen gas, emission luminance (cd/m$^2$) of light emitted and emission efficiency (lm/W) were measured. Emission luminance and emission efficiency were measured according to CS-1000 produced by Minolta Co., Ltd.

When a constant current of 10 mA/cm$^2$ was supplied to the sample, time when initial emission luminance after emission decays by half (hereinafter referred to as half life τ0.5) was measured as a measure of durability of the sample. Further, time when initial emission luminance after emission decays to 90% of the initial luminance (hereinafter referred to as 10% decay time τ0.9) was measured as a measure of initial deterioration of the sample. The same measurement as above was carried out regarding organic EL element samples OLED 1-1-2 through 1-1-24. Emission luminance, emission efficiency, durability and initial deterioration of the organic EL element samples OLED 1-1-2 through 1-1-24 were expressed by a relative value when the emission luminance, emission efficiency, durability and initial deterioration of organic EL element sample OLED 1-1-1 were set at 100, respectively.

The results are shown in Table 1-1.

TABLE 1-1

| Sample OLED No. | Host | Electron transporting material | Emission luminance | Emission efficiency | Durability | Initial deterioration | Remarks |
|---|---|---|---|---|---|---|---|
| 1-1-2 | 11-1 | BCP | 111 | 112 | 142 | 473 | Comp. |
| 1-1-3 | 11-1 | A2-3 | 147 | 144 | 170 | 712 | Inv. |
| 1-1-4 | 11-1 | D1-2 | 132 | 136 | 179 | 501 | Inv. |
| 1-1-5 | 11-6 | A2-3 | 114 | 112 | 167 | 486 | Inv. |
| 1-1-6 | 11-19 | BCP | 117 | 116 | 126 | 431 | Comp. |
| 1-1-7 | 11-19 | A2-3 | 132 | 124 | 137 | 675 | Inv. |
| 1-1-8 | 12-27 | BCP | 113 | 115 | 125 | 479 | Comp. |
| 1-1-9 | 12-27 | A2-3 | 120 | 117 | 140 | 612 | Inv. |
| 1-1-10 | 12-32 | A2-3 | 114 | 108 | 125 | 484 | Inv. |
| 1-1-11 | 12-41 | BCP | 100 | 93 | 111 | 454 | Comp |
| 1-1-12 | 12-41 | A2-3 | 103 | 99 | 139 | 609 | Inv. |
| 1-1-13 | 12-43 | A2-3 | 111 | 107 | 131 | 588 | Inv. |
| 1-1-14 | 13-1 | BCP | 107 | 116 | 126 | 502 | Comp. |
| 1-1-15 | 13-1 | D1-2 | 148 | 150 | 127 | 579 | Inv. |
| 1-1-16 | 13-10 | A2-3 | 144 | 147 | 126 | 656 | Inv. |
| 1-1-17 | 13-14 | A2-3 | 132 | 136 | 157 | 629 | Inv. |
| 1-1-1 | CBP | BCP | *100 | *100 | *100 | *100 | Comp. |
| 1-1-18 | CBP | A2-3 | 104 | 104 | 111 | 194 | Comp. |
| 1-1-19 | Comparative compound 1-1 | BCP | 110 | 107 | 120 | 172 | Comp. |
| 1-1-20 | Comparative compound 1-1 | A2-3 | 114 | 110 | 129 | 241 | Comp. |
| 1-1-21 | 14-16 | BCP | 105 | 106 | 130 | 510 | Comp. |
| 1-1-22 | 14-16 | A2-3 | 127 | 131 | 181 | 727 | Inv. |
| 1-1-23 | 14-20 | A2-3 | 118 | 120 | 185 | 714 | Inv. |
| 1-1-24 | 14-25 | D1-2 | 120 | 125 | 183 | 722 | Inv. |

Comp.: Comparative,
Inv.: Inventive,
*Standard

As is apparent from Table 1, inventive organic EL element samples provide high emission luminance, excellent quantum yield, and high durability, and further provide a lower luminance reducing speed at an initial emission stage, which minimizes rapid deterioration of the element at the initial stage.

Example 1-2

<<Preparation of Whit Light Emitting Organic EL Element and White Light Emitting Illuminator>>

A transparent electrode substrate was prepared in the same manner as in the transparent substrate of Example 1-1, except that an electrode pattern of 20 mm×20 mm was formed. An organic electroluminescent element sample OLED 1-2-1 was prepared in the same manner as in organic electroluminescent element sample OLED 1-1-1 of Example 1, except that the transparent electrode substrate was used, and CBP, Ir-6, and Ir-12 were co-deposited onto the hole transporting layer to form a light emission layer with a thickness of 30 nm supplying an electric current to the boat carrying CBP as a host, a boat carrying Ir-6 as a dopant and a boat carrying Ir-12 as a dopant, individually, where the depositing speed ratio of CBP, Ir-6, and Ir-12 was adjusted to be 100:1:4.

Thus, organic EL element sample OLED 1-2-1, a flat lamp with a sealing cover emitting white light, was prepared.

When a current was supplied to the flat lamp, the lamp emitted a white light, and was proved to be useful for an illuminator. FIG. 6(a) shows a plan view of the flat lamp and FIG. 6(b) a side view of the flat lamp. The numerical numbers of figures (a) and (b) are the same as those denoted in FIG. 5.

Organic EL element samples OLED 1-2-2 through 1-2-24 were prepared in the same manner as organic EL element sample OLED 1-2-1, except that CBP as a host and BCP as an electron transporting material were replaced with those as shown in Table 1-2. These Organic EL element samples OLED 1-2-2 through 1-2-24 also emitted white light. The resulting organic EL element samples OLED 1-2-2 through 1-2-24 were evaluated for emission luminance, emission efficiency, durability, and initial deterioration in the same manner as in Example. Emission luminance, emission efficiency, durability and initial deterioration of the organic EL element samples OLED 1-2-2 through 1-2-24 were expressed by a relative value when the emission luminance, emission efficiency, durability and initial deterioration of organic EL element sample OLED 1-2-1 were set at 100, respectively. The results are shown in Table 1-2.

TABLE 1-2

| Sample OLED No. | Host | Electron transporting material | Emission luminance | Emission efficiency | Durability | Initial deterioration | Remarks |
|---|---|---|---|---|---|---|---|
| 1-2-2 | 11-1 | BCP | 111 | 112 | 130 | 429 | Comp. |
| 1-2-3 | 11-1 | A2-3 | 123 | 127 | 142 | 594 | Inv. |
| 1-2-4 | 11-1 | D1-2 | 115 | 112 | 160 | 676 | Inv. |
| 1-2-5 | 11-6 | A2-3 | 125 | 128 | 151 | 605 | Inv. |
| 1-2-6 | 11-19 | BCP | 113 | 104 | 130 | 547 | Comp. |

TABLE 1-2-continued

| Sample OLED No. | Host | Electron transporting material | Emission luminance | Emission efficiency | Durability | Initial deterioration | Remarks |
|---|---|---|---|---|---|---|---|
| 1-2-7 | 11-19 | A2-3 | 141 | 144 | 143 | 710 | Inv. |
| 1-2-8 | 12-27 | BCP | 115 | 117 | 118 | 459 | Comp. |
| 1-2-9 | 12-27 | A2-3 | 128 | 134 | 150 | 691 | Inv. |
| 1-2-10 | 12-32 | A2-3 | 141 | 141 | 120 | 504 | Inv. |
| 1-2-11 | 12-41 | BCP | 110 | 118 | 123 | 388 | Comp |
| 1-2-12 | 12-41 | A2-3 | 153 | 155 | 130 | 678 | Inv. |
| 1-2-13 | 12-43 | A2-3 | 115 | 114 | 128 | 573 | Inv. |
| 1-2-14 | 13-1 | BCP | 96 | 95 | 138 | 485 | Comp |
| 1-2-15 | 13-1 | D1-2 | 125 | 129 | 165 | 559 | Inv. |
| 1-2-16 | 13-10 | A2-3 | 129 | 132 | 156 | 602 | Inv. |
| 1-2-17 | 13-14 | A2-3 | 116 | 113 | 143 | 672 | Inv. |
| 1-2-1 | CBP | BCP | *100 | *100 | *100 | *100 | Comp. |
| 1-2-18 | CBP | A2-3 | 108 | 107 | 110 | 159 | Comp. |
| 1-2-19 | Comparative compound 1-1 | BCP | 108 | 111 | 116 | 152 | Comp. |
| 1-2-20 | Comparative compound 1-1 | A2-3 | 113 | 112 | 131 | 194 | Comp. |
| 1-2-21 | 14-16 | BCP | 112 | 111 | 131 | 505 | Comp. |
| 1-2-22 | 14-16 | A2-3 | 123 | 119 | 175 | 732 | Inv. |
| 1-2-23 | 14-20 | A2-3 | 116 | 118 | 168 | 703 | Inv. |
| 1-2-24 | 14-25 | D1-2 | 119 | 121 | 178 | 726 | Inv. |

Comp.: Comparative,
Inv.: Inventive,
*Standard

As is apparent from Table 1-2, inventive organic EL element samples provide high emission luminance, excellent quantum yield, and high durability, and extremely minimize deterioration of the element at the initial stage.

Example 1-3

<<Preparation of Full Color Image Display>>

A red light emission organic EL element, a green light emission organic EL element and a blue light emission organic EL element were prepared in the same manner as in the inventive sample of Example 1-1, employing, as a dopant, Ir-6, Ir-1, and Ir-12, respectively. The resulting light emission organic EL elements were provided side by side on the same substrate. Thus, a full color image display according to an active matrix system was obtained which had a structure as shown in FIG. 1. Thus, as described in Example 5 above, a full color image can be displayed by a display comprising a red light emission pixel, a green light emission pixel, and a blue light emission pixel, each suitably arranged side by side on the same substrate.

A full color clear moving image with high luminance, high durability, and minimized initial display image quality deterioration was obtained by driving the full color image display prepared above.

Example 2-1

<<Preparation of Organic EL Element Sample OLED 2-1-1>>

An organic electroluminescent element sample OLED 2-1-1 was prepared in the same manner as organic electroluminescent element sample OLED 1-1-1 of Example 1-1.

<<Preparation of Organic EL Element Samples OLED 2-1-2 Through 2-1-21>>

Organic EL element samples OLED 2-1-2 through 2-1-21 were prepared in the same manner as organic EL element sample OLED 2-1-1, except that CBP as a host and α-NPD as a hole transporting material were replaced with those as shown in Table 2-1.

The phosphorescence 0-0 band of the hole transporting materials C-4 and C-5 were 423 nm and 440 nm, respectively.

<Evaluation of Organic EL Element Samples OLED 2-1-1 Through 2-1-21>

The resulting organic EL element samples OLED 2-1-1 through 2-1-21 were evaluated for emission luminance, emission efficiency, durability, initial deterioration in the same manner as in Example 1-1-1.

Emission luminance, emission efficiency, durability and initial deterioration of the organic EL element samples OLED 2-1-2 through 2-1-21 were expressed by a relative value when the emission luminance, emission efficiency, durability and initial deterioration of organic EL element sample OLED 2-1-1 were set at 100, respectively. The results are shown in Table 2-1.

TABLE 2-1

| Sample OLED No. | Host | Hole transporting material | Emission luminance | Emission efficiency | Durability | Initial deterioration | Remarks |
|---|---|---|---|---|---|---|---|
| 2-1-1 | CBP | α-NPD | *100 | *100 | *100 | *100 | Comp. |
| 2-1-2 | 11-1 | α-NPD | 114 | 122 | 130 | 499 | Comp. |
| 2-1-3 | 11-1 | C-4 | 129 | 132 | 142 | 513 | Inv. |

TABLE 2-1-continued

| Sample OLED No. | Host | Hole transporting material | Emission luminance | Emission efficiency | Durability | Initial deterioration | Remarks |
|---|---|---|---|---|---|---|---|
| 2-1-4 | 11-1 | C-5 | 147 | 147 | 148 | 678 | Inv. |
| 2-1-5 | 11-6 | C-4 | 150 | 152 | 135 | 557 | Inv. |
| 2-1-6 | 11-19 | α-NPD | 99 | 100 | 134 | 551 | Comp. |
| 2-1-7 | 11-19 | C-4 | 110 | 109 | 144 | 752 | Inv. |
| 2-1-8 | 12-27 | α-NPD | 104 | 107 | 128 | 523 | Comp |
| 2-1-9 | 12-27 | C-4 | 139 | 141 | 144 | 674 | Inv. |
| 2-1-10 | 12-32 | C-5 | 115 | 111 | 130 | 646 | Inv. |
| 2-1-11 | 12-41 | α-NPD | 105 | 108 | 134 | 475 | Comp. |
| 2-1-12 | 12-41 | C-4 | 118 | 115 | 137 | 620 | Inv. |
| 2-1-13 | 13-1 | α-NPD | 118 | 123 | 138 | 492 | Comp. |
| 2-1-14 | 13-1 | C-4 | 135 | 139 | 141 | 531 | Inv. |
| 2-1-15 | 13-10 | C-4 | 159 | 158 | 152 | 671 | Inv. |
| 2-1-16 | 13-14 | C-4 | 151 | 155 | 157 | 705 | Inv. |
| 2-1-17 | CBP | C-4 | 104 | 104 | 109 | 208 | Comp. |
| 2-1-18 | 14-16 | α-NPD | 120 | 125 | 135 | 480 | Comp. |
| 2-1-19 | 14-16 | C-4 | 141 | 143 | 159 | 781 | Inv. |
| 2-1-20 | 14-20 | C-4 | 133 | 135 | 162 | 758 | Inv. |
| 2-1-21 | 14-25 | C-4 | 124 | 126 | 165 | 767 | Inv. |

Comp.: Comparative,
Inv.: Inventive,
*Standard

As is apparent from Table 2-1, inventive organic EL element samples provide high emission luminance, excellent quantum yield, and high durability, and further provide a lower luminance reducing speed at an initial emission stage, which minimizes rapid deterioration of the element at the initial stage.

Example 2-2

<Preparation and Evaluation of Whit Light Emitting Organic EL Element Samples OLED 2-2-1 Through 2-2-21>

A transparent electrode substrate was prepared in the same manner as in the transparent substrate of Example 1-1, except that an electrode pattern of 20 mm×20 mm was formed. An organic electroluminescent element sample OLED 2-2-1 was prepared in the same manner as in organic electroluminescent element sample OLED 1-1-1 of Example 1, except that the transparent electrode substrate was used, and CBP, Ir-6, and Ir-12 were co-deposited onto the hole transporting layer to form a light emission layer with a thickness of 30 nm supplying an electric current to the boat carrying CBP as a host, a boat carrying Ir-6 as a dopant and a boat carrying Ir-12 as a dopant, individually, where the depositing speed ratio of CBP, Ir-6, and Ir-12 was adjusted to be 100:1:4.

Thus, organic EL element sample OLED 2-2-1, a flat lamp with a sealing cover emitting white light, was prepared.

When a current was supplied to the flat lamp, the lamp emitted a white light, and was proved to be useful for an illuminator.

Organic EL element samples OLED 2-2-2 through 2-2-21 were prepared in the same manner as organic EL element sample OLED 2-2-1, except that CBP as a host and BCP as an electron transporting material were replaced with those as shown in Table 2-2. These Organic EL element samples OLED 2-2-2 through 2-2-21 also emitted white light. The resulting organic EL element samples OLED 2-2-1 through 2-2-21 were evaluated for emission luminance, emission efficiency, durability, and initial deterioration in the same manner as in Example 1-1. Emission luminance, emission efficiency, durability and initial deterioration of the organic EL element samples OLED 2-2-2 through 2-2-21 were expressed by a relative value when the emission luminance, emission efficiency, durability and initial deterioration of organic EL element sample OLED 2-2-1 were set at 100, respectively. The results are shown in Table 2-2.

TABLE 2-2

| Sample OLED No. | Host | Electron transporting material | Emission luminance | Emission efficiency | Durability | Initial deterioration | Remarks |
|---|---|---|---|---|---|---|---|
| 2-2-1 | CBP | α-NPD | *100 | *100 | *100 | *100 | Comp. |
| 2-2-2 | 11-1 | α-NPD | 114 | 113 | 137 | 422 | Comp. |
| 2-2-3 | 11-1 | C-4 | 114 | 118 | 139 | 644 | Inv. |
| 2-2-4 | 11-1 | C-5 | 119 | 117 | 146 | 530 | Inv. |
| 2-2-5 | 11-6 | C-4 | 145 | 141 | 181 | 485 | Inv. |
| 2-2-6 | 11-19 | α-NPD | 114 | 111 | 142 | 424 | Comp. |
| 2-2-7 | 11-19 | C-4 | 143 | 145 | 164 | 676 | Inv. |
| 2-2-8 | 12-27 | α-NPD | 103 | 108 | 121 | 468 | Comp |
| 2-2-9 | 12-27 | C-4 | 110 | 111 | 122 | 603 | Inv. |
| 2-2-10 | 12-32 | C-5 | 110 | 106 | 139 | 646 | Inv. |
| 2-2-11 | 12-41 | α-NPD | 118 | 122 | 117 | 376 | Comp. |
| 2-2-12 | 12-41 | C-4 | 136 | 136 | 134 | 613 | Inv. |
| 2-2-13 | 13-1 | α-NPD | 102 | 104 | 107 | 445 | Comp. |
| 2-2-14 | 13-1 | C-4 | 107 | 102 | 123 | 590 | Inv. |
| 2-2-15 | 13-10 | C-4 | 107 | 113 | 109 | 619 | Inv. |

TABLE 2-2-continued

| Sample OLED No. | Host | Electron transporting material | Emission luminance | Emission efficiency | Durability | Initial deterioration | Remarks |
|---|---|---|---|---|---|---|---|
| 2-2-16 | 13-14 | C-4 | 139 | 144 | 122 | 631 | Inv. |
| 2-2-17 | CBP | C-4 | 92 | 86 | 109 | 177 | Comp. |
| 2-2-18 | 14-16 | α-NPD | 104 | 108 | 121 | 469 | Comp. |
| 2-2-19 | 14-16 | C-4 | 116 | 114 | 183 | 753 | Inv. |
| 2-2-20 | 14-20 | C-4 | 116 | 115 | 182 | 695 | Inv. |
| 2-2-21 | 14-25 | C-4 | 117 | 116 | 185 | 702 | Inv. |

Comp.: Comparative,
Inv.: Inventive,
*Standard

As is apparent from Table 2-2, inventive organic EL element samples provide high emission luminance, excellent quantum yield, and high durability, and extremely minimize deterioration of the element at the initial stage.

Example 2-3

<<Preparation of Full Color Image Display>>

A red light emission organic EL element, a green light emission organic EL element and a blue light emission organic EL element were prepared in the same manner as in the inventive sample of Example 2-1, employing, as a dopant, Ir-6, Ir-1, and Ir-12, respectively. The resulting light emission organic EL elements were provided side by side on the same substrate. Thus, a full color image display according to an active matrix system was obtained which had a structure as shown in FIG. 1. Thus, as described in Example 5 above, a full color image can be displayed by a display comprising a red light emission pixel, a green light emission pixel, and a blue light emission pixel, each suitably arranged side by side on the same substrate.

A full color clear moving image with high luminance, high durability, and minimized initial display image quality deterioration was obtained by driving the full color image display prepared above.

Example 3-1

<<Preparation of Organic EL Element Sample OLED 3-1-1>>

An organic electroluminescent element sample OLED 3-1-1 was prepared in the same manner as organic electroluminescent element sample OLED 1-1-1 of Example 1-1, except that Ir-12 was used instead of Ir-1.

<<Preparation of Organic EL Element Samples OLED 3-1-2 Through 3-1-20>>

Organic EL element samples OLED 3-1-2 through 3-1-20 were prepared in the same manner as organic EL element sample OLED 3-1-1, except that CBP as a host and Ir-12 as a dopant were replaced with those as shown in Table 3-1.

<Evaluation of Organic EL Element Samples OLED 3-1-1 Through 3-1-20>

The resulting organic EL element samples OLED 3-1-1 through 3-1-20 were evaluated for emission luminance, emission efficiency, durability, and initial deterioration.

When a direct voltage of 10V was supplied to organic EL element sample OLED 3-1-1 at 23° C. in an atmosphere of a dry nitrogen gas, emission luminance ($cd/m^2$) and emission efficiency (lm/W) of light emitted were measured. Emission luminance was measured according to CS-1000 produced Minolta Co., Ltd.

When a constant current of 10 $mA/cm^2$ was supplied to the sample, time when initial emission luminance decays by half (hereinafter referred to as half life τ0.5) was measured as a measure of durability of the sample.

Further, time when initial emission luminance decays to 90% of the initial luminance (hereinafter referred to as 10% deacy time τ0.9) was measured as a measure of initial deterioration of the sample.

The same measurement as above was carried out regarding organic EL element samples OLED 3-1-2 through 3-1-20. Emission luminance, emission efficiency, durability and initial deterioration of the organic EL element samples OLED 3-1-2 through 3-1-20 were expressed by a relative value when the emission luminance, emission efficiency, durability and initial deterioration of organic EL element sample OLED 3-1-1 were set at 100, respectively. The results are shown in Table 3-1.

TABLE 3-1

| Sample OLED No. | Host | Dopant | Emission luminance | Emission efficiency | Durability | Initial deterioration | Remarks |
|---|---|---|---|---|---|---|---|
| 3-1-1 | CBP | Ir-12 | *100 | *100 | *100 | *100 | Comp. |
| 3-1-2 | 11-1 | Ir-12 | 105 | 104 | 139 | 451 | Inv. |
| 3-1-3 | 11-1 | D-1 | 111 | 114 | 147 | 600 | Inv. |
| 3-1-4 | 11-1 | D-3 | 136 | 129 | 163 | 564 | Inv. |
| 3-1-5 | 11-6 | D-1 | 135 | 132 | 187 | 542 | Inv. |
| 3-1-6 | 11-19 | Ir-12 | 97 | 96 | 129 | 310 | Inv. |
| 3-1-7 | 11-19 | D-1 | 105 | 105 | 144 | 710 | Inv. |
| 3-1-8 | 12-27 | Ir-12 | 95 | 91 | 121 | 391 | Inv. |
| 3-1-9 | 12-27 | D-1 | 129 | 132 | 146 | 665 | Inv. |
| 3-1-10 | 12-32 | D-1 | 124 | 127 | 136 | 605 | Inv. |
| 3-1-11 | 12-41 | Ir-12 | 116 | 110 | 136 | 362 | Inv. |
| 3-1-12 | 12-41 | D-3 | 161 | 162 | 153 | 597 | Inv. |
| 3-1-13 | 13-1 | Ir-12 | 102 | 102 | 118 | 251 | Inv. |

TABLE 3-1-continued

| Sample OLED No. | Host | Dopant | Emission luminance | Emission efficiency | Durability | Initial deterioration | Remarks |
|---|---|---|---|---|---|---|---|
| 3-1-14 | 13-1 | D-1 | 109 | 114 | 121 | 367 | Inv. |
| 3-1-15 | 13-10 | D-1 | 111 | 114 | 136 | 409 | Inv. |
| 3-1-16 | 13-14 | D-1 | 130 | 137 | 131 | 510 | Inv. |
| 3-1-17 | CBP | D-1 | 112 | 110 | 113 | 166 | Comp. |
| 3-1-18 | 14-16 | D-1 | 118 | 112 | 188 | 732 | Inv. |
| 3-1-19 | 14-20 | D-1 | 119 | 111 | 189 | 715 | Inv. |
| 3-1-20 | 14-25 | D-1 | 117 | 110 | 191 | 723 | Inv. |

Comp.: Comparative,
Inv.: Inventive,
*Standard

As is apparent from Table 3-1, inventive organic EL element samples provide high emission luminance, excellent quantum yield, and high durability, and further provide a lower luminance reducing speed at an initial emission stage, which minimizes rapid deterioration of the element at the initial stage.

Example 3-2

<Preparation and Evaluation of Whit Light Emitting Organic EL Element Samples OLED 3-2-1 Through 3-2-20>

A transparent electrode substrate was prepared in the same manner as in the transparent substrate of Example 1-1, except that an electrode pattern of 20 mm×20 mm was formed. An organic electroluminescent element sample OLED 3-2-1 was prepared in the same manner as in organic electroluminescent element sample OLED 1-1-1 of Example 1, except that the transparent electrode substrate was used, and CBP, Ir-6, and Ir-12 were co-deposited onto the hole transporting layer to form a light emission layer with a thickness of 30 nm supplying an electric current to the boat carrying CBP as a host, a boat carrying Ir-6 as a dopant and a boat carrying Ir-12 as a dopant, individually, where the depositing speed ratio of CBP, Ir-6, and Ir-12 was adjusted to be 100:1:4.

Thus, organic EL element sample OLED 3-2-1, a flat lamp with a sealing cover emitting white light, was prepared.

When a current was supplied to the flat lamp, the lamp emitted a white light, and was proved to be useful for an illuminator.

Organic EL element samples OLED 3-2-2 through 3-2-20 were prepared in the same manner as organic EL element sample OLED 3-2-1, except that CBP as a host and Ir-12 as a dopant were replaced with those as shown in Table 3-2. These organic EL element samples OLED 3-2-2 through 3-2-20 also emitted white light. The resulting organic EL element samples OLED 3-2-1 through 3-2-20 were evaluated for emission luminance, emission efficiency, durability, and initial deterioration in the same manner as in Example 1. Emission luminance, emission efficiency, durability and initial deterioration of the organic EL element samples OLED 3-2-2 through 3-2-20 were expressed by a relative value when the emission luminance, emission efficiency, durability and initial deterioration of organic EL element sample OLED 3-2-1 were set at 100, respectively. The results are shown in Table 3-2.

TABLE 3-2

| Sample OLED No. | Host | Dopant | Emission luminance | Emission efficiency | Durability | Initial deterioration | Remarks |
|---|---|---|---|---|---|---|---|
| 3-2-1 | CBP | Ir-12 | *100 | *100 | *100 | *100 | Comp. |
| 3-2-2 | 11-1 | Ir-12 | 103 | 100 | 118 | 353 | Inv. |
| 3-2-3 | 11-1 | D-1 | 108 | 115 | 135 | 429 | Inv. |
| 3-2-4 | 11-1 | D-3 | 135 | 134 | 125 | 465 | Inv. |
| 3-2-5 | 11-6 | D-1 | 107 | 103 | 127 | 448 | Inv. |
| 3-2-6 | 11-19 | Ir-12 | 116 | 115 | 119 | 363 | Inv. |
| 3-2-7 | 11-19 | D-1 | 153 | 151 | 136 | 455 | Inv. |
| 3-2-8 | 12-27 | Ir-12 | 103 | 98 | 125 | 300 | Inv. |
| 3-2-9 | 12-27 | D-1 | 131 | 128 | 139 | 399 | Inv. |
| 3-2-10 | 12-32 | D-1 | 125 | 121 | 134 | 445 | Inv. |
| 3-2-11 | 12-41 | Ir-12 | 112 | 112 | 141 | 320 | Inv. |
| 3-2-12 | 12-41 | D-3 | 126 | 132 | 147 | 445 | Inv. |
| 3-2-13 | 13-1 | Ir-12 | 103 | 106 | 116 | 342 | Inv. |
| 3-2-14 | 13-1 | D-1 | 120 | 114 | 137 | 501 | Inv. |
| 3-2-15 | 13-10 | D-1 | 117 | 117 | 127 | 438 | Inv. |
| 3-2-16 | 13-14 | D-1 | 113 | 116 | 120 | 383 | Inv. |
| 3-2-17 | CBP | D-1 | 103 | 99 | 109 | 144 | Comp. |
| 3-2-18 | 14-16 | D-1 | 117 | 116 | 158 | 512 | Inv. |
| 3-2-19 | 14-20 | D-1 | 116 | 115 | 150 | 505 | Inv. |
| 3-2-20 | 14-25 | D-1 | 118 | 117 | 153 | 507 | Inv. |

Comp.: Comparative,
Inv.: Inventive,
*Standard

As is apparent from Table 3-2, inventive organic EL element samples provide high emission luminance, excellent quantum yield, and high durability, and extremely minimize deterioration of the element at the initial stage.

Example 3-3

<<Preparation of Full Color Image Display>>

A red light emission organic EL element, a green light emission organic EL element and a blue light emission organic EL element were prepared in the same manner as in the inventive sample of Example 3-1, employing, as a dopant, Ir-6, Ir-1, and D-3, respectively. The resulting light emission organic EL elements were provided side by side on the same substrate. Thus, a full color image display according to an active matrix system was obtained which had a structure as shown in FIG. 1.

Thus, as described in Example 5 above, a full color image can be displayed by a display comprising a red light emission pixel, a green light emission pixel, and a blue light emission pixel, each suitably arranged side by side on the same substrate.

A full color clear moving image with high luminance, high durability, and minimized initial display image quality deterioration was obtained by driving the full color image display prepared above.

EFFECT OF THE INVENTION

The present invention can provide an organic electroluminescent element with high luminance, high emission efficiency, high durability, and minimized initial display image quality deterioration, and provide a display and an illuminator each employing the organic electroluminescent element.

What is claimed is:

1. An organic electroluminescent element comprising an anode, a cathode and a component layer including a light emission layer, the component layer being provided between the anode and the cathode, wherein the component layer contains a compound represented by formula 1,

Formula 1 wherein $A_1$ represents a group represented by formula 2, provided that plural $A_1$ may be the same or different,

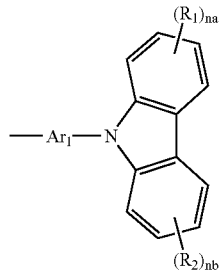

Formula 2 wherein $Ar_1$ represents a divalent aromatic hydrocarbon or aromatic heterocyclic group; $R_1$ and $R_2$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; na and nb independently represent an integer of from 1 to 4; and $X_1$ represents a group represented by formula (d), (e), (f), (h), (i), (j), or (k),

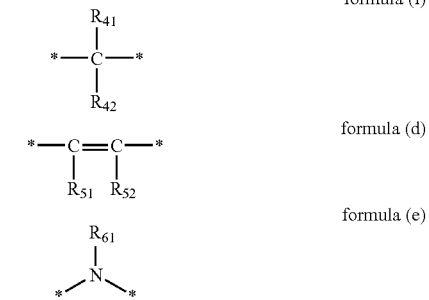

formula (f)

formula (d)

formula (e)

wherein $R_{41}$ and $R_{42}$ independently represent an alkyl group, provided that the total carbon atom number of the alkyl group is from 3 to 9; $R_{51}$ and $R_{52}$ independently represent a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; $R_{61}$ represents an alkyl group; $R_{71}$ through $R_{78}$ independently represent a hydrogen atom, an alkyl group, or an alkoxy group; $R_{81}$ through $R_{88}$ independently represent a hydrogen atom, an alkyl group, or an alkoxy group; $R_{91}$ through $R_{98}$ independently represent a hydrogen atom, an alkyl group, or an alkoxy group; and "*" represents a linkage site, provided that when $X_1$ represents formula (d), (e), or (f), n is 2, and when $X_1$ represents formula (h), (i), (j), or (k), n is 4.

2. The organic electroluminescent element of claim 1, wherein a hole blocking layer is provided between the light emission layer and the cathode.

3. The organic electroluminescent element of claim 2, wherein the hole blocking layer is comprised of at least one selected from the group consisting of a styryl compound, a triazole derivative, a phenanthroline derivative, an oxadiazole derivative and a boron derivative.

4. The organic electroluminescent element of claim 2, wherein the hole blocking layer is comprised of at least one selected from the group consisting of compounds represented by formula 5, 6, 7 or 8,

Formula 5

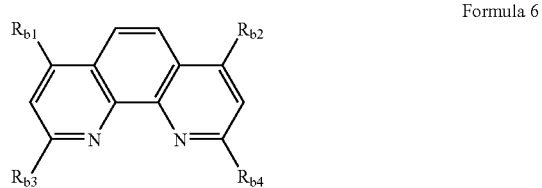

Formula 6

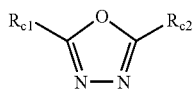

Formula 7

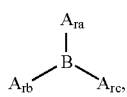

Formula 8 wherein $R_{a1}$ through $R_{a3}$, $R_{b1}$ through $R_{b4}$, and $R_{c1}$ and $R_{c2}$ independently represent an alkyl group, an aryl group or a heterocyclic group; and $A_{ra}$ through $A_{rc}$ independently represent an aryl group or a heterocyclic group.

5. The organic electroluminescent element of claim 1, wherein the light emission layer contains the compound represented by formula 1 above.

6. The organic electroluminescent element of claim 1, wherein the organic electroluminescent element contains a phosphorescent compound.

7. The organic electroluminescent element of claim 6, wherein the phosphorescent compound is an osmium complex, an iridium complex or a platinum complex.

8. An organic electroluminescent element comprising an anode, a cathode and a component layer including a light emission layer, the component layer being provided between the anode and the cathode, wherein the component layer contains a compound represented by formula 3, $$X_2\text{-}(A_2)_m$$ Formula 3 wherein $A_2$ represents a group represented by formula 4, provided that plural $A_2$ may be the same or different,

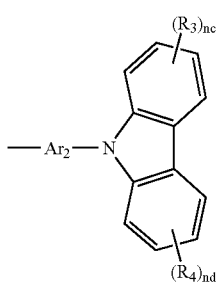

Formula 4 wherein $Ar_2$ represents a divalent aromatic hydrocarbon or aromatic heterocyclic group; $R_3$ and $R_4$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; nc and nd independently represent an integer of from 1 to 4; m represents an integer of 2 ; and $X_2$ represents a group represented by formula (l), (m), or (o),

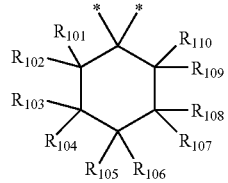

Formula (l)

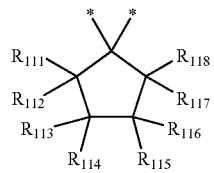

Formula (m)

Formula (o)

wherein $R_{101}$ through $R_{110}$ independently represent a hydrogen atom, an alkyl group, or an alkoxy group, provided that $R_{101}$ through $R_{110}$ does not simultaneously hydrogen atoms; and any two of $R_{101}$ through $R_{110}$ do not combine with each other to form a ring; $R_{111}$ through $R_{118}$ independently represent a hydrogen atom, an alkyl group, or an alkoxy group; $A_5$, $A_6$, $A_7$, and $A_8$ independently represent —C($R_{k2}$)= or —N=; $X_b$ represents —N($R_{k3}$)= or —Si($R_{k4}$)($R_{k5}$)—, which $R_{k2}$, $R_{k3}$, $R_{k4}$, and $R_{k5}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and "*" represents a linkage site.

9. The organic electroluminescent element of claim 8, wherein a hole blocking layer is provided between the light emission layer and the cathode.

10. The organic electroluminescent element of claim 9, wherein the hole blocking layer is comprised of at least one selected from the group consisting of a styryl compound, a triazole derivative, a phenanthroline derivative, an oxadiazole derivative and a boron derivative.

11. The organic electroluminescent element of claim 9, wherein the hole blocking layer is comprised of at least one selected from the group consisting of compounds represented by formula 5, 6, 7 or 8 above.

12. The organic electroluminescent element of claim 8, wherein the light emission layer contains the compound represented by formula 3 above.

13. The organic electroluminescent element of claim 8, wherein the organic electroluminescent element contains a phosphorescent compound.

14. The organic electroluminescent element of claim 13, wherein the phosphorescent compound is an osmium complex, an iridium complex or a platinum complex.

15. An organic electroluminescent element comprising an anode, a cathode and a component layer including a light emission layer, the component layer being provided between the anode and the cathode, wherein the component layer contains a compound represented by formula, H2, H3 or H4, Formula H2

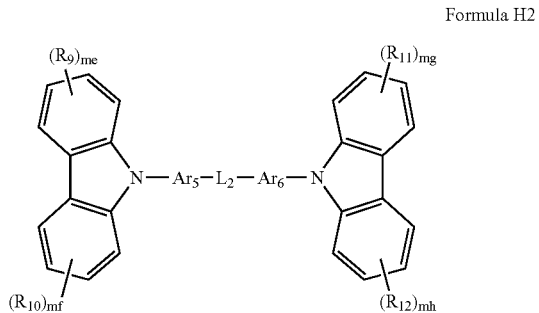

wherein $L_2$ represents an alkylene group having at least one fluorine atom; $Ar_5$ and $Ar_6$ independently represent a divalent aromatic hydrocarbon group or a divalent aromatic heterocyclic group; $R_9$, $R_{10}$, $R_{11}$, and $R_{12}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and me, mf, mg, and mh independently represent an integer of from 1 to 4, Formula H3

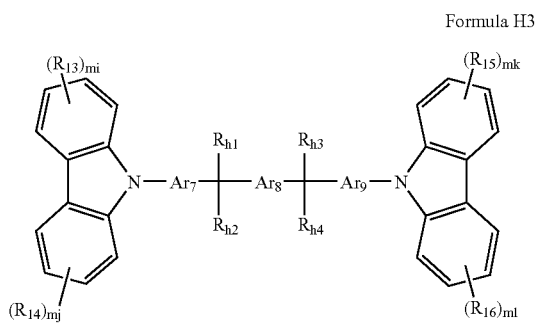

wherein $Ar_7$, $Ar_8$ and $Ar_9$ independently represent a divalent aromatic hydrocarbon group or a divalent aromatic heterocyclic group; $R_{h1}$, $R_{h2}$, $R_{h3}$, and $R_{h4}$ independently represent an alkyl group, a cycloalkyl group, an aralkyl group, an alkoxy group or a halogen atom; $R_{13}$, $R_{14}$, $R_{15}$, and $R_{16}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and mi, mj, mk, and ml independently represent an integer of from 1 to 4, Formula H4

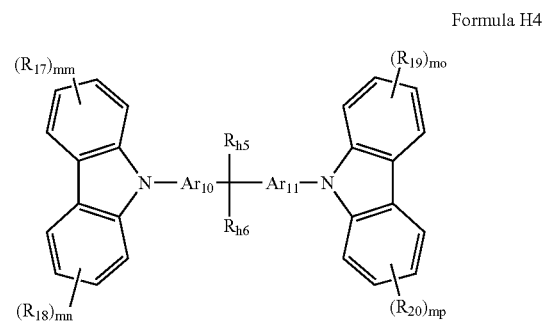

wherein $Ar_{10}$ and $Ar_{11}$ independently represent a divalent aromatic hydrocarbon group or a divalent aromatic heterocyclic group; $R_{h5}$ and $R_{h6}$ independently represent a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, a halogen atom, or —$\{C(R_{01})(R_{02})\}_pCF_3$, in which $R_{01}$ and $R_{02}$ independently represent a hydrogen atom or a fluorine atom, and p represents an integer of not less than 0, provided that at least one of $R_{h5}$ and $R_{h6}$ is —$\{C(R_{01})(R_{02})\}_pCF_3$; $R_{17}$, $R_{18}$, $R_{19}$, and $R_{20}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and mm, mn, mo, and mp independently represent an integer of from 1 to 4.

16. The organic electroluminescent element of claim 15, wherein a hole blocking layer is provided between the light emission layer and the cathode.

17. The organic electroluminescent element of claim 16, wherein the hole blocking layer is comprised of at least one selected from the group consisting of a styryl compound, a triazole derivative, a phenanthroline derivative, an oxadiazole derivative and a boron derivative.

18. The organic electroluminescent element of claim 16, wherein the hole blocking layer is comprised of at least one selected from the group consisting of compounds represented by formula 5, 6, 7 or 8 above.

19. The organic electroluminescent element of claim 15, wherein the light emission layer contains the compound represented by formula H2, H3, or H4 above.

20. The organic electroluminescent element of claim 15, wherein the organic electroluminescent element contains a phosphorescent compound.

21. The organic electroluminescent element of claim 20, wherein the phosphorescent compound is an osmium complex, an iridium complex or a platinum complex.

22. An organic electroluminescent element comprising an anode, a cathode and a component layer including a light emission layer, the component layer being provided between the anode and the cathode, wherein the component layer contains a compound represented by formula I1, I2 or I3, Formula I1

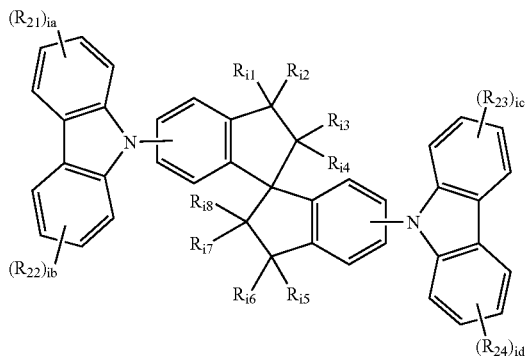

Formula I2

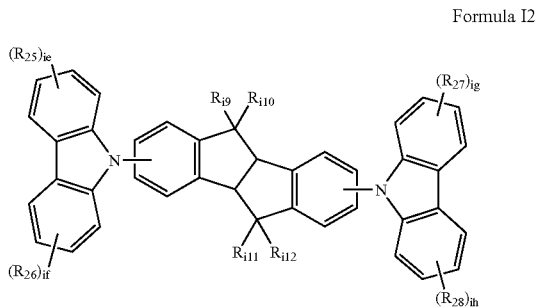

Formula I3

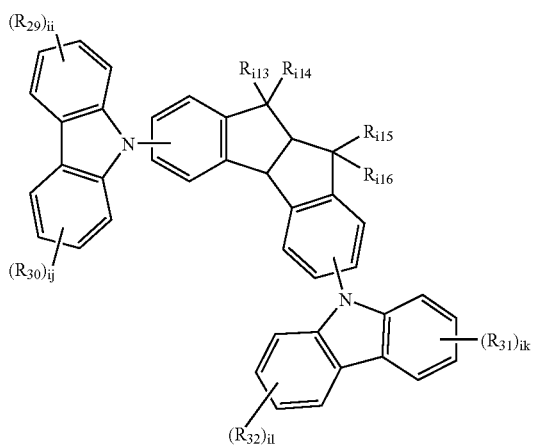

wherein $R_{i1}$, $R_{i2}$, $R_{i3}$, $R_{i4}$, $R_{i5}$, $R_{i6}$, $R_{i7}$, $R_{i8}$, $R_{i9}$, $R_{i10}$, $R_{i11}$, $R_{i12}$, $R_{i13}$, $R_{i14}$, $R_{i15}$, and $R_{i16}$ independently represent a hydrogen atom, an alkyl group, a cycloalkyl group, an aralkyl group, an alkoxy group or a halogen atom; $R_{21}$, $R_{22}$, $R_{23}$, $R_{24}$, $R_{25}$, $R_{26}$, $R_{27}$, $R_{28}$, $R_{29}$, $R_{30}$, $R_{31}$, and $R_{32}$ independently represent a hydrogen atom, a substituted or unsubstitute alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxygroup, a cyano group, a hydroxyl group, a substituted or unsubstituted alk- enyl group, or a halogen atom; and ia, ib, ic, id, ie, if, ig, ih, ii, ij, ik, and io independently represent an integer of from 1 to 4.

23. The organic electroluminescent element of claim 22, wherein a hole blocking layer is provided between the light emission layer and the cathode.

24. The organic electroluminescent element of claim 23, wherein the hole blocking layer is comprised of at least one selected from the group consisting of a styryl compound, a triazole derivative, a phenanthroline derivative, an oxadiazole derivative and a boron derivative.

25. The organic electroluminescent element of claim 23, wherein the hole blocking layer is comprised of at least one selected from the group consisting of compounds represented by formula 5, 6, 7 or 8 above.

26. The organic electroluminescent element of claim 22, wherein the light emission layer contains the compound represented by formula I1, I2 or I3 above.

27. The organic electroluminescent element of claim 22, wherein the organic electroluminescent element contains a phosphorescent compound.

28. The organic electroluminescent element of claim 27, wherein the phosphorescent compound is an osmium complex, an iridium complex or a platinum complex.

29. An organic electroluminescent comprising an anode, a cathode and a component layer including a light emission layer, the component layer being provided between the anode and the cathode, wherein the component layer contains a compound represented by formula J1 or J2, Formula J1

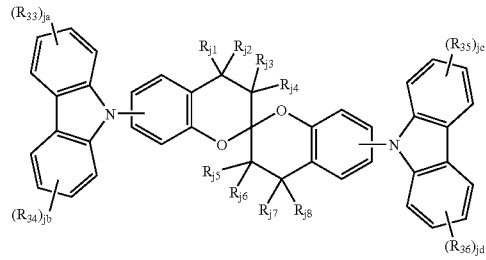

Formula J2

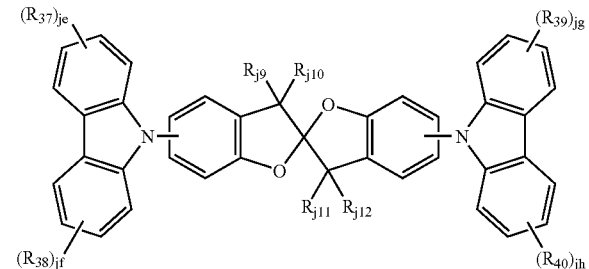

wherein $R_{j1}$, $R_{j2}$, $R_{j3}$, $R_{j4}$, $R_{j5}$, $R_{j6}$, $R_{j7}$, $R_{j8}$, $R_{j9}$, $R_{j10}$, $R_{j11}$, and $R_{j12}$ independently represent a hydrogen atom, an alkyl group, a cycloalkyl group, an aralkyl group, an alkoxy group or a halogen atom; $R_{33}$, $R_{34}$, $R_{35}$, $R_{36}$, $R_{37}$, $R_{38}$, $R_{39}$, and $R_{40}$ independently represent a hydrogen atom, a substituted or unsubstituted alkyl group, a substituted or unsubstituted cycloalkyl group, a substituted or unsubstituted aralkyl group, a substituted or unsubstituted aryl group, a substituted or unsubstituted alkoxy group, a substituted or unsubstituted aryloxy group, a cyano group, a hydroxyl group, a substituted or unsubstituted alkenyl group, or a halogen atom; and ja, jb, jc, jd, ie, jf, jg, and jh independently represent an integer of from 1 to 4.

30. The organic electroluminescent element of claim 29, wherein a hole blocking layer is provided between the light emission layer and the cathode.

31. The organic electroluminescent element of claim 30, wherein the hole blocking layer is comprised of at least one selected from the group consisting of a styryl compound, a triazole derivative, a phenanthroline derivative, an oxadiazole derivative and a boron derivative.

32. The organic electroluminescent element of claim 30, wherein the hole blocking layer is comprised of at least one selected from the group consisting of compounds represented by formula 5, 6, 7 or 8 above.

33. The organic electroluminescent element of claim 29, wherein the light emission layer contains the compound represented by formula J1 or J2 above.

34. The organic electroluminescent element of claim 29, wherein the organic electroluminescent element contains a phosphorescent compound.

35. The organic electroluminescent element of claim 34, wherein the phosphorescent compound is an osmium complex, an iridium complex or a platinum complex.

36. An organic electroluminescent element comprising an anode, a cathode and a component layer including a light emission layer, the component layer being provided between the anode and the cathode, wherein the component layer contains an electron transporting material having a phosphorescence 0-0 band of not more than 450 nm, and the light emission layer contains a phosphorescent compound and a compound represented by formula A,

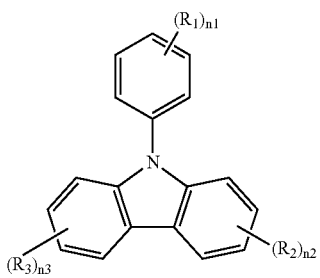

Formula A wherein $R_1$, $R_2$ and $R_3$ independently represent a substituted or unsubstituted alkyl group or a substituted or unsubstituted cycloalkyl group; $n_1$ represents an integer of from 0 to 5; and $n_2$ and $n_3$ independently represent an integer of from 0 to 4, provided that $R_1$ and $R_2$, $R_1$ and $R_3$, or $R_2$ and $R_3$, each may combine with each other to form a ring.

37. The organic electroluminescent element of claim 36, wherein the organic electroluminescent element emits a white light.

38. An organic electroluminescent element comprising an anode, a cathode and a component layer including a light emission layer, the component layer being provided between the anode and the cathode, wherein the component layer contains a hole transporting material having a phosphorescence 0-0 band of not more than 480 nm, and the light emission layer contains a phosphorescent compound and a compound represented by formula A:

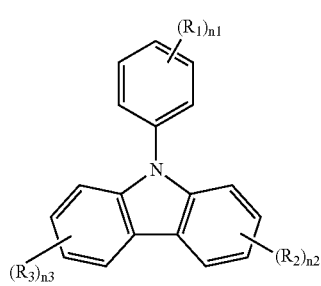

Formula A wherein $R_1$, $R_2$ and R3 independently represent a substituted or unsubstituted alkyl group or a substituted or unsubstituted cycloalkyl group; $n_1$ represents an integer of from 0 to 5; and $n_2$ and $n_3$ independently represent an integer of from 0 to 4, provided that $R_1$ and $R_2$, $R_1$ and $R_3$, or $R_2$ and $R_3$, each may combine with each other to form a ring.

39. The organic electroluminescent element of claim 38, wherein the organic electroluminescent element emits a white light.

40. An organic electroluminescent element comprising an anode, a cathode and a component layer including a light emission layer, the component layer being provided between the anode and the cathode, wherein the light emission layer contains a phosphorescent compound having a phosphorescence 0-0 band of not more than 480 nm and a compound represented by formula A:

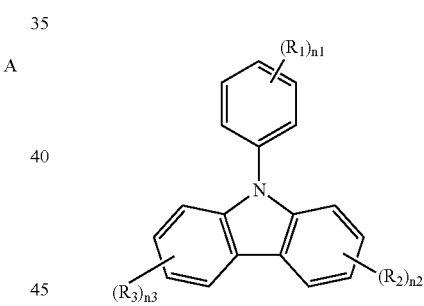

Formula A wherein $R_1$, $R_2$ and $R_3$ independently represent a substituted or unsubstituted alkyl group or a substituted or unsubstituted cycloalkyl group; $n_1$ represents an integer of from 0 to 5; and $n_2$ and $n_3$ independently represent an integer of from 0 to 4, provided that $R_1$ and $R_2$, $R_1$ and $R_3$, or $R_2$ and $R_3$, each may combine with each other to form a ring.

41. The organic electroluminescent element of claim 40, wherein the organic electroluminescent element emits a white light.

42. A display comprising the organic electroluminescent element of any one of claims 1, 8, 15, 22, 29, 36, and 38.

43. An illuminator comprising the organic electroluminescent element of any one of claims 1, 8, 15, 22, 29, 36, and 38.

44. A display comprising the illuminator of claim 43, and a liquid crystal cell as a displaying element.

* * * * *

UNITED STATES PATENT AND TRADEMARK OFFICE
CERTIFICATE OF CORRECTION

PATENT NO. : 7,629,060 B2  Page 1 of 1
APPLICATION NO. : 10/718025
DATED : December 8, 2009
INVENTOR(S) : Oshiyama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 511 days.

Signed and Sealed this

Second Day of November, 2010

David J. Kappos
*Director of the United States Patent and Trademark Office*